(12) United States Patent
Yashima

(10) Patent No.: US 8,796,650 B2
(45) Date of Patent: Aug. 5, 2014

(54) CHARGED PARTICLE BEAM DRAWING METHOD AND APPARATUS

(75) Inventor: Jun Yashima, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 226 days.

(21) Appl. No.: 12/725,676

(22) Filed: Mar. 17, 2010

(65) Prior Publication Data

US 2010/0237253 A1    Sep. 23, 2010

(30) Foreign Application Priority Data

Mar. 19, 2009    (JP) ................................. 2009-067664

(51) Int. Cl.
*H01J 37/302* (2006.01)
*H01J 37/317* (2006.01)

(52) U.S. Cl.
CPC ......... *H01J 37/3023* (2013.01); *H01J 37/3174* (2013.01)
USPC ................................. 250/492.23; 250/492.22

(58) Field of Classification Search
USPC ...................... 250/492.22, 492.23; 716/50–56
See application file for complete search history.

(56) References Cited

U.S. PATENT DOCUMENTS

| | | | |
|---|---|---|---|
| 7,683,352 B2 * | 3/2010 | Inanami .................... | 250/492.22 |
| 2002/0116697 A1 * | 8/2002 | Okamoto et al. ................ | 716/21 |
| 2005/0214657 A1 * | 9/2005 | Mitsui ................................. | 430/5 |
| 2007/0138413 A1 * | 6/2007 | Abe et al. .................. | 250/492.22 |
| 2007/0172744 A1 * | 7/2007 | Chen et al. .......................... | 430/5 |
| 2008/0067426 A1 | 3/2008 | Kimura et al. | |
| 2009/0134343 A1 * | 5/2009 | Inoue ........................ | 250/492.22 |

FOREIGN PATENT DOCUMENTS

| | | |
|---|---|---|
| JP | 6-267834 A | 9/1994 |
| JP | 2000-150367 | 5/2000 |
| JP | 2007-324229 | 12/2007 |
| JP | 2007-335743 | 12/2007 |
| JP | 2008-182073 | 8/2008 |
| WO | WO 02/103765 | 12/2002 |

OTHER PUBLICATIONS

U.S. Appl. No. 13/235,432, filed Sep. 18, 2011, Nakayamada, et al.
U.S. Appl. No. 13/288,530, filed Nov. 3, 2011, Yashima.
Office Action issued Apr. 2, 2013, in Japanese Patent Application No. 2009-067664 with English translation.
U.S. Appl. No. 13/765,140, filed Feb. 12, 2013, Kato, et al.

* cited by examiner

*Primary Examiner* — Michael Logie
*Assistant Examiner* — Eliza Osenbaugh-Stewar
(74) *Attorney, Agent, or Firm* — Oblon, Spivak, McClelland, Maier & Neustadt, L.L.P.

(57) ABSTRACT

A charged particle beam drawing apparatus includes a charged particle beam gun, a first forming aperture member having an opening, wherein a charged particle beam emitted from the charged particle beam gun is passed through the opening of the first forming aperture member, a second forming aperture member having an opening, wherein the charged particle beam passed through the first forming aperture member is passed through the opening of the second forming aperture member, a movable stage for supporting a workpiece, wherein patterns corresponding to figures in a drawing data are drawn on the workpiece by the charged particle beam passed through the second forming aperture member, and a drawing data correcting process portion for moving the figures in the drawing data on the basis of positions in the opening of the second forming aperture, where the charged particle beam for drawing the patterns is passed through.

10 Claims, 29 Drawing Sheets

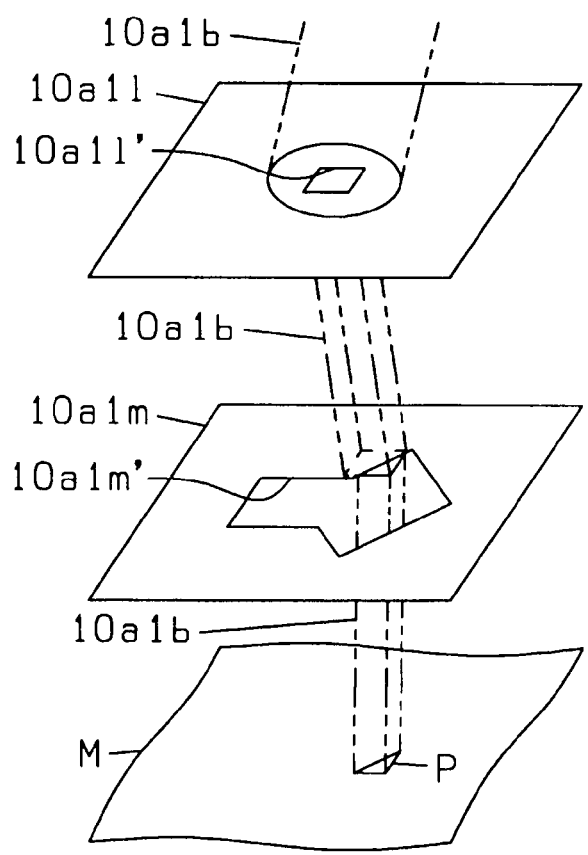
FIG. 2A
FIG. 2B
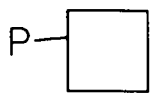
FIG. 2C
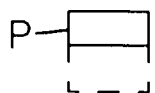
FIG. 2D
FIG. 2E
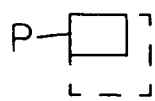
FIG. 2F
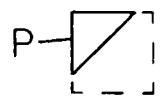
FIG. 2G
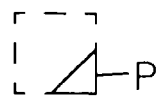
FIG. 2H
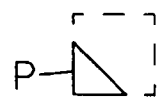
FIG. 2I
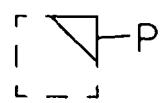

time of attach judging data of SFm time of forward

CHARGED PARTICLE BEAM DRAWING METHOD AND APPARATUS

CROSS-REFERENCE TO RELATED APPLICATION

This application is based upon and claims the benefit of priority from the prior Japanese Patent Application No. 2009-067664 filed on Mar. 19, 2009 in Japan, the entire contents of which are incorporated herein by reference.

BACKGROUND OF THE INVENTION

1. Field of the Invention

The present invention relates to a charged particle beam drawing method and apparatus for drawing patterns on a workpiece mounted on a movable stage by a charged particle beam on the basis of a drawing data inputted to the charged particle beam drawing apparatus.

2. Description of Related Art

As is known in the prior art, a charged particle beam drawing apparatus draws patterns corresponding to figures included in a drawing data inputted to the charged particle beam drawing apparatus, on a workpiece mounted on a movable stage by a charged particle beam passed through an opening of a first forming aperture member and an opening of a second forming aperture member. For example, the charged particle beam drawing apparatus is described in Japanese Unexamined Patent Publication No. 2007-324229.

As described in Japanese Unexamined Patent Publication No. 2007-324229, the charged particle beam drawing apparatus includes a charged particle beam gun and a first forming aperture member having an opening. The charged particle beam emitted from the charged particle beam gun is passed through the opening of the first forming aperture member. The charged particle beam drawing apparatus further includes a second forming aperture member having an opening. The charged particle beam passed through the opening of the first forming aperture member is passed through the opening of the second forming aperture member. The charged particle beam drawing apparatus further includes a movable stage supporting a workpiece. Patterns corresponding to figures included in a drawing data are drawn on the workpiece by the charged particle beam passed through the opening of the second forming aperture member.

In the charged particle beam drawing apparatus as described in Japanese Unexamined Patent Publication No. 2007-324229, in order to cancel a position difference of the charged particle beam on the workpiece on the basis of a position in the opening of the second forming aperture where the charged particle beam is passed through, the charged particle beam is offset by a sub-deflector. Therefore, in the charged particle beam drawing apparatus as described in Japanese Unexamined Patent Publication No. 2007-324229, the size of a subfield is smaller than the size of a limit area. The limit area is where the charged particle beam can be maximally deflected by the sub-deflector without a distortion of the charged particle beam. Consequently, it is impossible for the charged particle beam drawing apparatus as described in Japanese Unexamined Patent Publication No. 2007-324229 to increase a throughput sufficiently.

SUMMARY OF THE INVENTION

An object of the present invention is to provide an charged particle beam drawing method and apparatus which can increase the throughput by increasing the size of the subfield.

In accordance with one aspect of the present invention, a charged particle beam drawing method, comprising: drawing patterns corresponding to figures included in a drawing data inputted to a charged particle beam drawing apparatus, on a workpiece mounted on a movable stage by a charged particle beam passed through an opening of a first forming aperture member and an opening of a second forming aperture; and moving the figures in the drawing data on the basis of positions in the opening of the second forming aperture, where the charged particle beam for drawing the patterns corresponding to the figures is passed through is provided.

In accordance with another aspect of the present invention, a charged particle beam drawing apparatus, comprising: a charged particle beam gun; a first forming aperture member having an opening, wherein a charged particle beam emitted from the charged particle beam gun is passed through the opening of the first forming aperture member; a second forming aperture member having an opening, wherein the charged particle beam passed through the opening of the first forming aperture member is passed through the opening of the second forming aperture member; a movable stage for supporting a workpiece, wherein patterns corresponding to figures included in a drawing data are drawn on the workpiece by the charged particle beam passed through the opening of the second forming aperture member; and a drawing data correcting process portion for moving the figures in the drawing data on the basis of positions in the opening of the second forming aperture, where the charged particle beam for drawing the patterns corresponding to the figures is passed through is provided.

Other and further objects, features and advantages of the invention will appear more fully from the following description.

BRIEF DESCRIPTION OF THE DRAWINGS

FIGS. 2A, 2B, 2C, 2D, 2E, 2F, 2G, 2H and 2I show examples of a pattern P which can be drawn on the workpiece M by a shot of the charged particle beam $10a1b$ in the charged particle beam drawing apparatus 10 of the first embodiment;

DETAILED DESCRIPTION OF THE INVENTION

Figure 1:
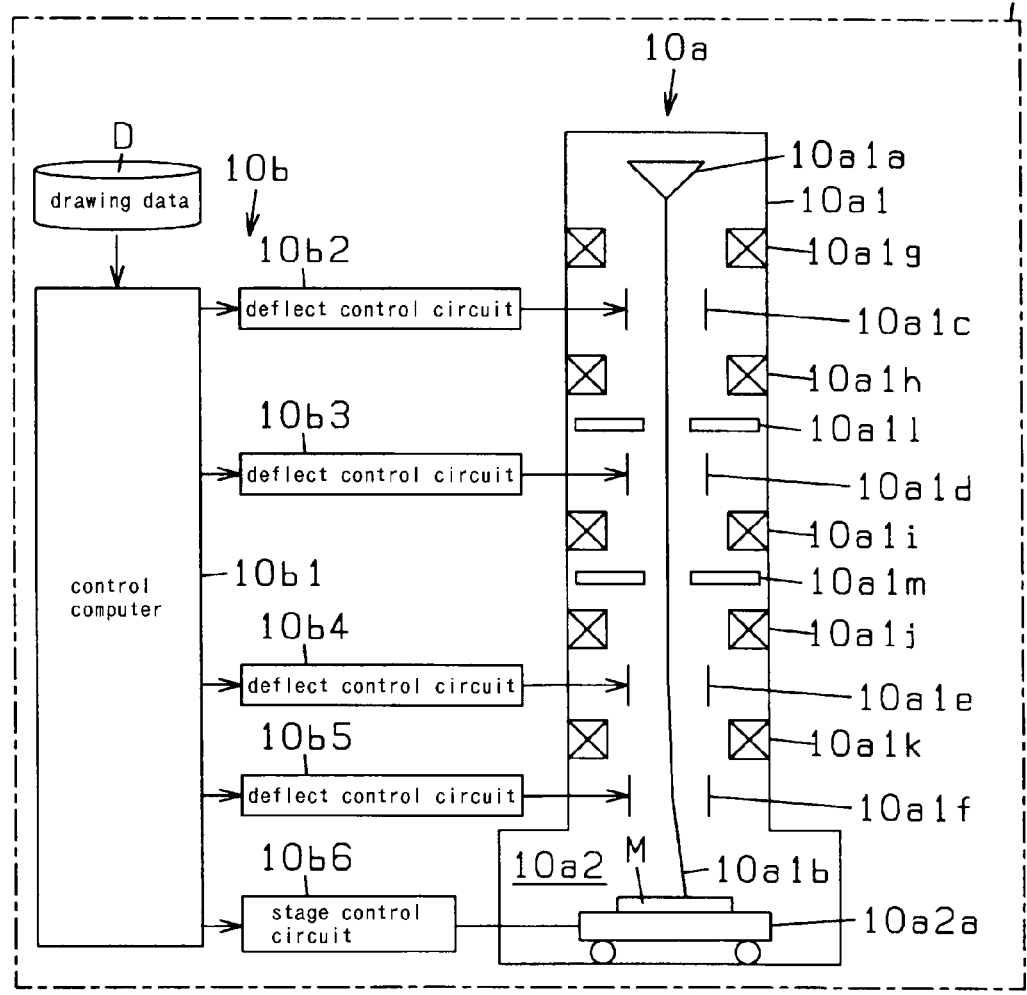
FIG. 1 is a schematic illustration of a first embodiment of a charged particle beam drawing apparatus 10 according to the present invention.

FIG. 1 is a schematic illustration of a first embodiment of a charged particle beam drawing apparatus 10 according to the present invention. As shown in FIG. 1, the charged particle beam drawing apparatus 10 of the first embodiment has a drawing portion 10a for drawing patterns on a workpiece M such as a musk (blank) and a wafer, by irradiating the workpiece M with a charged particle beam 10a1b.

In the charged particle beam drawing apparatus 10 of the first embodiment, an electron beam is used as the charged particle beam 10a1b. In the charged particle beam drawing apparatus 10 of a second embodiment, a charged particle beam such as an ion beam, except the electron beam can be used as the charged particle beam 10a1b.

In the charged particle beam drawing apparatus 10 of the first embodiment, as shown in FIG. 1, the drawing portion 10a has a charged particle beam gun 10a1a, deflectors 10a1c, 10a1d, 10a1e, 10a1f for deflecting the charged particle beam 10a1b emitted from the charged particle beam gun 10a1a, and a movable stage 10a2a for supporting the workpiece M. Patterns are drawn on the workpiece M by the charged particle beam 10a1b deflected by the deflectors 10a1c, 10a1d, 10a1e, 10a1f.

Figure 4:
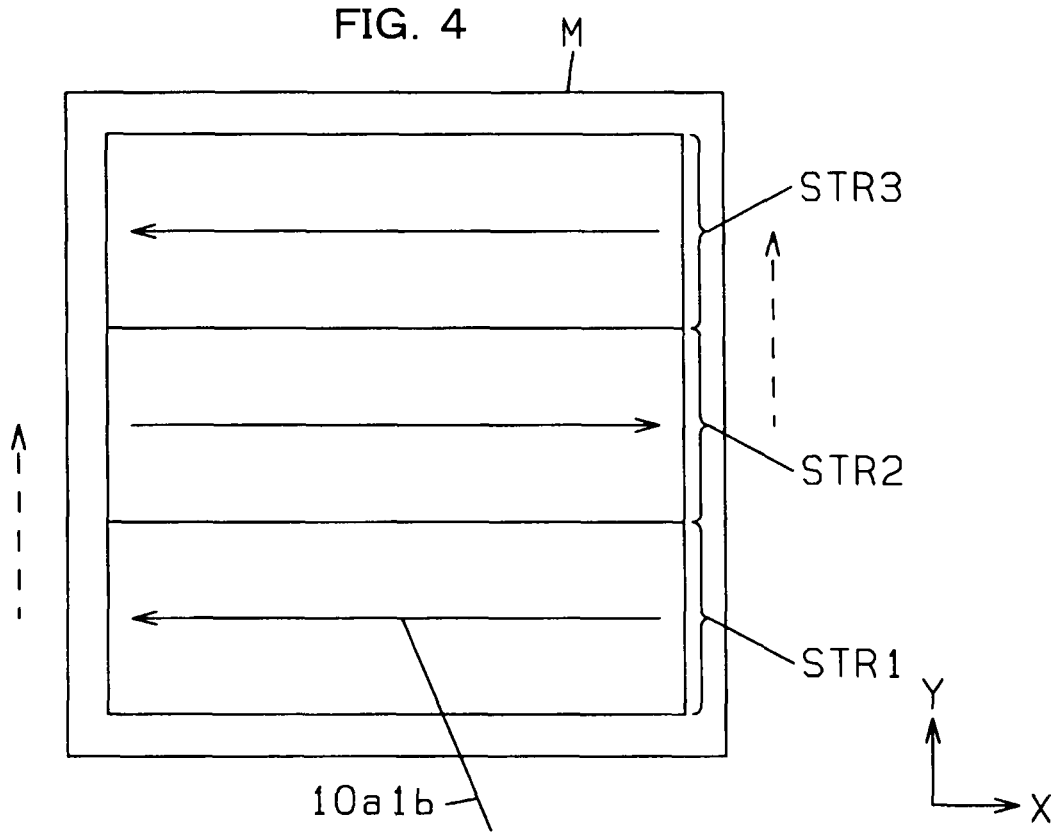
FIG. 4 explains a sequence of drawing of patterns corresponding to figures FG1, FG2 included in the drawing data D by means of the charged particle beam $10a1b$.

In the charged particle beam drawing apparatus 10 of the first embodiment, as shown in FIG. 1, a drawing chamber 10a2 composes a part of the drawing portion 10a. The movable stage 10a2a for supporting the workpiece M is placed in the drawing chamber 10a2. The stage 10a2a is movable in X direction and movable in Y direction (X direction and Y direction are shown in FIG. 4).

In the charged particle beam drawing apparatus 10 of the first embodiment, as shown in FIG. 1, an optical column 10a1 composes a part of the drawing portion 10a. The charged particle beam gun 10a1a, the deflectors 10a1c, 10a1d, 10a1e, 10a1f, a first forming aperture member 10a1l and a second forming aperture member 10a1m are placed in the optical column 10a1.

In the charged particle beam drawing apparatus 10 of the first embodiment, as shown in FIG. 1, the charged particle beam 10a1b emitted from the charged particle beam gun 10a1a is passed through an opening 10a1l' (see FIG. 2A) of the first forming aperture member 10a1l and the workpiece M is irradiated with the charged particle beam 10a1b, or the charged particle beam 10a1b emitted from the charged particle beam gun 10a1a is interrupted by a part of the first forming aperture member 10a1l except the opening 10a1l' and the workpiece M is not irradiated with the charged particle beam 10a1b, by controlling a blanking deflector 10a1c via a deflect control circuit 10b2 by means of a control computer 10b1 of a control portion 10b on the basis of a drawing data D. In other words, in the charged particle beam drawing apparatus 10 of the first embodiment, a beam irradiate time of the charged particle beam 10a1b can be controlled by controlling the blanking deflector 10a1c.

In the charged particle beam drawing apparatus 10 of the first embodiment, as shown in FIG. 1, a beam size changing deflector 10a1d is controlled via a deflect control circuit 10b3 by the control computer 10b1 of the control portion 10b on the basis of the drawing data D, so that the charged particle beam 10a1b passed through the opening 10a1l' (see FIG. 2A) of the first forming aperture member 10a1l is deflected by the beam size changing deflector 10a1d. And then, all of the charged particle beam 10a1b or a part of the charged particle beam 10a1b deflected by the beam size changing deflector 10a1d, is passed through an opening 10a1m' (see FIG. 2A) of the second forming aperture member 10a1m. In other words, in the charged particle beam drawing apparatus 10 of the first embodiment, size or shape of the charged particle beam 10a1b applied to the workpiece M can be adjusted by adjusting deflecting amount or deflecting direction of the charged particle beam 10a1b deflected by the beam size changing deflector 10a1d.

FIGS. 2A, 2B, 2C, 2D, 2E, 2F, 2G, 2H and 2I show examples of a pattern P which can be drawn on the workpiece M by a shot of the charged particle beam 10a1b in the charged particle beam drawing apparatus 10 of the first embodiment. In the charged particle beam drawing apparatus 10 of the first embodiment, as shown in FIGS. 1 and 2A, when the pattern P (see FIG. 2A) is drawn on the workpiece M by the charged particle beam 10a1b, a part of the charged particle beam 10a1b emitted from the charged particle beam gun 10a1a (see FIG. 1) is passed through the square opening 10a1l' (see FIG. 2) of the first forming aperture member 10a1l. So that, a horizontal sectional shape of the charged particle beam 10a1b passed through the opening 10a1l' of the first forming aperture member 10a1l is almost square. And then, all of the charged particle beam 10a1b or a part of the charged particle beam 10a1b passed through the opening 10a1l' of the first forming aperture member 10a1l is passed through the opening 10a1m' (see FIG. 2A) of the second forming aperture member 10a1m.

In the charged particle beam drawing apparatus 10 of the first embodiment, as shown in FIGS. 1 and 2A, a horizontal sectional shape of the charged particle beam 10a1b passed through the opening 10a1m' (see FIG. 2A) of the second forming aperture member 10a1m can be rectangular (square or oblong) or triangular, by deflecting the charged particle beam 10a1b passed through the opening 10a1l' of the first forming aperture member 10a1l by means of the deflector 10a1d (see FIG. 1).

In the charged particle beam drawing apparatus 10 of the first embodiment, as shown in FIGS. 1 and 2A, the pattern P (see FIG. 2A) having the same shape as the horizontal sectional shape of the charged particle beam 10a1b passed through the opening 10a1m' (see FIG. 2A) of the second forming aperture member 10a1m can be drawn on the workpiece M, by applying the charged particle beam 10a1b passed through the opening 10a1m' (see FIG. 2A) of the second forming aperture member 10a1m, to a predetermined position on the workpiece M, for a predetermined time.

In the charged particle beam drawing apparatus 10 of the first embodiment, as shown in FIGS. 1 and 2A, a largest pattern P (see FIG. 2B) can be drawn on the workpiece M by a shot of the charged particle beam 10a1b by means of controlling deflecting amount and deflecting direction of the charged particle beam 10a1b passed through the opening 10a1l' (see FIG. 2A) of the first forming aperture member 10a1l and then deflected by the deflector 10a1d (see FIG. 1). In the charged particle beam drawing apparatus 10 of the first embodiment, as shown in FIGS. 1 and 2A, a rectangular (square or oblong) pattern P (see FIGS. 2C, 2D and 2E) which is smaller than the largest pattern P shown in FIG. 2B can be drawn on the workpiece M by a shot of the charged particle beam 10a1b. In the charged particle beam drawing apparatus 10 of the first embodiment, as shown in FIGS. 1 and 2A, a triangular pattern P (see FIGS. 2F, 2G, 2H and 2I) which is smaller than the largest pattern P shown in FIG. 2B can be drawn on the workpiece M by a shot of the charged particle beam 10a1b.

In the charged particle beam drawing apparatus 10 of the first embodiment, as shown in FIG. 1, the main deflector 10a1e is controlled via a deflect control circuit 10b4 by the control computer 10b1 of the control portion 10b on the basis of the drawing data D, so that the charged particle beam 10a1b passed through the opening 10a1m' (see FIG. 2A) of the second forming aperture member 10a1m is deflected by the main deflector 10a1e.

In the charged particle beam drawing apparatus 10 of the first embodiment, as shown in FIG. 1, the sub-deflector 10a1f is controlled via a deflect control circuit 10b5 by the control computer 10b1 of the control portion 10b on the basis of the drawing data D, so that the charged particle beam 10a1b deflected by the main deflector 10a1e is deflected by the sub-deflector 10a1f. In the charged particle beam drawing apparatus 10 of the first embodiment, the irradiate position of the charged particle beam 10a1b on the workpiece M can be adjusted by adjusting deflecting amount and deflecting direction of the charged particle beam 10a1b by means of the main deflector 10a1e and the sub-deflector 10a1f.

In the example shown in FIG. 1, a CAD data (layout data, design data) prepared by a designer such as a semiconductor integrated circuit designer, is converted into the drawing data D of the format of the charged particle beam drawing apparatus 10. And then, the drawing data D is inputted to the control computer 10b1 of the control portion 10b of the charged particle beam drawing apparatus 10. In general, a plurality of small patterns are included in the CAD data (layout data, design data), so that the amount of the CAD data (layout data, design data) is very large. In general, after the CAD data (layout data, design data) is converted into a different format data, the amount of the data increases. Therefore, in order to compress the amount of the drawing data D, the drawing data D inputted to the control computer 10b1 of the control portion 10b of the charged particle beam drawing apparatus 10 has a hierarchical structure.

Figure 3:
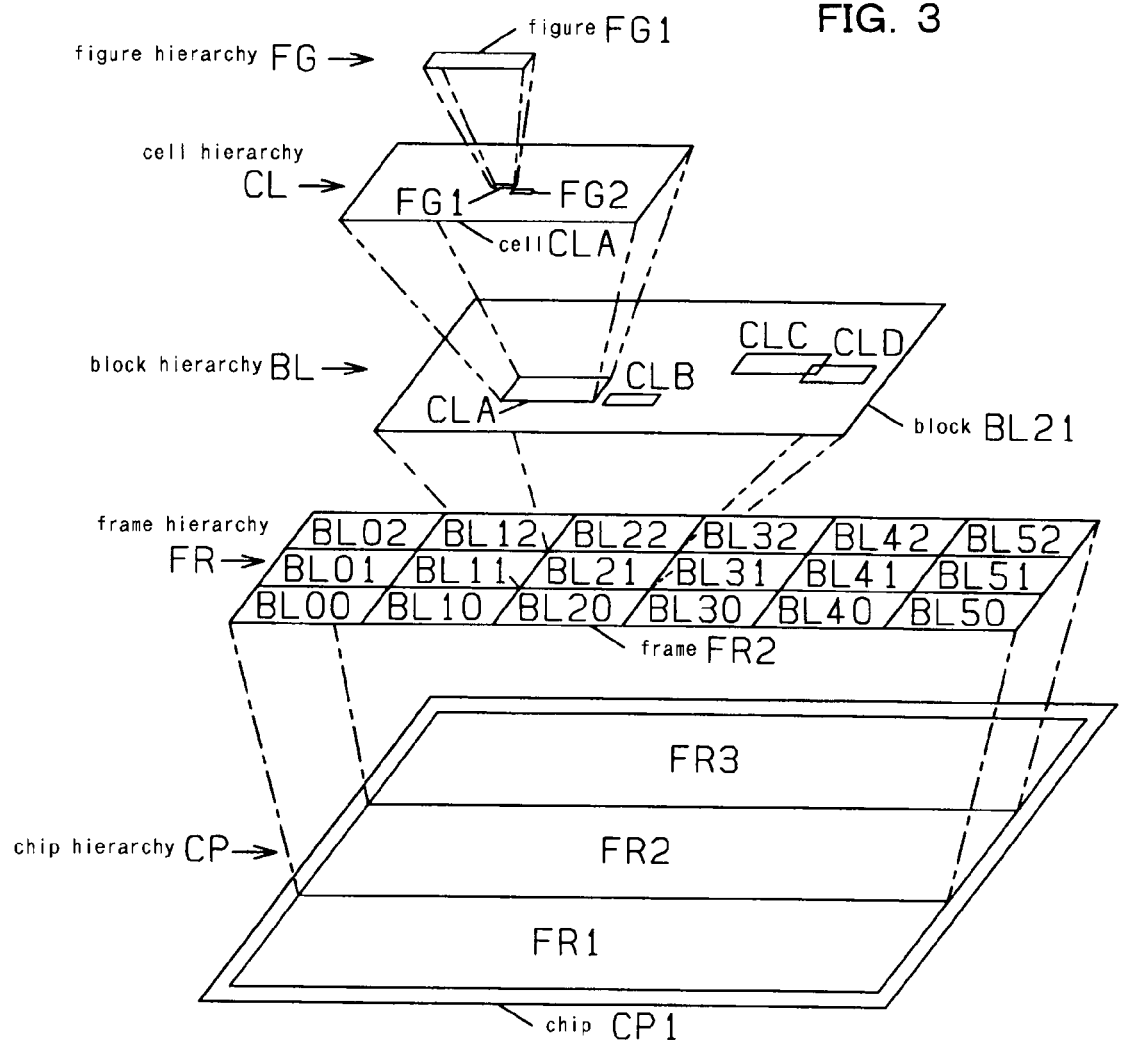
FIG. 3 shows an example of the drawing data D shown in FIG. 1.

FIG. 3 shows an example of the drawing data D shown in FIG. 1. In the example shown in FIG. 3, the drawing data D (see FIG. 1) applied to the charged particle beam drawing apparatus 10 of the first embodiment, has a chip hierarchy, a frame hierarchy which is lower than the chip hierarchy, a block hierarchy which is lower than the frame hierarchy, a cell hierarchy which is lower than the frame hierarchy, and a figure hierarchy which is lower than the cell hierarchy.

In the example shown in FIG. 3, a chip CP1 is one of elements of the chip hierarchy CP, and corresponds to three frames FR1, FR2, FR3. Each of the three frames FR1, FR2, FR3 is one of elements of the frame hierarchy FR in the drawing data D (see FIG. 1). The frame FR2 corresponds to eighteen blocks BL00, BL10, BL20, BL30, BL40, BL50, BL01, BL11, BL21, BL31, BL41, BL51, BL02, BL12, BL22, BL32, BL42, BL52. Each of the eighteen blocks BL00, BL10, BL20, BL30, BL40, BL50, BL01, BL11, BL21, BL31, BL41, BL51, BL02, BL12, BL22, BL32, BL42, BL52 is one of elements of the block hierarchy BL in the drawing data D. The block BL21 corresponds to cells CLA, CLB, CLC, CLD. Each of the cells CLA, CLB, CLC, CLD is one of elements of the cell hierarchy CL in the drawing data D. The cell CLA corresponds to a plurality of figures FG1, FG2. Each of the figures FG1, FG2 is one of elements of the figure hierarchy FG in the drawing data D.

In the charged particle beam drawing apparatus 10 of the first embodiment, as shown in FIGS. 1 and 3, the charged particle beam 10a1b (see FIG. 1) draws patterns on the workpiece M (see FIG. 1), and the patterns correspond to the plurality of figures FG1, FG2 (see FIG. 3) in the figure hierarchy FG (see FIG. 3) in the drawing data D (see FIG. 1).

FIG. 4 explains a sequence of drawing of patterns corresponding to figures FG1, FG2 included in the drawing data D by means of the charged particle beam 10a1b. In an example shown in FIG. 4, the workpiece M has a belt shaped virtual area called stripe STR1, STR2, STR3.

In the example shown in FIG. 4, the charged particle beam 10a1b is scanned in the stripe STR1 from plus side (right side of FIG. 4) of X axis to minus side (left side of FIG. 4) of X axis, so that patterns corresponding to the plurality of figures (not shown) included in the drawing data D (see FIG. 1) are drawn in the stripe STR1 of the workpiece M by the charged particle beam 10a1b. Then, the charged particle beam 10a1b is scanned in the stripe STR2 from minus side (left side of FIG. 4) of X axis to plus side (right side of FIG. 4) of X axis, so that patterns corresponding to the plurality of figures (not shown) included in the drawing data D (see FIG. 1) are drawn in the stripe STR2 of the workpiece M by the charged particle beam 10a1b. Then, the charged particle beam 10a1b is scanned in the stripe STR3 from plus side (right side of FIG. 4) of X axis to mines side (left side of FIG. 4) of X axis, so that patterns corresponding to the plurality of figures (not shown) included in the drawing data D (see FIG. 1) are drawn in the stripe STR3 of the workpiece M by the charged particle beam 10a1b.

In detail, in the example shown in FIG. 4, when the patterns are drawn in the stripe STR1 of the workpiece M by the charged particle beam 10a1b, the movable stage 10a2a (see FIG. 1) is controlled via a stage control circuit 10b6 (see FIG. 1) by the control computer 10b1 (see FIG. 1) of the control portion 10b (see FIG. 1) on the basis of the drawing data D (see FIG. 1), so that the movable stage 10a2a is moved from minus side (left side of FIG. 4) of X axis to plus side (right side of FIG. 4) of X axis. Then, before the patterns are drawn in the stripe STR2 (see FIG. 4) of the workpiece M by the charged particle beam 10a1b, the movable stage 10a2a is controlled via the stage control circuit 10b6 by the control computer 10b1 of the control portion 10b on the basis of the drawing data D, so that the movable stage 10a2a is moved from plus side (upper side of FIG. 4) of Y axis to mines side (lower side of FIG. 4) of Y axis.

Then, in the example shown in FIG. 4, when the patterns are drawn in the stripe STR2 of the workpiece M by the charged particle beam 10a1b, the movable stage 10a2a (see FIG. 1) is controlled via a stage control circuit 10b6 (see FIG. 1) by the control computer 10b1 (see FIG. 1) of the control portion 10b (see FIG. 1) on the basis of the drawing data D (see FIG. 1), so that the movable stage 10a2a is moved from plus side (right side of FIG. 4) of X axis to mines side (left side of FIG. 4) of X axis. Then, before the patterns are drawn in the stripe STR3 (see FIG. 4) of the workpiece M by the charged particle beam 10a1b, the movable stage 10a2a is controlled via the stage control circuit 10b6 by the control computer 10b1 of the control portion 10b on the basis of the drawing data D, so that the movable stage 10a2a is moved from plus side (upper side of FIG. 4) of Y axis to mines side (lower side of FIG. 4) of Y axis.

Then, in the example shown in FIG. 4, when the patterns are drawn in the stripe STR3 of the workpiece M by the charged particle beam 10a1b, the movable stage 10a2a (see FIG. 1) is controlled via a stage control circuit 10b6 (see FIG. 1) by the control computer 10b1 (see FIG. 1) of the control portion 10b (see FIG. 1) on the basis of the drawing data D (see FIG. 1), so that the movable stage 10a2a is moved from minus side (left side of FIG. 4) of X axis to plus side (right side of FIG. 4) of X axis.

Figure 5:
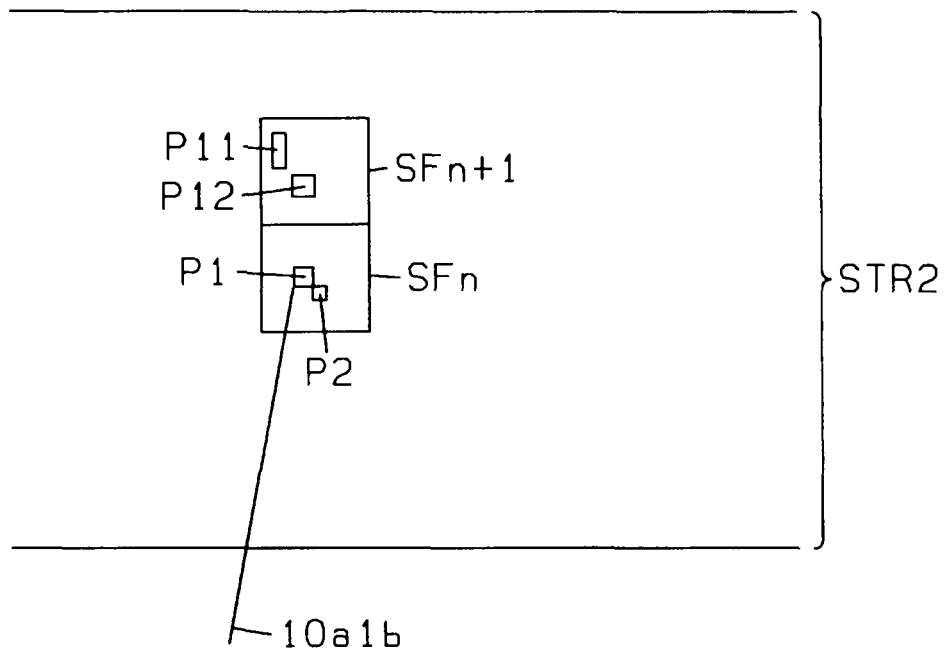
FIG. 5 explains an example of sequence of drawing of patterns P1, P2 corresponding to figures FG1, FG2 included in the drawing data D by means of the charged particle beam $10a1b$ in detail.

FIG. 5 explains an example of sequence of drawing of patterns P1, P2 corresponding to figures FG1, FG2 included in the drawing data D by means of the charged particle beam 10a1b in detail.

In an example shown in FIG. 5, each of the stripes STR1, STR2, STR3 of the workpiece M is divided into rectangular virtual areas called subfields SFn, SFn+1. In detail, in the example shown in FIG. 5, when the pattern P1 corresponding to the figure FG1 (see FIG. 3) included in the drawing data D (see FIG. 1) is drawn by the charged particle beam 10a1b, the main deflector 10a1e (see FIG. 1) is controlled via the deflect control circuit 10b4 (see FIG. 1) by the control computer 10b1 (see FIG. 1) of the control portion 10b (see FIG. 1) on the basis of the drawing data D (see FIG. 1), so that the charged particle beam 10a1b is applied in the subfield SFn.

Then, in the example shown in FIG. 5, the sub-deflector 10a1f (see FIG. 1) is controlled via the deflect control circuit 10b5 (see FIG. 1) by the control computer 10b1 (see FIG. 1) of the control portion 10b (see FIG. 1) on the basis of the drawing data D (see FIG. 1), so that the pattern P1 is drawn by the charged particle beam 10a1b when control of the main deflector 10a1e is completed (when settling time of the main deflector 10a1e passes). Then, the blanking deflector 10a1c (see FIG. 1) is controlled via the deflect control circuit 10b2 (see FIG. 1) by the control computer 10b1 (see FIG. 1) of the control portion 10b (see FIG. 1) on the basis of the drawing data D (see FIG. 1), so that irradiation of the charged particle beam 10a1b for drawing the pattern P1 is started when control of the sub-deflector 10a1f is completed (when settling time of the sub-deflector 10a1f passes).

Then, in the example shown in FIG. 5, the blanking deflector 10a1c (see FIG. 1) is controlled via the deflect control circuit 10b2 (see FIG. 1) by the control computer 10b1 (see FIG. 1) of the control portion 10b (see FIG. 1) on the basis of the drawing data D (see FIG. 1), so that irradiation of the charged particle beam 10a1b is stopped when drawing of the pattern P1 by the charged particle beam 10a1b is completed. Then, the sub-deflector 10a1f (see FIG. 1) is controlled via the deflect control circuit 10b5 (see FIG. 1) by the control computer 10b1 (see FIG. 1) of the control portion 10b (see FIG. 1) on the basis of the drawing data D (see FIG. 1), so that the pattern P2 is drawn by the charged particle beam 10a1b.

Then, in the example shown in FIG. 5, the blanking deflector 10a1c (see FIG. 1) is controlled via the deflect control circuit 10b2 (see FIG. 1) by the control computer 10b1 (see FIG. 1) of the control portion 10b (see FIG. 1) on the basis of the drawing data D (see FIG. 1), so that irradiation of the charged particle beam 10a1b for drawing the pattern P2 is started when control of the sub-deflector 10a1f is completed (when settling time of the sub-deflector 10a1f passes).

Then, in the example shown in FIG. 5, the main deflector 10a1e (see FIG. 1) is controlled via the deflect control circuit 10b4 (see FIG. 1) by the control computer 10b1 (see FIG. 1) of the control portion 10b (see FIG. 1) on the basis of the drawing data D (see FIG. 1), so that the charged particle beam 10a1b is applied in the subfield SFn+1 when drawing of all of the patterns P1, P2 in the subfield SFn by the charged particle beam 10a1b is completed.

Then, in the example shown in FIG. 5, the sub-deflector 10a1f (see FIG. 1) is controlled via the deflect control circuit 10*b*5 (see FIG. 1) by the control computer 10*b*1 (see FIG. 1) of the control portion 10*b* (see FIG. 1) on the basis of the drawing data D (see FIG. 1), so that a pattern P11 is drawn by the charged particle beam 10*a*1*b* when control of the main deflector 10*a*1*e* is completed (when settling time of the main deflector 10*a*1*e* passes). Then, the blanking deflector 10*a*1*c* (see FIG. 1) is controlled via the deflect control circuit 10*b*2 (see FIG. 1) by the control computer 10*b*1 (see FIG. 1) of the control portion 10*b* (see FIG. 1) on the basis of the drawing data D (see FIG. 1), so that irradiation of the charged particle beam 10*a*1*b* for drawing the pattern P11 is started when control of the sub-deflector 10*a*1*f* is completed (when settling time of the sub-deflector 10*a*1*f* passes).

Then, in the example shown in FIG. 5, the blanking deflector 10*a*1*c* (see FIG. 1) is controlled via the deflect control circuit 10*b*2 (see FIG. 1) by the control computer 10*b*1 (see FIG. 1) of the control portion 10*b* (see FIG. 1) on the basis of the drawing data D (see FIG. 1), so that irradiation of the charged particle beam 10*a*1*b* is stopped when drawing of the pattern P11 by the charged particle beam 10*a*1*b* is completed. Then, the sub-deflector 10*a*1*f* (see FIG. 1) is controlled via the deflect control circuit 10*b*5 (see FIG. 1) by the control computer 10*b*1 (see FIG. 1) of the control portion 10*b* (see FIG. 1) on the basis of the drawing data D (see FIG. 1), so that a pattern P12 is drawn by the charged particle beam 10*a*1*b*.

Then, in the example shown in FIG. 5, the blanking deflector 10*a*1*c* (see FIG. 1) is controlled via the deflect control circuit 10*b*2 (see FIG. 1) by the control computer 10*b*1 (see FIG. 1) of the control portion 10*b* (see FIG. 1) on the basis of the drawing data D (see FIG. 1), so that irradiation of the charged particle beam 10*a*1*b* for drawing the pattern P12 is started when control of the sub-deflector 10*a*1*f* is completed (when settling time of the sub-deflector 10*a*1*f* passes).

FIGS. 6A, 6B, 6C, 6D, 6E, 6F, 6G, 6H and 6I show an example of sequence of drawing of the pattern P1 corresponding to the figure FG1 included in the drawing data 9 by means of the charged particle beam 10*a*1*b*. In detail, FIGS. 6A, 6B, 6C, 6D, 6E, 6F, 6G, 6H and 6I explain the example of the number of the shots of the charged particle beam 10*a*1*b* for drawing of the pattern P1 corresponding to the figure FG1 included in the drawing data D in the charged particle beam drawing apparatus 10 of the first embodiment.

In the charged particle beam drawing apparatus 10 of the first embodiment, as shown in FIGS. 6A, 6B, 6C, 6D, 6E, 6F, 6G, 6H and 6I, more than one shots of the charged particle beam 10*a*1*b* (see FIG. 2A) is performed, if the pattern P1 (see FIG. 5) corresponding to the figure FG1 (see FIG. 3) included in the drawing data D (see FIG. 1) is larger than the largest pattern P (see FIG. 2B). In other words, in the charged particle beam drawing apparatus 10 of the first embodiment, if the pattern P1 (see FIG. 5) corresponding to the figure FG1 (see FIG. 3) included in the drawing data D (see FIG. 1) is larger than the largest pattern P (see FIG. 2B), the control computer 10*b*1 (see FIG. 1) of the control portion 10*b* (see FIG. 1) divides the figure FG1 (see FIG. 3) included in the drawing data D (see FIG. 1) into small figures (not shown) in the drawing data D, the small figures corresponding to patterns P1*a*, P1*b*, P1*c*, P1*d*, P1*e*, P1*f*, P1*g*, P1*h* and P1*i* (see FIGS. 6A, 6B, 6C, 6D, 6E, 6F, 6G, 6H and 6I). In general, this procedure is called shot division or figure division.

Figure 6A:
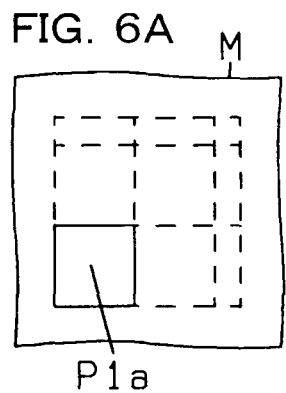
FIGS. 6A, 6B, 6C, 6D, 6E, 6F, 6G, 6H and 6I show an example of sequence of drawing of the pattern P1 corresponding to the figure FG1 included in the drawing data D by means of the charged particle beam $10a1b$.

In the example shown in FIGS. 6A, 6B, 6C, 6D, 6E, 6F, 6G, 6H and 6I, as shown in FIG. 6A, a pattern P1*a* which has the same shape as the largest pattern P (see FIG. 2B) is drawn on the workpiece M by a first shot of the charged particle beam 10*a*1*b* (see FIG. 2A).

In detail, in the example shown in FIGS. 6A, 6B, 6C, 6D, 6E, 6F, 6G, 6H and 6I, the sub-deflector 10*a*1*f* (see FIG. 1) is controlled via the deflect control circuit 10*b*5 (see FIG. 1) by the control computer 10*b*1 (see FIG. 1) of the control portion 10*b* (see FIG. 1) on the basis of the drawing data D (see FIG. 1), so that the pattern P1*a* (see FIG. 6A) is drawn by the first shot of the charged particle beam 10*a*1*b* when control of the main deflector 10*a*1*e* is completed (when settling time of the main deflector 10*a*1*e* passes) in order to place the charged particle beam 10*a*1*b* (see FIG. 2A) in the subfield SFn (see FIG. 5).

Then, the blanking deflector 10*a*1*c* (see FIG. 1) is controlled via the deflect control circuit 10*b*2 (see FIG. 1) by the control computer 10*b*1 (see FIG. 1) of the control portion 10*b* (see FIG. 1) on the basis of the drawing data D (see FIG. 1), so that the shot of the charged particle beam 10*a*1*b* (FIG. 2A) for drawing the pattern P1*a* (see FIG. 6A) is started when control of the sub-deflector 10*a*1*f* is completed (when settling time of the sub-deflector 10*a*1*f* passes). Also, the beam size changing deflector 10*a*1*d* (see FIG. 1) is controlled via the deflect control circuit 10*b*3 (see FIG. 1) by the control computer 10*b*1 (see FIG. 1) of the control portion 10*b* (see FIG. 1) on the basis of the drawing data D (see FIG. 1), so that the charged particle beam 10*a*1*b* which has a horizontal sectional shape for drawing the pattern P1*a* (see FIG. 6A) is applied when control of the sub-deflector 10*a*1*f* is completed (when settling time of the sub-deflector 10*a*1*f* passes).

Then, the blanking deflector 10*a*1*c* (see FIG. 1) is controlled via the deflect control circuit 10*b*2 (see FIG. 1) by the control computer 10*b*1 (see FIG. 1) of the control portion 10*b* (see FIG. 1) on the basis of the drawing data D (see FIG. 1), so that irradiation of the charged particle beam 10*a*1*b* is stopped when beam irradiate time of the charged particle beam 10*a*1*b* (see FIG. 2A) for drawing of the pattern P1*a* (see FIG. 6A) passes.

Figure 6B:
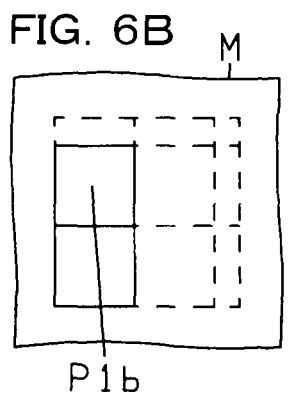

Then, in the example shown in FIGS. 6A, 6B, 6C, 6D, 6E, 6F, 6G, 6H and 6I, as shown in FIG. 6B, a pattern P1*b* which has the same shape as the largest pattern P (see FIG. 2B) is drawn on the workpiece M by a second shot of the charged particle beam 10*a*1*b* (see FIG. 2A).

In detail, in the example shown in FIGS. 6A, 6B, 6C, 6D, 6E, 6F, 6G, 6H and 6I, the sub-deflector 10*a*1*f* (see FIG. 1) is controlled via the deflect control circuit 10*b*5 (see FIG. 1) by the control computer 10*b*1 (see FIG. 1) of the control portion 10*b* (see FIG. 1) on the basis of the drawing data D (see FIG. 1), so that the pattern P1*b* (see FIG. 6B) is drawn by the second shot of the charged particle beam 10*a*1*b* when control of the blanking deflector 10*a*1*c* (see FIG. 1) is completed in order to stop the irradiation of the charged particle beam 10*a*1*b* (see FIG. 2A) for drawing the pattern P1*a* (see FIG. 6A).

Then, the blanking deflector 10*a*1*c* (see FIG. 1) is controlled via the deflect control circuit 10*b*2 (see FIG. 1) by the control computer 10*b*1 (see FIG. 1) of the control portion 10*b* (see FIG. 1) on the basis of the drawing data D (see FIG. 1), so that the shot of the charged particle beam 10*a*1*b* (FIG. 2A) for drawing the pattern P1*b* (see FIG. 6B) is started when control of the sub-deflector 10*a*1*f* is completed (when settling time of the sub-deflector 10*a*1*f* passes). Also, the beam size changing deflector 10*a*1*d* (see FIG. 1) is controlled via the deflect control circuit 10*b*3 (see FIG. 1) by the control computer 10*b*1 (see FIG. 1) of the control portion 10*b* (see FIG. 1) on the basis of the drawing data D (see FIG. 1), so that the charged particle beam 10*a*1*b* which has a horizontal sectional shape for drawing the pattern P1*b* (see FIG. 6B) is applied when control of the sub-deflector 10*a*1*f* is completed (when settling time of the sub-deflector 10*a*1*f* passes).

Then, the blanking deflector 10*a*1*c* (see FIG. 1) is controlled via the deflect control circuit 10*b*2 (see FIG. 1) by the control computer 10*b*1 (see FIG. 1) of the control portion 10*b* (see FIG. 1) on the basis of the drawing data D (see FIG. 1), so that irradiation of the charged particle beam 10*a*1*b* is stopped when beam irradiate time of the charged particle beam 10*a*1*b* (see FIG. 2A) for drawing of the pattern P1*b* (see FIG. 6B) passes.

Figure 6C:
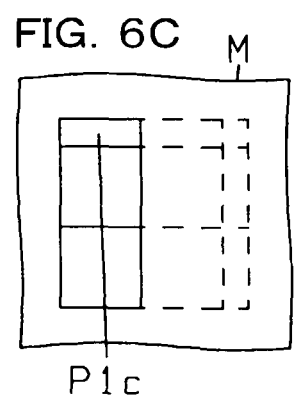

Then, in the example shown in FIGS. 6A, 6B, 6C, 6D, 6E, 6F, 6G, 6H and 6I, as shown in FIG. 6C, a pattern P1*c* which is smaller than the largest pattern P (see FIG. 2B) is drawn on the workpiece M by a third shot of the charged particle beam 10*a*1*b* (see FIG. 2A).

In detail, in the example shown in FIGS. 6A, 6B, 6C, 6D, 6E, 6F, 6G, 6H and 6I, the sub-deflector 10*a*1*f* (see FIG. 1) is controlled via the deflect control circuit 10*b*5 (see FIG. 1) by the control computer 10*b*1 (see FIG. 1) of the control portion 10*b* (see FIG. 1) on the basis of the drawing data D (see FIG. 1), so that the pattern P1*c* (see FIG. 6C) is drawn by the third shot of the charged particle beam 10*a*1*b* when control of the blanking deflector 10*a*1*c* (see FIG. 1) is completed in order to stop the irradiation of the charged particle beam 10*a*1*b* (see FIG. 2A) for drawing the pattern P1*b* (see FIG. 6B).

Then, the blanking deflector 10*a*1*c* (see FIG. 1) is controlled via the deflect control circuit 10*b*2 (see FIG. 1) by the control computer 10*b*1 (see FIG. 1) of the control portion 10*b* (see FIG. 1) on the basis of the drawing data D (see FIG. 1), so that the shot of the charged particle beam 10*a*1*b* (FIG. 2A) for drawing the pattern P1*c* (see FIG. 6C) is started when control of the sub-deflector 10*a*1*f* is completed (when settling time of the sub-deflector 10*a*1*f* passes). Also, the beam size changing deflector 10*a*1*d* (see FIG. 1) is controlled via the deflect control circuit 10*b*3 (see FIG. 1) by the control computer 10*b*1 (see FIG. 1) of the control portion 10*b* (see FIG. 1) on the basis of the drawing data D (see FIG. 1), so that the charged particle beam 10*a*1*b* which has a horizontal sectional shape for drawing the pattern P1*c* (see FIG. 6C) is applied when control of the sub-deflector 10*a*1*f* is completed (when settling time of the sub-deflector 10*a*1*f* passes).

Then, the blanking deflector 10*a*1*c* (see FIG. 1) is controlled via the deflect control circuit 10*b*2 (see FIG. 1) by the control computer 10*b*1 (see FIG. 1) of the control portion 10*b* (see FIG. 1) on the basis of the drawing data D (see FIG. 1), so that irradiation of the charged particle beam 10*a*1*b* is stopped when beam irradiate time of the charged particle beam 10*a*1*b* (see FIG. 2A) for drawing of the pattern P1*c* (see FIG. 6C) passes.

Figure 6D:
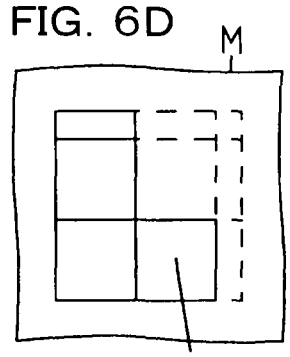

Then, in the example shown in FIGS. 6A, 6B, 6C, 6D, 6E, 6F, 6G, 6H and 6I, as shown in FIG. 6D, a pattern P1*d* which has the same shape as the largest pattern P (see FIG. 2B) is drawn on the workpiece M by a forth shot of the charged particle beam 10*a*1*b* (see FIG. 2A).

In detail, in the example shown in FIGS. 6A, 68, 6C, 6D, 6E, 6F, 6G, 6H and 6I, the sub-deflector 10*a*1*f* (see FIG. 1) is controlled via the deflect control circuit 10*b*5 (see FIG. 1) by the control computer 10*b*1 (see FIG. 1) of the control portion 10*b* (see FIG. 1) on the basis of the drawing data D (see FIG. 1), so that the pattern P1*d* (see FIG. 6D) is drawn by the forth shot of the charged particle beam 10*a*1*b* when control of the blanking deflector 10*a*1*c* (see FIG. 1) is completed in order to stop the irradiation of the charged particle beam 10*a*1*b* (see FIG. 2A) for drawing the pattern P1*c* (see FIG. 6C).

Then, the blanking deflector 10*a*1*c* (see FIG. 1) is controlled via the deflect control circuit 10*b*2 (see FIG. 1) by the control computer 10*b*1 (see FIG. 1) of the control portion 10*b* (see FIG. 1) on the basis of the drawing data D (see FIG. 1), so that the shot of the charged particle beam 10*a*1*b* (FIG. 2A) for drawing the pattern P1*d* (see FIG. 6D) is started when control of the sub-deflector 10*a*1*f* is completed (when settling time of the sub-deflector 10*a*1*f* passes). Also, the beam size changing deflector 10*a*1*d* (see FIG. 1) is controlled via the deflect control circuit 10*b*3 (see FIG. 1) by the control computer 10*b*1 (see FIG. 1) of the control portion 10*b* (see FIG. 1) on the basis of the drawing data D (see FIG. 1), so that the charged particle beam 10*a*1*b* which has a horizontal sectional shape for drawing the pattern P1*d* (see FIG. 6D) is applied when control of the sub-deflector 10*a*1*f* is completed (when settling time of the sub-deflector 10*a*1*f* passes).

Then, the blanking deflector 10*a*1*c* (see FIG. 1) is controlled via the deflect control circuit 10*b*2 (see FIG. 1) by the control computer 10*b*1 (see FIG. 1) of the control portion 10*b* (see FIG. 1) on the basis of the drawing data D (see FIG. 1), so that irradiation of the charged particle beam 10*a*1*b* is stopped when beam irradiate time of the charged particle beam 10*a*1*b* (see FIG. 2A) for drawing of the pattern P1*d* (see FIG. 6D) passes.

Figure 6E:
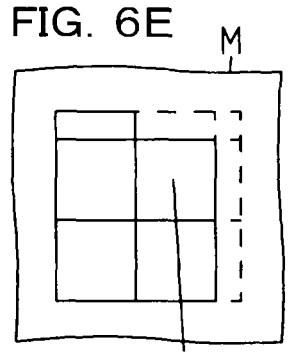

Then, in the example shown in FIGS. 6A, 6B, 6C, 6D, 6E, 6F, 6G, 6H and 6I, as shown in FIG. 6E, a pattern P1*e* which has the same shape as the largest pattern P (see FIG. 2B) is drawn on the workpiece M by a fifth shot of the charged particle beam 10*a*1*b* (see FIG. 2A).

In detail, in the example shown in FIGS. 6A, 6B, 6C, 6D, 6E, 6F, 6G, 6H and 6I, the sub-deflector 10*a*1*f* (see FIG. 1) is controlled via the deflect control circuit 10*b*5 (see FIG. 1) by the control computer 10*b*1 (see FIG. 1) of the control portion 10*b* (see FIG. 1) on the basis of the drawing data D (see FIG. 1), so that the pattern P1*e* (see FIG. 6E) is drawn by the fifth shot of the charged particle beam 10*a*1*b* when control of the blanking deflector 10*a*1*c* (see FIG. 1) is completed in order to stop the irradiation of the charged particle beam 10*a*1*b* (see FIG. 2A) for drawing the pattern P1*d* (see FIG. 6D).

Then, the blanking deflector 10*a*1*c* (see FIG. 1) is controlled via the deflect control circuit 10*b*2 (see FIG. 1) by the control computer 10*b*1 (see FIG. 1) of the control portion 10*b* (see FIG. 1) on the basis of the drawing data D (see FIG. 1), so that the shot of the charged particle beam 10*a*1*b* (FIG. 2A) for drawing the pattern P1*e* (see FIG. 6E) is started when control of the sub-deflector 10*a*1*f* is completed (when settling time of the sub-deflector 10*a*1*f* passes). Also, the beam size changing deflector 10*a*1*d* (see FIG. 1) is controlled via the deflect control circuit 10*b*3 (see FIG. 1) by the control computer 10*b*1 (see FIG. 1) of the control portion 10*b* (see FIG. 1) on the basis of the drawing data D (see FIG. 1), so that the charged particle beam 10*a*1*b* which has a horizontal sectional shape for drawing the pattern P1*e* (see FIG. 6E) is applied when control of the sub-deflector 10*a*1*f* is completed (when settling time of the sub-deflector 10*a*1*f* passes).

Then, the blanking deflector 10*a*1*c* (see FIG. 1) is controlled via the deflect control circuit 10*b*2 (see FIG. 1) by the control computer 10*b*1 (see FIG. 1) of the control portion 10*b* (see FIG. 1) on the basis of the drawing data D (see FIG. 1), so that irradiation of the charged particle beam 10*a*1*b* is stopped when beam irradiate time of the charged particle beam 10*a*1*b* (see FIG. 2A) for drawing of the pattern P1*e* (see FIG. 6E) passes.

Figure 6F:
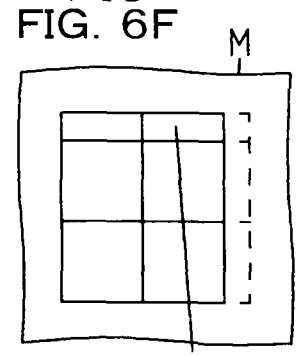

Then, in the example shown in FIGS. 6A, 6B, 6C, 6D, 6E, 6F, 6G, 6H and 6I, as shown in FIG. 6F, a pattern P1*f* which is smaller than the largest pattern P (see FIG. 2B) is drawn on the workpiece M by a sixth shot of the charged particle beam 10*a*1*b* (see FIG. 2A).

In detail, in the example shown in FIGS. 6A, 6B, 6C, 6D, 6E, 6F, 6G, 6H and 6I, the sub-deflector 10*a*1*f* (see FIG. 1) is controlled via the deflect control circuit 10*b*5 (see FIG. 1) by the control computer 10*b*1 (see FIG. 1) of the control portion 10*b* (see FIG. 1) on the basis of the drawing data D (see FIG. 1), so that the pattern P1*f* (see FIG. 6F) is drawn by the sixth shot of the charged particle beam 10a1b when control of the blanking deflector 10a1c (see FIG. 1) is completed in order to stop the irradiation of the charged particle beam 10a1b (see FIG. 2A) for drawing the pattern P1e (see FIG. 6E).

Then, the blanking deflector 10a1c (see FIG. 1) is controlled via the deflect control circuit 10b2 (see FIG. 1) by the control computer 10b1 (see FIG. 1) of the control portion 10b (see FIG. 1) on the basis of the drawing data D (see FIG. 1), so that the shot of the charged particle beam 10a1b (FIG. 2A) for drawing the pattern P1f (see FIG. 6F) is started when control of the sub-deflector 10a1f is completed (when settling time of the sub-deflector 10a1f passes). Also, the beam size changing deflector 10a1d (see FIG. 1) is controlled via the deflect control circuit 10b3 (see FIG. 1) by the control computer 10b1 (see FIG. 1) of the control portion 10b (see FIG. 1) on the basis of the drawing data D (see FIG. 1), so that the charged particle beam 10a1b which has a horizontal sectional shape for drawing the pattern P1f (see FIG. 6F) is applied when control of the sub-deflector 10a1f is completed (when settling time of the sub-deflector 10a1f passes).

Then, the blanking deflector 10a1c (see FIG. 1) is controlled via the deflect control circuit 10b2 (see FIG. 1) by the control computer 10b1 (see FIG. 1) of the control portion 10b (see FIG. 1) on the basis of the drawing data D (see FIG. 1), so that irradiation of the charged particle beam 10a1b is stopped when beam irradiate time of the charged particle beam 10a1b (see FIG. 2A) for drawing of the pattern P1f (see FIG. 6F) passes.

Figure 6G:
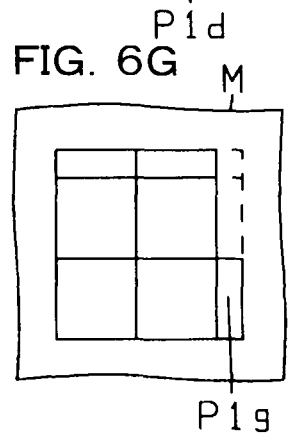

Then, in the example shown in FIGS. 6A, 6B, 6C, 6D, 6E, 6F, 6G, 6H and 6I, as shown in FIG. 6G, a pattern P1g which is smaller than the largest pattern P (see FIG. 2B) is drawn on the workpiece M by a seventh shot of the charged particle beam 10a1b (see FIG. 2A).

In detail, in the example shown in FIGS. 6A, 6B, 6C, 6D, 6E, 6F, 6G, 6H and 6I, the sub-deflector 10a1f (see FIG. 1) is controlled via the deflect control circuit 10b5 (see FIG. 1) by the control computer 10b1 (see FIG. 1) of the control portion 10b (see FIG. 1) on the basis of the drawing data D (see FIG. 1), so that the pattern P1g (see FIG. 6G) is drawn by the seventh shot of the charged particle beam 10a1b when control of the blanking deflector 10a1c (see FIG. 1) is completed in order to stop the irradiation of the charged particle beam 10a1b (see FIG. 2A) for drawing the pattern P1f (see FIG. 6F).

Then, the blanking deflector 10a1c (see FIG. 1) is controlled via the deflect control circuit 10b2 (see FIG. 1) by the control computer 10b1 (see FIG. 1) of the control portion 10b (see FIG. 1) on the basis of the drawing data D (see FIG. 1), so that the shot of the charged particle beam 10a1b (FIG. 2A) for drawing the pattern P1g (see FIG. 6G) is started when control of the sub-deflector 10a1f is completed (when settling time of the sub-deflector 10a1f passes). Also, the beam size changing deflector 10a1d (see FIG. 1) is controlled via the deflect control circuit 10b3 (see FIG. 1) by the control computer 10b1 (see FIG. 1) of the control portion 10b (see FIG. 1) on the basis of the drawing data D (see FIG. 1), so that the charged particle beam 10a1b which has a horizontal sectional shape for drawing the pattern P1g (see FIG. 6G) is applied when control of the sub-deflector 10a1f is completed (when settling time of the sub-deflector 10a1f passes).

Then, the blanking deflector 10a1c (see FIG. 1) is controlled via the deflect control circuit 10b2 (see FIG. 1) by the control computer 10b1 (see FIG. 1) of the control portion 10b (see FIG. 1) on the basis of the drawing data D (see FIG. 1), so that irradiation of the charged particle beam 10a1b is stopped when beam irradiate time of the charged particle beam 10a1b (see FIG. 2A) for drawing of the pattern P1g (see FIG. 6G) passes.

Figure 6H:
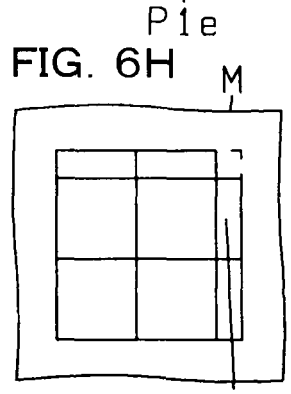

Then, in the example shown in FIGS. 6A, 6B, 6C, 6D, 6E, 6F, 6G, 6H and 6I, as shown in FIG. 6H, a pattern P1h which is smaller than the largest pattern P (see FIG. 2B) is drawn on the workpiece M by a eighth shot of the charged particle beam 10a1b (see FIG. 2A).

In detail, in the example shown in FIGS. 6A, 6B, 6C, 6D, 6E, 6F, 6G, 6H and 6I, the sub-deflector 10a1f (see FIG. 1) is controlled via the deflect control circuit 10b5 (see FIG. 1) by the control computer 10b1 (see FIG. 1) of the control portion 10b (see FIG. 1) on the basis of the drawing data D (see FIG. 1), so that the pattern P1h (see FIG. 6H) is drawn by the eighth shot of the charged particle beam 10a1b when control of the blanking deflector 10a1c (see FIG. 1) is completed in order to stop the irradiation of the charged particle beam 10a1b (see FIG. 2A) for drawing the pattern P1g (see FIG. 6G).

Then, the blanking deflector 10a1c (see FIG. 1) is controlled via the deflect control circuit 10b2 (see FIG. 1) by the control computer 10b1 (see FIG. 1) of the control portion 10b (see FIG. 1) on the basis of the drawing data D (see FIG. 1), so that the shot of the charged particle beam 10a1b (FIG. 2A) for drawing the pattern P1h (see FIG. 6H) is started when control of the sub-deflector 10a1f is completed (when settling time of the sub-deflector 10a1f passes). Also, the beam size changing deflector 10a1d (see FIG. 1) is controlled via the deflect control circuit 10b3 (see FIG. 1) by the control computer 10b1 (see FIG. 1) of the control portion 10b (see FIG. 1) on the basis of the drawing data D (see FIG. 1), so that the charged particle beam 10a1b which has a horizontal sectional shape for drawing the pattern P1h (see FIG. 6H) is applied when control of the sub-deflector 10a1f is completed (when settling time of the sub-deflector 10a1f passes).

Then, the blanking deflector 10a1c (see FIG. 1) is controlled via the deflect control circuit 10b2 (see FIG. 1) by the control computer 10b1 (see FIG. 1) of the control portion 10b (see FIG. 1) on the basis of the drawing data D (see FIG. 1), so that irradiation of the charged particle beam 10a1b is stopped when beam irradiate time of the charged particle beam 10a1b (see FIG. 2A) for drawing of the pattern P1h (see FIG. 6H) passes.

Figure 6I:
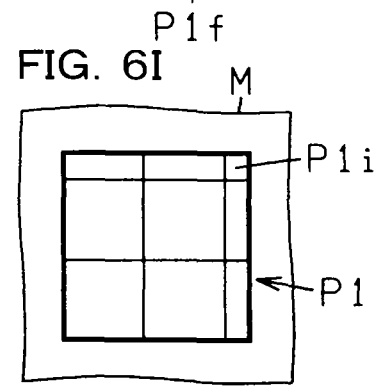

Then, in the example shown in FIGS. 6A, 6B, 6C, 6D, 6E, 6F, 6G, 6H and 6I, as shown in FIG. 6I, a pattern P1i which is smaller than the largest pattern P (see FIG. 2B) is drawn on the workpiece M by a ninth shot of the charged particle beam 10a1b (see FIG. 2A).

In detail, in the example shown in FIGS. 6A, 6B, 6C, 6D, 6E, 6F, 6G, 6H and 6I, the sub-deflector 10a1f (see FIG. 1) is controlled via the deflect control circuit 10b5 (see FIG. 1) by the control computer 10b1 (see FIG. 1) of the control portion 10b (see FIG. 1) on the basis of the drawing data D (see FIG. 1), so that the pattern P1i (see FIG. 6H) is drawn by the ninth shot of the charged particle beam 10a1b when control of the blanking deflector 10a1c (see FIG. 1) is completed in order to stop the irradiation of the charged particle beam 10a1b (see FIG. 2A) for drawing the pattern P1h (see FIG. 6H).

Then, the blanking deflector 10a1c (see FIG. 1) is controlled via the deflect control circuit 10b2 (see FIG. 1) by the control computer 10b1 (see FIG. 1) of the control portion 10b (see FIG. 1) on the basis of the drawing data D (see FIG. 1), so that the shot of the charged particle beam 10a1b (FIG. 2A) for drawing the pattern P1i (see FIG. 6I) is started when control of the sub-deflector 10a1f is completed (when settling time of the sub-deflector 10a1f passes). Also, the beam size changing deflector 10a1d (see FIG. 1) is controlled via the deflect control circuit 10b3 (see FIG. 1) by the control computer 10b1 (see FIG. 1) of the control portion 10b (see FIG. 1) on the basis of the drawing data D (see FIG. 1), so that the charged particle beam 10a1b which has a horizontal sectional shape for drawing the pattern P1i (see FIG. 6I) is applied when control of the sub-deflector 10a1f is completed (when settling time of the sub-deflector 10a1f passes).

Then, the blanking deflector 10a1c (see FIG. 1) is controlled via the deflect control circuit 10b2 (see FIG. 1) by the control computer 10b1 (see FIG. 1) of the control portion 10b (see FIG. 1) on the basis of the drawing data D (see FIG. 1), so that irradiation of the charged particle beam 10a1b is stopped when beam irradiate time of the charged particle beam 10a1b (see FIG. 2A) for drawing of the pattern P1i (see FIG. 6I) passes.

Accordingly, in the example shown in FIGS. 6A, 6B, 6C, 6D, 6E, 6F, 6G, 6H and 6I, the pattern P1 corresponding to the figure FG1 (see FIG. 3) included in the drawing data D (see FIG. 1) is drawn on the workpiece M by the charged particle beam 10a1b (see FIG. 2A).

In the charged particle beam drawing apparatus 10 of the first embodiment, as shown in FIGS. 6A, 6B, 6C, 6D, 6E, 6F, 6G, 6H and 6I, when the pattern P1 corresponding to the figure FG1 (see FIG. 3) included in the drawing data D (see FIG. 1) is drawn on the workpiece M by the charged particle beam 10a1b (see FIG. 2A), the movable stage 10a2a (see FIG. 1) is controlled via the stage control circuit 10b6 (see FIG. 1) by the control computer 10b1 (see FIG. 1) of the control portion 10b (see FIG. 1) on the basis of the drawing data D (see FIG. 1), so that the movable stage 10a2a is moved from plus side (right side of FIG. 4) of X axis to mines side (left side of FIG. 4) of X axis.

In detail, in the example shown in FIG. 4, when a plurality of patterns such as pattern P1 (see FIGS. 5 and 6I) are drawn in the stripe STR2 of the workpiece M by the charged particle beam 10a1b, the movable stage 10a2a (see FIG. 1) is controlled via the stage control circuit 10b6 (see FIG. 1) by the control computer 10b1 (see FIG. 1) of the control portion 10b (see FIG. 1) on the basis of the drawing data D (see FIG. 1), so that the movable stage 10a2a is moved from plus side (right side of FIG. 4) of X axis to mines side (left side of FIG. 4) of X axis at a constant speed. In another example, the movable stage 10a2a (see FIG. 1) is moved at a low speed when patterns are drawn in a high density area of patterns in the stripe STR2, the movable stage 10a2a (see FIG. 1) is moved at a high speed when patterns are drawn in a low density area of patterns in the stripe STR2.

In the example shown in FIG. 4, when a plurality of patterns (not shown) are drawn in the stripe STR1 of the workpiece M by the charged particle beam 10a1b, the movable stage 10a2a (see FIG. 1) is controlled via the stage control circuit 10b6 (see FIG. 1) by the control computer 10b1 (see FIG. 1) of the control portion 10b (see FIG. 1) on the basis of the drawing data D (see FIG. 1), so that the movable stage 10a2a is moved from minus side (left side of FIG. 4) of X axis to plus side (right side of FIG. 4) of X axis at a constant speed. In another example, the movable stage 10a2a (see FIG. 1) is moved at a low speed when patterns are drawn in a high density area of patterns in the stripe STR1, the movable stage 10a2a (see FIG. 1) is moved at a high speed when patterns are drawn in a low density area of patterns in the stripe STR1.

In the example shown in FIG. 4, when a plurality of patterns (not shown) are drawn in the stripe STR3 of the workpiece M by the charged particle beam 10a1b, the movable stage 10a2a (see FIG. 1) is controlled via the stage control circuit 10b6 (see FIG. 1) by the control computer 10b1 (see FIG. 1) of the control portion 10b (see FIG. 1) on the basis of the drawing data D (see FIG. 1), so that the movable stage 10a2a is moved from minus side (left side of FIG. 4) of X axis to plus side (right side of FIG. 4) of X axis at a constant speed. In another example, the movable stage 10a2a (see FIG. 1) is moved at a low speed when patterns are drawn in a high density area of patterns in the stripe STR3, the movable stage 10a2a (see FIG. 1) is moved at a high speed when patterns are drawn in a low density area of patterns in the stripe STR3.

Figure 7A:
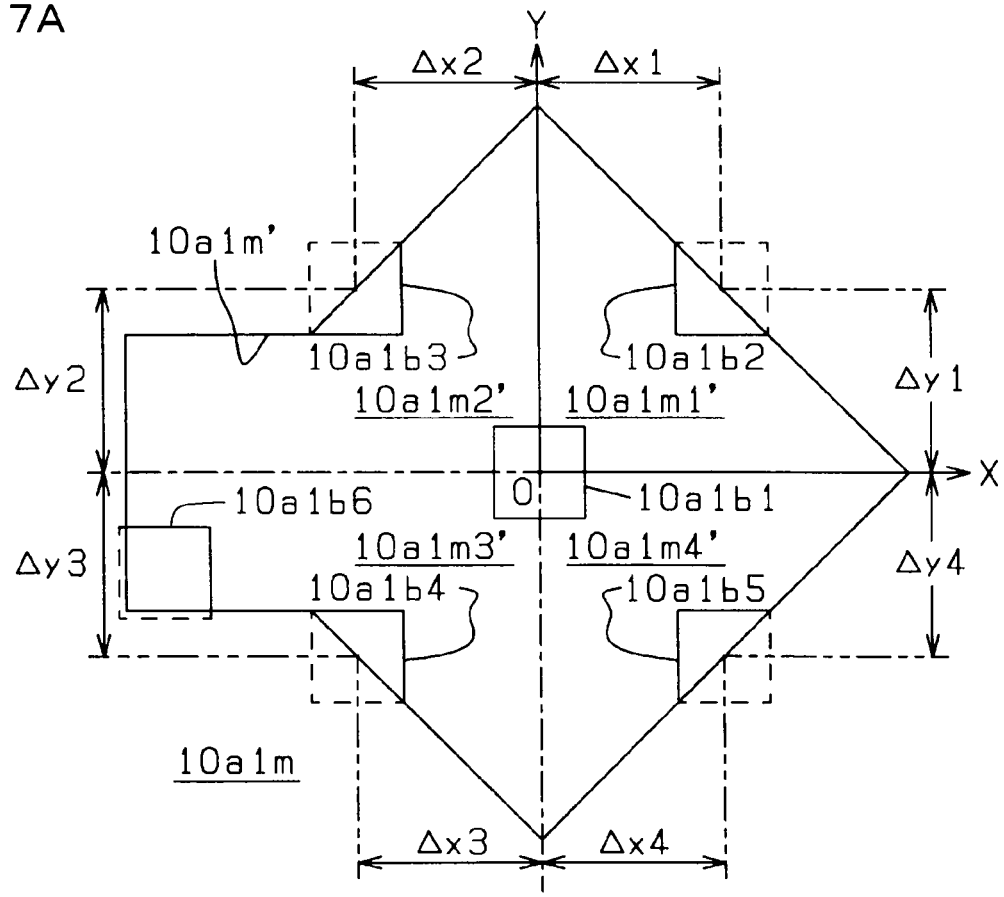
FIGS. 7A and 7B explain a position difference of the charged particle beam $10a1b$ on the workpiece M in the charged particle beam drawing apparatus 10 of the first embodiment.
Figure 7B:
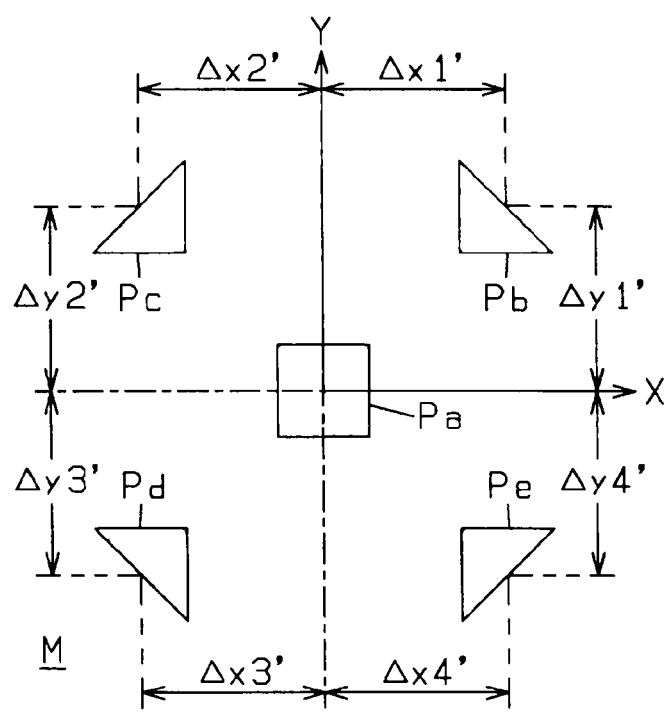

FIGS. 7A and 7B explain a position difference of the charged particle beam 10a1b on the workpiece M in the charged particle beam drawing apparatus 10 of the first embodiment. In an example shown in FIGS. 7A and 7B, a standard point is placed on a point O (see FIG. 7A). In other words, in the example shown in FIGS. 7A and 7B, if the charge particle beam 10a1b (see FIG. 2A) passed through the square opening 10a1l' (see FIG. 2A) of the first forming aperture member 10a1l (see FIG. 2A) is not deflected by the beam size changing deflector 10a1d (see FIG. 1), a charged particle beam 10a1b1 (see FIG. 7A) having a square horizontal sectional shape is passed through the opening 10a1m' (see FIG. 7A) of the second forming aperture member 10a1m (see FIG. 7A). Accordingly, a square pattern Pa (see FIG. 7B) is drawn on the workpiece M (see FIG. 7B) by the charged particle beam 10a1b1 (see FIG. 7A) passed through the opening 10a1m' (see FIG. 7A) of the second forming aperture member 10a1m (see FIG. 7A). In fact, when a rectangular (square or oblong) pattern (not shown) is drawn on the workpiece M (see FIG. 7B), the charged particle beam 10a1b6 (see FIG. 7A) passed through a left lower end portion of a left lower area 10a1m3' (see FIG. 7A) of the opening 10a1m' (see FIG. 7A) of the second forming aperture member 10a1m (see FIG. 7A) is used.

In the example shown in FIGS. 7A and 7B, if the charge particle beam 10a1b (see FIG. 2A) passed through the square opening 10a1l' (see FIG. 2A) of the first forming aperture member 10a1l (see FIG. 2A) is deflected by the beam size changing deflector (see FIG. 1), deflecting amount to plus side (right side of FIG. 7A) of X axis is $\Delta x1$ (see FIG. 7A), and deflecting amount to plus side (upper side of FIG. 7A) of Y axis is $\Delta y1$ (see FIG. 7A), a charged particle beam 10a1b2 (see FIG. 7A) having a triangular horizontal sectional shape is passed through right upper area 10a1m1' (see FIG. 7A) of the opening 10a1m' (see FIG. 7A) of the second forming aperture member 10a1m (see FIG. 7A). Accordingly, a triangular pattern Pb (see FIG. 7B) is drawn on the workpiece M (see FIG. 7B) by the charged particle beam 10a1b2 (see FIG. 7A) passed through right upper area 10a1m1' (see FIG. 7A) of the opening 10a1m' (see FIG. 7A) of the second forming aperture member 10a1m (see FIG. 7A). Position difference amount to plus side (right side of FIG. 7B) of X axis of the triangular pattern Pb (see FIG. 7B) with respect to the square pattern Pa (see FIG. 7B) is $\Delta x1'$ (see FIG. 7B), and position difference amount to plus side (upper side of FIG. 7B) of Y axis of the triangular pattern Pb (see FIG. 7B) with respect to the square pattern Pa (see FIG. 7B) is $\Delta y1'$ (see FIG. 7A).

In other words, in the example shown in FIGS. 7A and 7B, the pattern Pb (see FIG. 7B) drawn on the workpiece M (see FIG. 7B) by the charged particle beam 10a1b2 (see FIG. 7A) passed through right upper area 10a1m1' (see FIG. 7A) of the opening 10a1m' (see FIG. 7A) of the second forming aperture member 10a1m (see FIG. 7A), has position difference to plus side (right side of FIG. 7B) of X axis and position difference to plus side (upper side of FIG. 7B) of Y axis, with respect to the pattern Pa (see FIG. 7B) drawn on the workpiece M (see FIG. 7B) by the charged particle beam 10a1b1 (see FIG. 7A) passed through the standard point O (see FIG. 7A) in the opening 10a1m' (see FIG. 7A) of the second forming aperture member 10a1m (see FIG. 7A).

In the example shown in FIGS. 7A and 7B, if the charge particle beam 10a1b (see FIG. 2A) passed through the square opening 10a1l' (see FIG. 2A) of the first forming aperture member 10a1l (see FIG. 2A) is deflected by the beam size changing deflector (see FIG. 1), deflecting amount to minus side (left side of FIG. 7A) of X axis is Δx2 (see FIG. 7A), and deflecting amount to plus side (upper side of FIG. 7A) of Y axis is Δy2 (see FIG. 7A), a charged particle beam 10a1b3 (see FIG. 7A) having a triangular horizontal sectional shape is passed through left upper area 10a1m2' (see FIG. 7A) of the opening 10a1m' (see FIG. 7A) of the second forming aperture member 10a1m (see FIG. 7A). Accordingly, a triangular pattern Pc (see FIG. 7B) is drawn on the workpiece M (see FIG. 7B) by the charged particle beam 10a1b3 (see FIG. 7A) passed through left upper area 10a1m2' (see FIG. 7A) of the opening 10a1m' (see FIG. 7A) of the second forming aperture member 10a1m (see FIG. 7A). Position difference amount to minus side (left side of FIG. 7B) of X axis of the triangular pattern Pc (see FIG. 7B) with respect to the square pattern Pa (see FIG. 7B) is £x2' (see FIG. 7B), and position difference amount to plus side (upper side of FIG. 7B) of Y axis of the triangular pattern Pc (see FIG. 7B) with respect to the square pattern Pa (see FIG. 7B) is Δy2' (see FIG. 7A).

In other words, in the example shown in FIGS. 7A and 7B, the pattern Pc (see FIG. 7B) drawn on the workpiece M (see FIG. 7B) by the charged particle beam 10a1b3 (see FIG. 7A) passed through left upper area 10a1m2' (see FIG. 7A) of the opening 10a1m' (see FIG. 7A) of the second forming aperture member 10a1m (see FIG. 7A), has position difference to minus side (left side of FIG. 7B) of X axis and position difference to plus side (upper side of FIG. 7B) of Y axis, with respect to the pattern Pa (see FIG. 7B) drawn on the workpiece M (see FIG. 7B) by the charged particle beam 10a1b1 (see FIG. 7A) passed through the standard point O (see FIG. 7A) in the opening 10a1m' (see FIG. 7A) of the second forming aperture member 10a1m (see FIG. 7A).

In the example shown in FIGS. 7A and 7B, if the charge particle beam 10a1b (see FIG. 2A) passed through the square opening 10a1l' (see FIG. 2A) of the first forming aperture member 10a1l (see FIG. 2A) is deflected by the beam size changing deflector (see FIG. 1), deflecting amount to minus side (left side of FIG. 7A) of X axis is Δx3 (see FIG. 7A), and deflecting amount to minus side (lower side of FIG. 7A) of Y axis is Δy3 (see FIG. 7A), a charged particle beam 10a1b4 (see FIG. 7A) having a triangular horizontal sectional shape is passed through left lower area 10a1m3' (see FIG. 7A) of the opening 10a1m' (see FIG. 7A) of the second forming aperture member 10a1m (see FIG. 7A). Accordingly, a triangular pattern Pd (see FIG. 7B) is drawn on the workpiece M (see FIG. 7B) by the charged particle beam 10a1b4 (see FIG. 7A) passed through left lower area 10a1m3' (see FIG. 7A) of the opening 10a1m' (see FIG. 7A) of the second forming aperture member 10a1m (see FIG. 7A). Position difference amount to minus side (left side of FIG. 7B) of X axis of the triangular pattern Pd (see FIG. 7B) with respect to the square pattern Pa (see FIG. 7B) is Δx3' (see FIG. 7B), and position difference amount to minus side (lower side of FIG. 7B) of Y axis of the triangular pattern Pd (see FIG. 7B) with respect to the square pattern Pa (see FIG. 7B) is Δy3' (see FIG. 7A).

In other words, in the example shown in FIGS. 7A and 7B, the pattern Pd (see FIG. 7B) drawn on the workpiece M (see FIG. 7B) by the charged particle beam 10a1b4 (see FIG. 7A) passed through left lower area 10a1m3' (see FIG. 7A) of the opening 10a1m' (see FIG. 7A) of the second forming aperture member 10a1m (see FIG. 7A), has position difference to minus side (left side of FIG. 7B) of X axis and position difference to minus side (lower side of FIG. 7B) of Y axis, with respect to the pattern Pa (see FIG. 7B) drawn on the workpiece M (see FIG. 7B) by the charged particle beam 10a1b1 (see FIG. 7A) passed through the standard point O (see FIG. 7A) in the opening 10a1m' (see FIG. 7A) of the second forming aperture member 10a1m (see FIG. 7A).

In the example shown in FIGS. 7A and 7B, if the charge particle beam 10a1b (see FIG. 2A) passed through the square opening 10a1l' (see FIG. 2A) of the first forming aperture member 10a1l (see FIG. 2A) is deflected by the beam size changing deflector (see FIG. 1), deflecting amount to plus side (right side of FIG. 7A) of X axis is Δx4 (see FIG. 7A), and deflecting amount to minus side (lower side of FIG. 7A) of Y axis is Δy4 (see FIG. 7A), a charged particle beam 10a1b5 (see FIG. 7A) having a triangular horizontal sectional shape is passed through right lower area 10a1m4' (see FIG. 7A) of the opening 10a1m' (see FIG. 7A) of the second forming aperture member 10a1m (see FIG. 7A). Accordingly, a triangular pattern Pe (see FIG. 7B) is drawn on the workpiece M (see FIG. 7B) by the charged particle beam 10a1b5 (see FIG. 7A) passed through right lower area 10a1m4' (see FIG. 7A) of the opening 10a1m' (see FIG. 7A) of the second forming aperture member 10a1m (see FIG. 7A). Position difference amount to plus side (right side of FIG. 7B) of X axis of the triangular pattern Pe (see FIG. 7B) with respect to the square pattern Pa (see FIG. 7B) is Δx4' (see FIG. 7B), and position difference amount to minus side (lower side of FIG. 7B) of Y axis of the triangular pattern Pe (see FIG. 7B) with respect to the square pattern Pa (see FIG. 7B) is Δy4' (see FIG. 7A).

In other words, in the example shown in FIGS. 7A and 7B, the pattern Pe (see FIG. 7B) drawn on the workpiece M (see FIG. 7B) by the charged particle beam 10a1b5 (see FIG. 7A) passed through right lower area 10a1m4' (see FIG. 7A) of the opening 10a1m' (see FIG. 7A) of the second forming aperture member 10a1m (see FIG. 7A), has position difference to plus side (right side of FIG. 7B) of X axis and position difference to minus side (lower side of FIG. 7B) of Y axis, with respect to the pattern Pa (see FIG. 7B) drawn on the workpiece M (see FIG. 7B) by the charged particle beam 10a1b1 (see FIG. 7A) passed through the standard point O (see FIG. 7A) in the opening 10a1m' (see FIG. 7A) of the second forming aperture member 10a1m (see FIG. 7A).

Figure 8A:
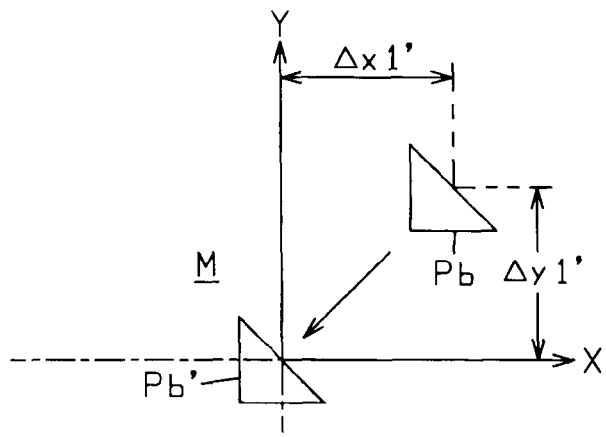
FIGS. 8A, 8B, 8C and 8D explain an offset process which is performed by a charged particle beam drawing apparatus in prior art, in order to cancel position difference $\Delta x1'$, $\Delta x2'$, $\Delta x3'$, $\Delta x4'$ in X direction and position difference $\Delta y1'$, $\Delta y2'$, $\Delta y3'$, $\Delta y4'$ in Y direction.
Figure 8B:
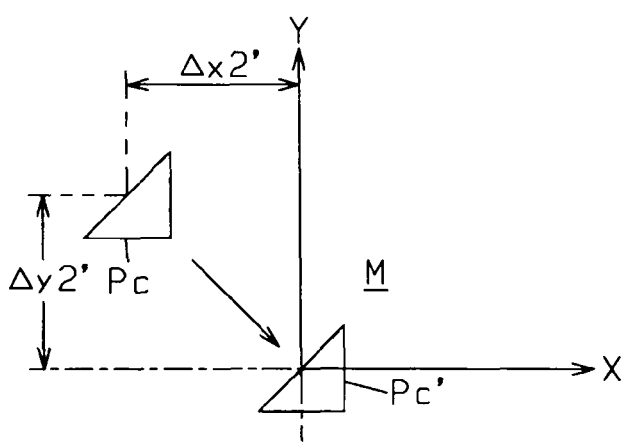
Figure 8C:
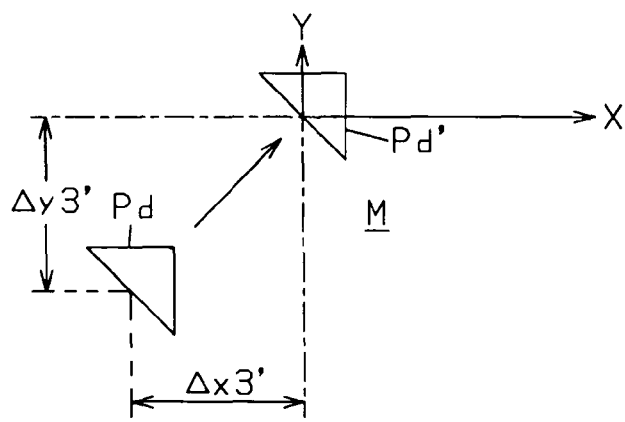

FIGS. 8A, 8B, 8C and 8C explain an offset process which is performed by the charged particle beam drawing apparatus as described in Japanese Unexamined Patent Publication No. 2007-324229, in order to cancel position difference Δx1', Δx2', Δx3', Δx4' (see FIG. 7B) in X direction and position difference Δy1', Δy2', Δy3', Δy4' (see FIG. 7B) in Y direction.

In the charged particle beam drawing apparatus as described in Japanese Unexamined Patent Publication No. 2007-324229, as shown by an arrow in FIG. 8A, the charged particle beam 10a1b2 (see FIG. 7A) is deflected to minus side (left side of FIG. 8A) of X axis and minus side (lower side of FIG. 8A) of Y axis by the sub-deflector 10a1f (see FIG. 1), in order to cancel position difference Δx1' (see FIG. 7B) in X direction and position difference Δy1' (see FIG. 7B) in Y direction, when the pattern Pb (see FIG. 7B) is drawn on the workpiece M (see FIG. 7B) by the charged particle beam 10a1b2 (see FIG. 7A) passed through right upper area 10a1m1' (see FIG. 7A) of the opening 10a1m' (see FIG. 7A) of the second forming aperture member 10a1m (see FIG. 7A). Accordingly, as shown in FIG. 8A, position difference Δx1' in X direction and position difference Δy1' in Y direction are cancelled, and a pattern Pb' is drawn in a target position on the workpiece M.

In the charged particle beam drawing apparatus as described in Japanese Unexamined Patent Publication No. 2007-324229, as shown by an arrow in FIG. 8B, the charged particle beam 10a1b3 (see FIG. 7A) is deflected to plus side (right side of FIG. 8B) of X axis and minus side (lower side of FIG. 8B) of Y axis by the sub-deflector 10a1f (see FIG. 1), in order to cancel position difference Δx2' (see FIG. 7B) in X direction and position difference Δy2' (see FIG. 7B) in Y direction, when the pattern Pc (see FIG. 7B) is drawn on the workpiece M (see FIG. 7B) by the charged particle beam 10a1b3 (see FIG. 7A) passed through left upper area 10a1m2' (see FIG. 7A) of the opening 10a1m' (see FIG. 7A) of the second forming aperture member 10a1m (see FIG. 7A). Accordingly, as shown in FIG. 8B, position difference Δx2' in X direction and position difference Δy2' in Y direction are cancelled, and a pattern Pc' is drawn in a target position on the workpiece M.

In the charged particle beam drawing apparatus as described in Japanese Unexamined Patent Publication No. 2007-324229, as shown by an arrow in FIG. 8C, the charged particle beam 10a1b4 (see FIG. 7A) is deflected to plus side (right side of FIG. 8C) of X axis and plus side (upper side of FIG. 8C) of Y axis by the sub-deflector 10a1f (see FIG. 1), in order to cancel position difference Δx3' (see FIG. 7B) in X direction and position difference Δy3' (see FIG. 7B) in Y direction, when the pattern Pd (see FIG. 7B) is drawn on the workpiece M (see FIG. 7B) by the charged particle beam 10a1b4 (see FIG. 7A) passed through left lower area 10a1m3' (see FIG. 7A) of the opening 10a1m' (see FIG. 7A) of the second forming aperture member 10a1m (see FIG. 7A). Accordingly, as shown in FIG. 8C, position difference Δx3' in X direction and position difference Δy3' in Y direction are cancelled, and a pattern Pd' is drawn in a target position on the workpiece M.

Figure 8D:
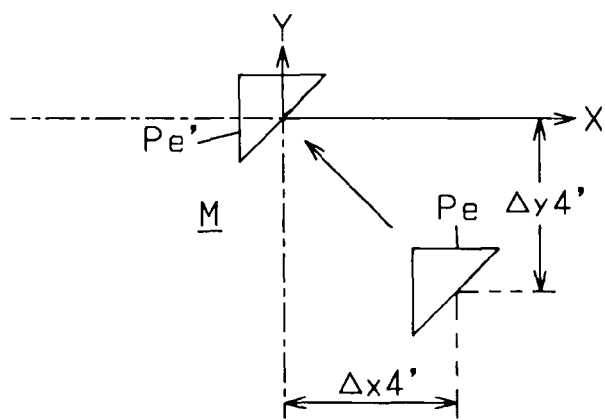

In the charged particle beam drawing apparatus as described in Japanese Unexamined Patent Publication No. 2007-324229, as shown by an arrow in FIG. 8D, the charged particle beam 10a1b5 (see FIG. 7A) is deflected to minus side (left side of FIG. 8D) of X axis and plus side (upper side of FIG. 8D) of Y axis by the sub-deflector 10a1f (see FIG. 1), in order to cancel position difference Δx4' (see FIG. 7B) in X direction and position difference Δy4' (see FIG. 7B) in Y direction, when the pattern Pe (see FIG. 7B) is drawn on the workpiece M (see FIG. 7B) by the charged particle beam 10a1b5 (see FIG. 7A) passed through right lower area 10a1m4' (see FIG. 7A) of the opening 10a1m' (see FIG. 7A) of the second forming aperture member 10a1m (see FIG. 7A). Accordingly, as shown in FIG. 8D, position difference Δx4' in X direction and position difference Δy4' in Y direction are cancelled, and a pattern Pe' is drawn in a target position on the workpiece M.

FIGS. 9A, 9B, 10A, 10B, 11A and 11B explain limit area Aa, Ab, Ac, Ad, Ae where the charged particle beam 10a1b can be deflected by the sub-deflector 10a1f. In the charged particle beam drawing apparatus 10 of the first embodiment and in the charged particle beam drawing apparatus as described in Japanese Unexamined Patent Publication No. 2007-324229, if the charge particle beam 10a1b1 (see FIG. 7A) having square horizontal sectional shape, passed through the opening 10a1m' (see FIG. 7A) of the second forming aperture member 10a1m (see FIG. 7A) is not deflected by the sub-deflector 10a1f (see FIG. 1), the square pattern Pa (see FIG. 9A) is drawn in a position shown in FIG. 9A on the workpiece M (see FIG. 9A) by the charged particle beam 10a1b1 (see FIG. 7A).

Figure 9A:
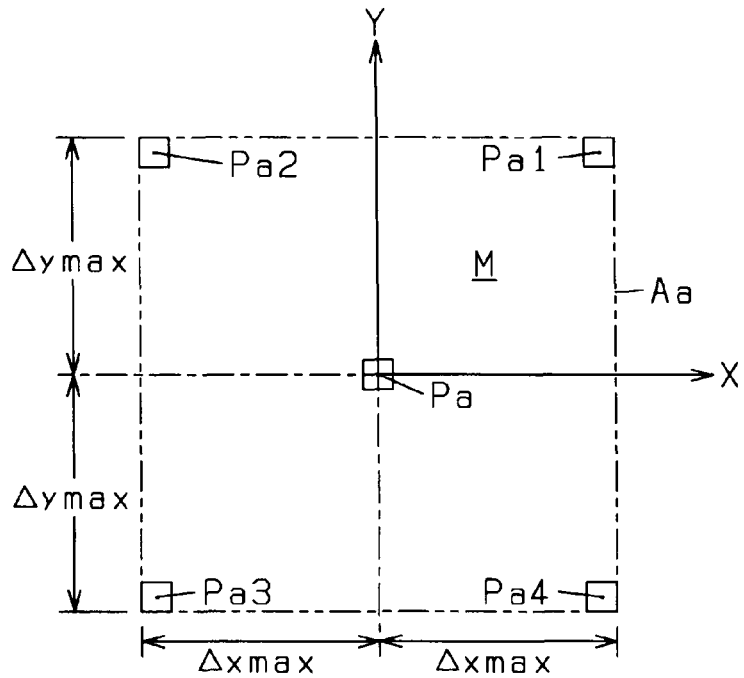
FIGS. 9A and 9B explain limit area Aa, Ab where the charged particle beam 10a1b can be deflected by the sub-deflector 10a1f.

In the charged particle beam drawing apparatus 10 of the first embodiment and in the charged particle beam drawing apparatus as described in Japanese Unexamined Patent Publication No. 2007-324229, if the charge particle beam 10a1b1 (see FIG. 7A) having square horizontal sectional shape, passed through the opening 10a1m' (see FIG. 7A) of the second forming aperture member 10a1m (see FIG. 7A) is maximally deflected to plus side (right side of FIG. 9A) of X axis and is maximally deflected to plus side (upper side of FIG. 9A) of Y axis by the sub-deflector 10a1f (see FIG. 1) without a distortion of a pattern Pa1 (see FIG. 9A), deflecting amount to plus side (right side of FIG. 9A) of X axis is Δxmax (see FIG. 9A), and deflecting amount to plus side (upper side of FIG. 9A) of Y axis is Δymax (see FIG. 9A), the square pattern Pa1 (see FIG. 9A) is drawn in a position shown in FIG. 9A on the workpiece M (see FIG. 9A) by the charged particle beam 10a1b1 (see FIG. 7A).

In the charged particle beam drawing apparatus 10 of the first embodiment and in the charged particle beam drawing apparatus as described in Japanese Unexamined Patent Publication No. 2007-324229, if the charge particle beam 10a1b1 (see FIG. 7A) having square horizontal sectional shape, passed through the opening 10a1m' (see FIG. 7A) of the second forming aperture member 10a1m (see FIG. 7A) is maximally deflected to minus side (left side of FIG. 9A) of X axis and is maximally deflected to plus side (upper side of FIG. 9A) of Y axis by the sub-deflector 10a1f (see FIG. 1) without a distortion of a pattern Pa2 (see FIG. 9A), deflecting amount to minus side (left side of FIG. 9A) of X axis is Δxmax (see FIG. 9A), and deflecting amount to plus side (upper side of FIG. 9A) of Y axis is Δymax (see FIG. 9A), the square pattern Pa2 (see FIG. 9A) is drawn in a position shown in FIG. 9A on the workpiece M (see FIG. 9A) by the charged particle beam 10a1b1 (see FIG. 7A).

In the charged particle beam drawing apparatus 10 of the first embodiment and in the charged particle beam drawing apparatus as described in Japanese Unexamined Patent Publication No. 2007-324229, if the charge particle beam 10a1b1 (see FIG. 7A) having square horizontal sectional shape, passed through the opening 10a1m' (see FIG. 7A) of the second forming aperture member 10a1m (see FIG. 7A) is maximally deflected to minus side (left side of FIG. 9A) of X axis and is maximally deflected to minus side (lower side of FIG. 9A) of Y axis by the sub-deflector 10a1f (see FIG. 1) without a distortion of a pattern Pa3 (see FIG. 9A), deflecting amount to minus side (left side of FIG. 9A) of X axis is Δxmax (see FIG. 9A), and deflecting amount to minus side (lower side of FIG. 9A) of Y axis is Δymax (see FIG. 9A), the square pattern Pa3 (see FIG. 9A) is drawn in a position shown in FIG. 9A on the workpiece M (see FIG. 9A) by the charged particle beam 10a1b1 (see FIG. 7A).

In the charged particle beam drawing apparatus 10 of the first embodiment and in the charged particle beam drawing apparatus as described in Japanese Unexamined Patent Publication No. 2007-324229, if the charge particle beam 10a1b1 (see FIG. 7A) having square horizontal sectional shape, passed through the opening 10a1m' (see FIG. 7A) of the second forming aperture member 10a1m (see FIG. 7A) is maximally deflected to plus side (right side of FIG. 9A) of X axis and is maximally deflected to minus side (lower side of FIG. 9A) of Y axis by the sub-deflector 10a1f (see FIG. 1) without a distortion of a pattern Pa4 (see FIG. 9A), deflecting amount to plus side (right side of FIG. 9A) of X axis is Δxmax (see FIG. 9A), and deflecting amount to minus side (lower side of FIG. 9A) of Y axis is Δymax (see FIG. 9A), the square pattern Pa4 (see FIG. 9A) is drawn in a position shown in FIG. 9A on the workpiece M (see FIG. 9A) by the charged particle beam 10a1b1 (see FIG. 7A).

In other words, in the charged particle beam drawing apparatus 10 of the first embodiment and in the charged particle beam drawing apparatus as described in Japanese Unexamined Patent Publication No. 2007-324229, limit area Aa shown in FIG. 9A is where the charged particle beam 10a1b1 (see FIG. 7A) can be deflected by the sub-deflector 10a1f (see FIG. 1).

Figure 9B:
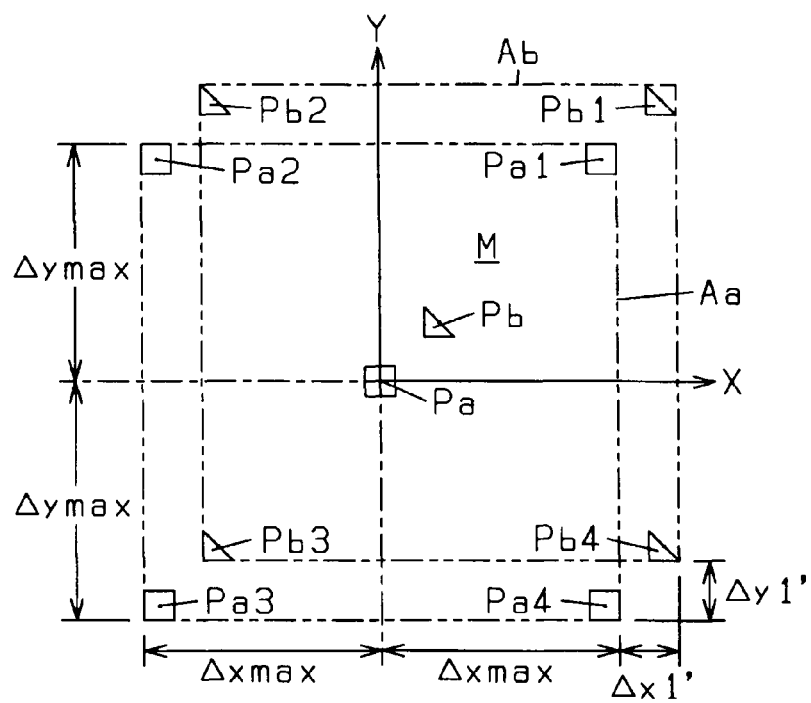

In the charged particle beam drawing apparatus 10 of the first embodiment and in the charged particle beam drawing apparatus as described in Japanese Unexamined Patent Publication No. 2007-324229, if the charge particle beam 10a1b2 (see FIG. 7A) having triangular horizontal sectional shape, passed through the opening 10a1m' (see FIG. 7A) of the second forming aperture member 10a1m (see FIG. 7A) is not deflected by the sub-deflector 10a1f (see FIG. 1), the triangular pattern Pb (see FIG. 9B) is drawn in a position shown in FIG. 9B on the workpiece M (see FIG. 9B) by the charged particle beam 10a1b2 (see FIG. 7A).

In the charged particle beam drawing apparatus 10 of the first embodiment and in the charged particle beam drawing apparatus as described in Japanese Unexamined Patent Publication No. 2007-324229, if the charge particle beam 10a1b2 (see FIG. 7A) having triangular horizontal sectional shape, passed through the opening 10a1m' (see FIG. 7A) of the second forming aperture member 10a1m (see FIG. 7A) is maximally deflected to plus side (right side of FIG. 9B) of X axis and is maximally deflected to plus side (upper side of FIG. 9B) of Y axis by the sub-deflector 10a1f (see FIG. 1) without a distortion of a pattern Pb1 (see FIG. 9B), deflecting amount to plus side (right side of FIG. 9B) of X axis is Δxmax (see FIG. 9B), and deflecting amount to plus side (upper side of FIG. 9B) of Y axis is Δymax (see FIG. 9B), the triangular pattern Pb1 (see FIG. 9B) is drawn in a position shown in FIG. 9B on the workpiece M (see FIG. 9B) by the charged particle beam 10a1b2 (see FIG. 7A).

In the charged particle beam drawing apparatus 10 of the first embodiment and in the charged particle beam drawing apparatus as described in Japanese Unexamined Patent Publication No. 2007-324229, if the charge particle beam 10a1b2 (see FIG. 7A) having triangular horizontal sectional shape, passed through the opening 10a1m' (see FIG. 7A) of the second forming aperture member 10a1m (see FIG. 7A) is maximally deflected to minus side (left side of FIG. 9B) of X axis and is maximally deflected to plus side (upper side of FIG. 9B) of Y axis by the sub-deflector 10a1f (see FIG. 1) without a distortion of a pattern Pb2 (see FIG. 9B), deflecting amount to minus side (left side of FIG. 9B) of X axis is Δxmax (see FIG. 9B), and deflecting amount to plus side (upper side of FIG. 9B) of Y axis is Δymax (see FIG. 9B), the triangular pattern Pb2 (see FIG. 9B) is drawn in a position shown in FIG. 9B on the workpiece M (see FIG. 9B) by the charged particle beam 10a1b2 (see FIG. 7A).

In the charged particle beam drawing apparatus 10 of the first embodiment and in the charged particle beam drawing apparatus as described in Japanese Unexamined Patent Publication No. 2007-324229, if the charge particle beam 10a1b2 (see FIG. 7A) having triangular horizontal sectional shape, passed through the opening 10a1m' (see FIG. 7A) of the second forming aperture member 10a1m (see FIG. 7A) is maximally deflected to minus side (left side of FIG. 9B) of X axis and is maximally deflected to minus side (lower side of FIG. 9B) of Y axis by the sub-deflector 10a1f (see FIG. 1) without a distortion of a pattern Pb3 (see FIG. 9B), deflecting amount to minus side (left side of FIG. 9B) of X axis is Δxmax (see FIG. 9B), and deflecting amount to minus side (lower side of FIG. 9B) of Y axis is Δymax (see FIG. 9B), the triangular pattern Pb3 (see FIG. 9B) is drawn in a position shown in FIG. 9B on the workpiece M (see FIG. 9B) by the charged particle beam 10a1b2 (see FIG. 7A).

In the charged particle beam drawing apparatus 10 of the first embodiment and in the charged particle beam drawing apparatus as described in Japanese Unexamined Patent Publication No. 2007-324229, if the charge particle beam 10a1b2 (see FIG. 7A) having triangular horizontal sectional shape, passed through the opening 10a1m' (see FIG. 7A) of the second forming aperture member 10a1m (see FIG. 7A) is maximally deflected to plus side (right side of FIG. 9B) of X axis and is maximally deflected to minus side (lower side of FIG. 9B) of Y axis by the sub-deflector 10a1f (see FIG. 1) without a distortion of a pattern Pb4 (see FIG. 9B), deflecting amount to plus side (right side of FIG. 9B) of X axis is Δxmax (see FIG. 9B), and deflecting amount to minus side (lower side of FIG. 9B) of Y axis is Δymax (see FIG. 9B), the triangular pattern Pb4 (see FIG. 9B) is drawn in a position shown in FIG. 9B on the workpiece M (see FIG. 9B) by the charged particle beam 10a1b2 (see FIG. 7A).

In other words, in the charged particle beam drawing apparatus 10 of the first embodiment and in the charged particle beam drawing apparatus as described in Japanese Unexamined Patent Publication No. 2007-324229, limit area Ab shown in FIG. 9B is where the charged particle beam 10a1b2 (see FIG. 7A) can be deflected by the sub-deflector 10a1f (see FIG. 1).

In the offset process such as shown in FIG. 8A, the offset process being performed by the charged particle beam drawing apparatus as described in Japanese Unexamined Patent Publication No. 2007-324229, the pattern Pb (see FIG. 9B) can be moved to a position in which the pattern Pa (see FIG. 9B) is placed, the pattern Pb1 (see FIG. 9B) can be moved to a position in which the pattern Pa1 (see FIG. 9B) is placed, the pattern Pb2 (see FIG. 9B) cannot be moved to a position in which the pattern Pa2 (see FIG. 9B) is placed, the pattern Pb3 (see FIG. 9B) cannot be moved to a position in which the pattern Pa3 (see FIG. 9B) is placed, the pattern Pb4 (see FIG. 9B) cannot be moved to a position in which the pattern Pa4 (see FIG. 9B) is placed.

Figure 10A:
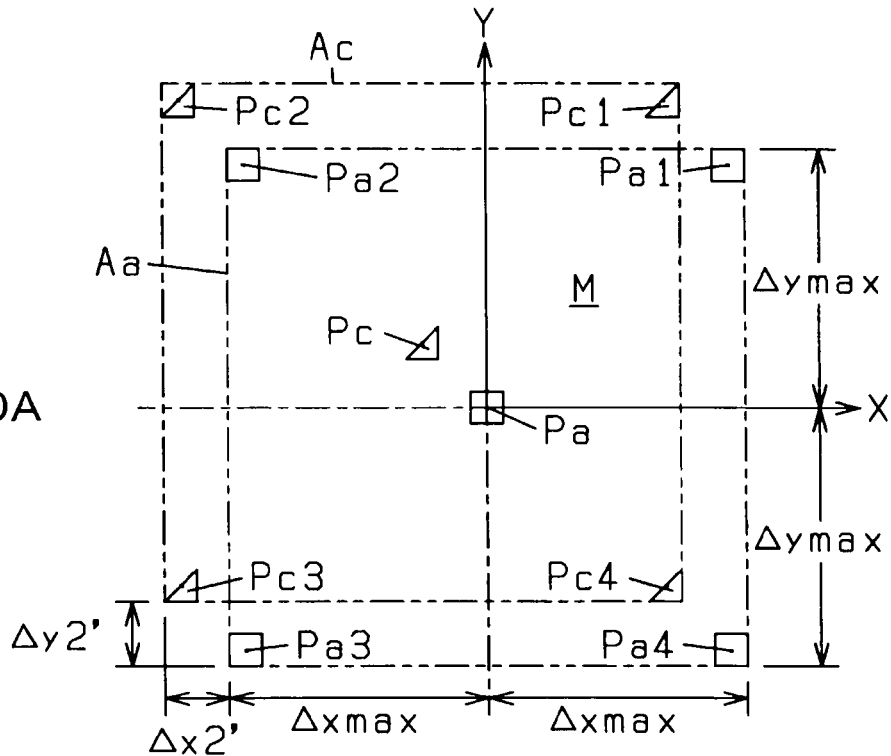
FIGS. 10A and 10B explain limit area Aa, Ac, Ad where the charged particle beam 10a1b can be deflected by the sub-deflector 10a1f.

In the charged particle beam drawing apparatus 10 of the first embodiment and in the charged particle beam drawing apparatus as described in Japanese Unexamined Patent Publication No. 2007-324229, if the charge particle beam 10a1b3 (see FIG. 7A) having triangular horizontal sectional shape, passed through the opening 10a1m' (see FIG. 7A) of the second forming aperture member 10a1m (see FIG. 7A) is not deflected by the sub-deflector 10a1f (see FIG. 1), the triangular pattern Pc (see FIG. 10A) is drawn in a position shown in FIG. 10A on the workpiece M (see FIG. 10A) by the charged particle beam 10a1b3 (see FIG. 7A).

In the charged particle beam drawing apparatus 10 of the first embodiment and in the charged particle beam drawing apparatus as described in Japanese Unexamined Patent Publication No. 2007-324229, if the charge particle beam 10a1b3 (see FIG. 7A) having triangular horizontal sectional shape, passed through the opening 10a1m' (see FIG. 7A) of the second forming aperture member 10a1m (see FIG. 7A) is maximally deflected to plus side (right side of FIG. 10A) of X axis and is maximally deflected to plus side (upper side of FIG. 10A) of Y axis by the sub-deflector 10a1f (see FIG. 1) without a distortion of a pattern Pc' (see FIG. 10A), deflecting amount to plus side (right side of FIG. 10A) of X axis is Δxmax (see FIG. 10A), and deflecting amount to plus side (upper side of FIG. 10A) of Y axis is Δymax (see FIG. 10A), the triangular pattern Pc1 (see FIG. 10A) is drawn in a position shown in FIG. 10A on the workpiece M (see FIG. 10A) by the charged particle beam 10a1b3 (see FIG. 7A).

In the charged particle beam drawing apparatus 10 of the first embodiment and in the charged particle beam drawing apparatus as described in Japanese Unexamined Patent Publication No. 2007-324229, if the charge particle beam 10a1b3

(see FIG. 7A) having triangular horizontal sectional shape, passed through the opening 10a1m' (see FIG. 7A) of the second forming aperture member 10a1m (see FIG. 7A) is maximally deflected to minus side (left side of FIG. 10A) of X axis and is maximally deflected to plus side (upper side of FIG. 10A) of Y axis by the sub-deflector 10a1f (see FIG. 1) without a distortion of a pattern Pc2 (see FIG. 10A), deflecting amount to minus side (left side of FIG. 10A) of X axis is Δxmax (see FIG. 10A), and deflecting amount to plus side (upper side of FIG. 10A) of Y axis is Δymax (see FIG. 10A), the triangular pattern Pc2 (see FIG. 10A) is drawn in a position shown in FIG. 10A on the workpiece M (see FIG. 10A) by the charged particle beam 10a1b3 (see FIG. 7A).

In the charged particle beam drawing apparatus 10 of the first embodiment and in the charged particle beam drawing apparatus as described in Japanese Unexamined Patent Publication No. 2007-324229, if the charge particle beam 10a1b3 (see FIG. 7A) having triangular horizontal sectional shape, passed through the opening 10a1m' (see FIG. 7A) of the second forming aperture member 10a1m (see FIG. 7A) is maximally deflected to minus side (left side of FIG. 10A) of X axis and is maximally deflected to minus side (lower side of FIG. 10A) of Y axis by the sub-deflector 10a1f (see FIG. 1) without a distortion of a pattern Pc3 (see FIG. 10A), deflecting amount to minus side (left side of FIG. 10A) of X axis is Δxmax (see FIG. 10A), and deflecting amount to minus side (lower side of FIG. 10A) of Y axis is Δymax (see FIG. 10A), the triangular pattern Pc3 (see FIG. 10A) is drawn in a position shown in FIG. 10A on the workpiece M (see FIG. 10A) by the charged particle beam 10a1b3 (see FIG. 7A).

In the charged particle beam drawing apparatus 10 of the first embodiment and in the charged particle beam drawing apparatus as described in Japanese Unexamined Patent Publication No. 2007-324229, if the charge particle beam 10a1b3 (see FIG. 7A) having triangular horizontal sectional shape, passed through the opening 10a1m' (see FIG. 7A) of the second forming aperture member 10a1m (see FIG. 7A) is maximally deflected to plus side (right side of FIG. 10A) of X axis and is maximally deflected to minus side (lower side of FIG. 10A) of Y axis by the sub-deflector 10a1f (see FIG. 1) without a distortion of a pattern Pc4 (see FIG. 10A), deflecting amount to plus side (right side of FIG. 10A) of X axis is Δxmax (see FIG. 10A), and deflecting amount to minus side (lower side of FIG. 10A) of Y axis is Δymax (see FIG. 10A), the triangular pattern Pc4 (see FIG. 10A) is drawn in a position shown in FIG. 10A on the workpiece M (see FIG. 10A) by the charged particle beam 10a1b3 (see FIG. 7A).

In other words, in the charged particle beam drawing apparatus 10 of the first embodiment and in the charged particle beam drawing apparatus as described in Japanese Unexamined Patent Publication No. 2007-324229, limit area Ac shown in FIG. 10A is where the charged particle beam 10a1b3 (see FIG. 7A) can be deflected by the sub-deflector 10a1f (see FIG. 1).

In the offset process such as shown in FIG. 8B, the offset process being performed by the charged particle beam drawing apparatus as described in Japanese Unexamined Patent Publication No. 2007-324229, the pattern Pc (see FIG. 10A) can be moved to a position in which the pattern Pa (see FIG. 10A) is placed, the pattern Pc2 (see FIG. 10A) can be moved to a position in which the pattern Pa2 (see FIG. 10A) is placed, the pattern Pc' (see FIG. 10A) cannot be moved to a position in which the pattern Pa1 (see FIG. 10A) is placed, the pattern Pc3 (see FIG. 10A) cannot be moved to a position in which the pattern Pa3 (see FIG. 10A) is placed, the pattern Pc4 (see FIG. 10A) cannot be moved to a position in which the pattern Pa4 (see FIG. 10A) is placed.

Figure 10B:
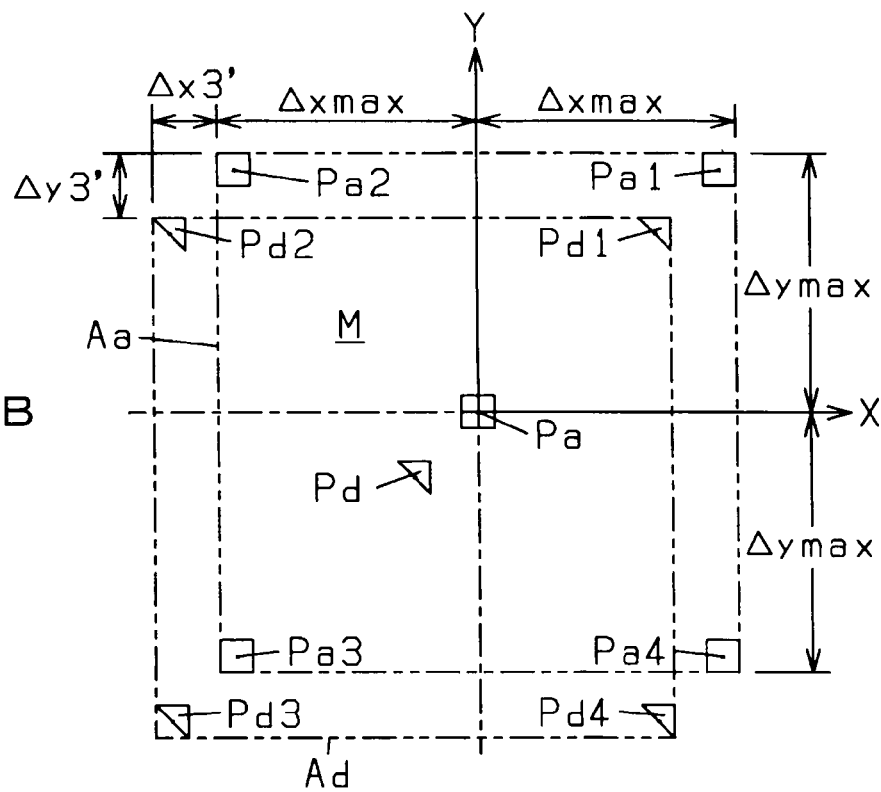

In the charged particle beam drawing apparatus 10 of the first embodiment and in the charged particle beam drawing apparatus as described in Japanese Unexamined Patent Publication No. 2007-324229, if the charge particle beam 10a1b4 (see FIG. 7A) having triangular horizontal sectional shape, passed through the opening 10a1m' (see FIG. 7A) of the second forming aperture member 10a1m (see FIG. 7A) is not deflected by the sub-deflector 10a1f (see FIG. 1), the triangular pattern Pd (see FIG. 10B) is drawn in a position shown in FIG. 10B on the workpiece M (see FIG. 10B) by the charged particle beam 10a1b4 (see FIG. 7A).

In the charged particle beam drawing apparatus 10 of the first embodiment and in the charged particle beam drawing apparatus as described in Japanese Unexamined Patent Publication No. 2007-324229, if the charge particle beam 10a1b4 (see FIG. 7A) having triangular horizontal sectional shape, passed through the opening 10a1m' (see FIG. 7A) of the second forming aperture member 10a1m (see FIG. 7A) is maximally deflected to plus side (right side of FIG. 10B) of X axis and is maximally deflected to plus side (upper side of FIG. 10B) of Y axis by the sub-deflector 10a1f (see FIG. 1) without a distortion of a pattern Pd1 (see FIG. 10B), deflecting amount to plus side (right side of FIG. 10B) of X axis is Δxmax (see FIG. 10B), and deflecting amount to plus side (upper side of FIG. 10B) of Y axis is Δymax (see FIG. 10B), the triangular pattern Pd1 (see FIG. 10B) is drawn in a position shown in FIG. 10B on the workpiece M (see FIG. 10B) by the charged particle beam 10a1b4 (see FIG. 7A).

In the charged particle beam drawing apparatus 10 of the first embodiment and in the charged particle beam drawing apparatus as described in Japanese Unexamined Patent Publication No. 2007-324229, if the charge particle beam 10a1b4 (see FIG. 7A) having triangular horizontal sectional shape, passed through the opening 10a1m' (see FIG. 7A) of the second forming aperture member 10a1m (see FIG. 7A) is maximally deflected to minus side (left side of FIG. 10B) of X axis and is maximally deflected to plus side (upper side of FIG. 10B) of Y axis by the sub-deflector 10a1f (see FIG. 1) without a distortion of a pattern Pd2 (see FIG. 10B), deflecting amount to minus side (left side of FIG. 10B) of X axis is Δxmax (see FIG. 10B), and deflecting amount to plus side (upper side of FIG. 10B) of Y axis is Δymax (see FIG. 10B), the triangular pattern Pd2 (see FIG. 10B) is drawn in a position shown in FIG. 10B on the workpiece M (see FIG. 10B) by the charged particle beam 10a1b4 (see FIG. 7A).

In the charged particle beam drawing apparatus 10 of the first embodiment and in the charged particle beam drawing apparatus as described in Japanese Unexamined Patent Publication No. 2007-324229, if the charge particle beam 10a1b4 (see FIG. 7A) having triangular horizontal sectional shape, passed through the opening 10a1m' (see FIG. 7A) of the second forming aperture member 10a1m (see FIG. 7A) is maximally deflected to minus side (left side of FIG. 10B) of X axis and is maximally deflected to minus side (lower side of FIG. 10B) of Y axis by the sub-deflector 10a1f (see FIG. 1) without a distortion of a pattern Pd3 (see FIG. 10B), deflecting amount to minus side (left side of FIG. 10B) of X axis is Δxmax (see FIG. 10B), and deflecting amount to minus side (lower side of FIG. 10B) of Y axis is Δymax (see FIG. 10B), the triangular pattern Pd3 (see FIG. 10B) is drawn in a position shown in FIG. 10B on the workpiece M (see FIG. 10B) by the charged particle beam 10a1b4 (see FIG. 7A).

In the charged particle beam drawing apparatus 10 of the first embodiment and in the charged particle beam drawing apparatus as described in Japanese Unexamined Patent Publication No. 2007-324229, if the charge particle beam 10a1b4 (see FIG. 7A) having triangular horizontal sectional shape, passed through the opening 10a1m' (see FIG. 7A) of the second forming aperture member 10a1m (see FIG. 7A) is maximally deflected to plus side (right side of FIG. 10B) of X axis and is maximally deflected to minus side (lower side of FIG. 10B) of Y axis by the sub-deflector 10a1f (see FIG. 1) without a distortion of a pattern Pd4 (see FIG. 10B), deflecting amount to plus side (right side of FIG. 10B) of X axis is Δxmax (see FIG. 10B), and deflecting amount to minus side (lower side of FIG. 10B) of Y axis is Δymax (see FIG. 10B), the triangular pattern Pd4 (see FIG. 10B) is drawn in a position shown in FIG. 10B on the workpiece M (see FIG. 10B) by the charged particle beam 10a1b4 (see FIG. 7A).

In other words, in the charged particle beam drawing apparatus 10 of the first embodiment and in the charged particle beam drawing apparatus as described in Japanese Unexamined Patent Publication No. 2007-324229, limit area Ad shown in FIG. 10B is where the charged particle beam 10a1b4 (see FIG. 7A) can be deflected by the sub-deflector 10a1f (see FIG. 1).

In the offset process such as shown in FIG. 8C, the offset process being performed by the charged particle beam drawing apparatus as described in Japanese Unexamined Patent Publication No. 2007-324229, the pattern Pd (see FIG. 10B) can be moved to a position in which the pattern Pa (see FIG. 10B) is placed, the pattern Pd3 (see FIG. 10B) can be moved to a position in which the pattern Pa3 (see FIG. 10B) is placed, the pattern Pd1 (see FIG. 10B) cannot be moved to a position in which the pattern Pa1 (see FIG. 10B) is placed, the pattern Pd2 (see FIG. 10B) cannot be moved to a position in which the pattern Pa2 (see FIG. 10B) is placed, the pattern Pd4 (see FIG. 10B) cannot be moved to a position in which the pattern Pa4 (see FIG. 10B) is placed.

Figure 11A:
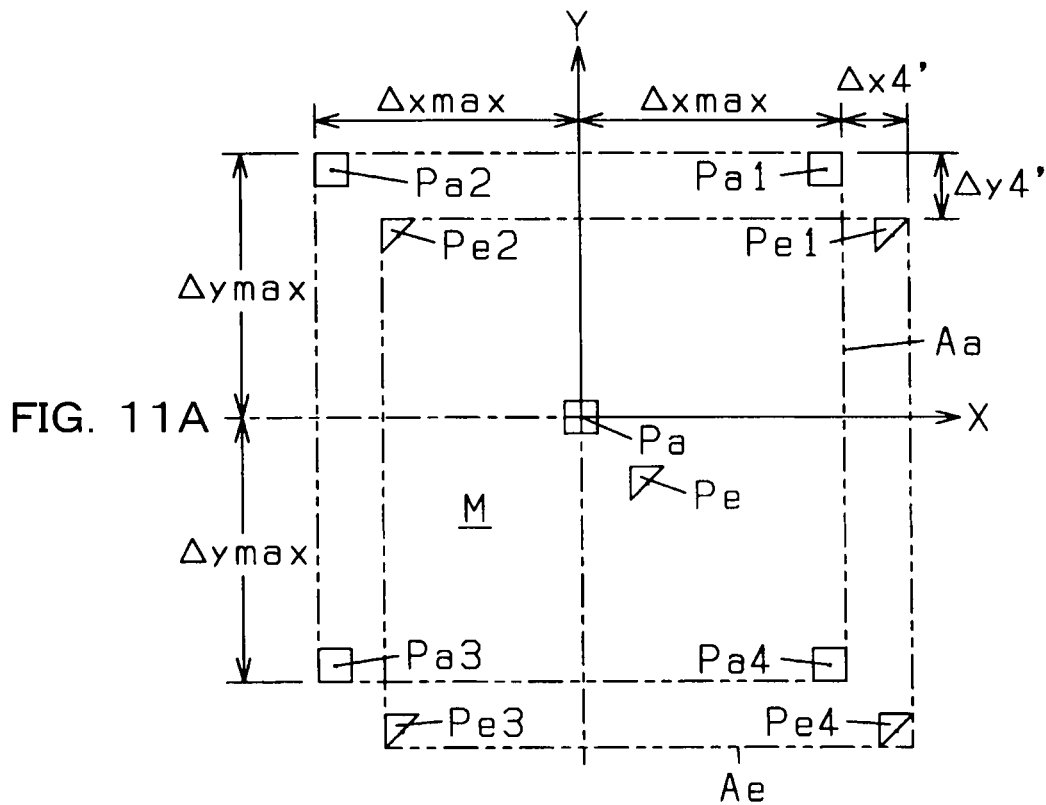
FIGS. 11A and 11B explain limit area Aa, Ae where the charged particle beam 10a1b can be deflected by the sub-deflector 10a1f.

In the charged particle beam drawing apparatus 10 of the first embodiment and in the charged particle beam drawing apparatus as described in Japanese Unexamined Patent Publication No. 2007-324229, if the charge particle beam 10a1b5 (see FIG. 7A) having triangular horizontal sectional shape, passed through the opening 10a1m' (see FIG. 7A) of the second forming aperture member 10a1m (see FIG. 7A) is not deflected by the sub-deflector 10a1f (see FIG. 1), the triangular pattern Pe (see FIG. 11A) is drawn in a position shown in FIG. 11A on the workpiece M (see FIG. 11A) by the charged particle beam 10a1b5 (see FIG. 7A).

In the charged particle beam drawing apparatus 10 of the first embodiment and in the charged particle beam drawing apparatus as described in Japanese Unexamined Patent Publication No. 2007-324229, if the charge particle beam 10a1b5 (see FIG. 7A) having triangular horizontal sectional shape, passed through the opening 10a1m' (see FIG. 7A) of the second forming aperture member 10a1m (see FIG. 7A) is maximally deflected to plus side (right side of FIG. 11A) of X axis and is maximally deflected to plus side (upper side of FIG. 11A) of Y axis by the sub-deflector 10a1f (see FIG. 1) without a distortion of a pattern Pe1 (see FIG. 11A), deflecting amount to plus side (right side of FIG. 11A) of X axis is Δxmax (see FIG. 11A), and deflecting amount to plus side (upper side of FIG. 11A) of Y axis is Δymax (see FIG. 11A), the triangular pattern Pe1 (see FIG. 11A) is drawn in a position shown in FIG. 11A on the workpiece M (see FIG. 11A) by the charged particle beam 10a1b5 (see FIG. 7A).

In the charged particle beam drawing apparatus 10 of the first embodiment and in the charged particle beam drawing apparatus as described in Japanese Unexamined Patent Publication No. 2007-324229, if the charge particle beam 10a1b5 (see FIG. 7A) having triangular horizontal sectional shape, passed through the opening 10a1m' (see FIG. 7A) of the second forming aperture member 10a1m (see FIG. 7A) is maximally deflected to minus side (left side of FIG. 11A) of X axis and is maximally deflected to plus side (upper side of FIG. 11A) of Y axis by the sub-deflector 10a1f (see FIG. 1) without a distortion of a pattern Pe2 (see FIG. 11A), deflecting amount to minus side (left side of FIG. 11A) of X axis is Δxmax (see FIG. 11A), and deflecting amount to plus side (upper side of FIG. 11A) of Y axis is Δymax (see FIG. 11A), the triangular pattern Pe2 (see FIG. 11A) is drawn in a position shown in FIG. 11A on the workpiece M (see FIG. 11A) by the charged particle beam 10a1b5 (see FIG. 7A).

In the charged particle beam drawing apparatus 10 of the first embodiment and in the charged particle beam drawing apparatus as described in Japanese Unexamined Patent Publication No. 2007-324229, if the charge particle beam 10a1b5 (see FIG. 7A) having triangular horizontal sectional shape, passed through the opening 10a1m' (see FIG. 7A) of the second forming aperture member 10a1m (see FIG. 7A) is maximally deflected to minus side (left side of FIG. 11A) of X axis and is maximally deflected to minus side (lower side of FIG. 11A) of Y axis by the sub-deflector 10a1f (see FIG. 1) without a distortion of a pattern Pe3 (see FIG. 11A), deflecting amount to minus side (left side of FIG. 11A) of X axis is Δxmax (see FIG. 11A), and deflecting amount to minus side (lower side of FIG. 11A) of Y axis is Δymax (see FIG. 11A), the triangular pattern Pe3 (see FIG. 11A) is drawn in a position shown in FIG. 11A on the workpiece M (see FIG. 11A) by the charged particle beam 10a1b5 (see FIG. 7A).

In the charged particle beam drawing apparatus 10 of the first embodiment and in the charged particle beam drawing apparatus as described in Japanese Unexamined Patent Publication No. 2007-324229, if the charge particle beam 10a1b5 (see FIG. 7A) having triangular horizontal sectional shape, passed through the opening 10a1m' (see FIG. 7A) of the second forming aperture member 10a1m (see FIG. 7A) is maximally deflected to plus side (right side of FIG. 11A) of X axis and is maximally deflected to minus side (lower side of FIG. 11A) of Y axis by the sub-deflector 10a1f (see FIG. 1) without a distortion of a pattern Pe4 (see FIG. 11A), deflecting amount to plus side (right side of FIG. 11A) of X axis is Δxmax (see FIG. 11A), and deflecting amount to minus side (lower side of FIG. 11A) of Y axis is Δymax (see FIG. 11A), the triangular pattern Pe4 (see FIG. 11A) is drawn in a position shown in FIG. 11A on the workpiece M (see FIG. 11A) by the charged particle beam 10a1b5 (see FIG. 7A).

In other words, in the charged particle beam drawing apparatus 10 of the first embodiment and in the charged particle beam drawing apparatus as described in Japanese Unexamined Patent Publication No. 2007-324229, limit area Ae shown in FIG. 11A is where the charged particle beam 10a1b5 (see FIG. 7A) can be deflected by the sub-deflector 10a1f (see FIG. 1).

In the offset process such as shown in FIG. 8D, the offset process being performed by the charged particle beam drawing apparatus as described in Japanese Unexamined Patent Publication No. 2007-324229, the pattern Pe (see FIG. 11A) can be moved to a position in which the pattern Pa (see FIG. 11A) is placed, the pattern Pe4 (see FIG. 11A) can be moved to a position in which the pattern Pa4 (see FIG. 11A) is placed, the pattern Pe1 (see FIG. 11A) cannot be moved to a position in which the pattern Pa1 (see FIG. 11A) is placed, the pattern Pe2 (see FIG. 11A) cannot be moved to a position in which the pattern Pa2 (see FIG. 11A) is placed, the pattern Pe3 (see FIG. 11A) cannot be moved to a position in which the pattern Pa3 (see FIG. 11A) is placed.

Figure 11B:
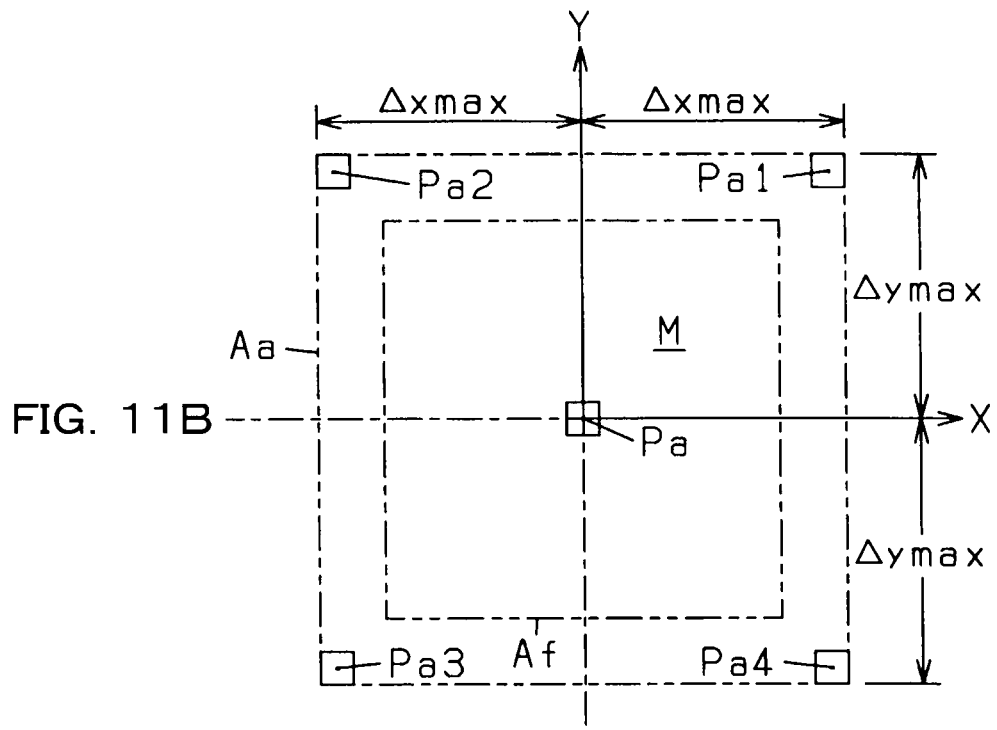

Therefore, in the charged particle beam drawing apparatus as described in Japanese Unexamined Patent Publication No. 2007-324229, size of subfield SFn, SFn+1 (see FIG. 5) is not decided on the basis of size of area Aa (see FIG. 11B), but size of subfield SFn, SFn+1 (see FIG. 5) is decided on the basis of size of area Af (see FIG. 11B) which is smaller than size of area Aa (see FIG. 11B). In detail, area Af (see FIG. 11B) is an overlapping area of area Aa (see FIG. 11B), area Ab (see FIG. 9B), area Ac (see FIG. 10A), area Ad (see FIG. 10B) and area Ae (see FIG. 11A).

In other words, in the charged particle beam drawing apparatus as described in Japanese Unexamined Patent Publication No. 2007-324229, performing the offset process such as shown in FIGS. 8A, 8B, 8C and 8D, size of subfield SFn, SFn+1 (see FIG. 5) is not decided on the basis of size of area Aa (see FIG. 11B), in which the charged particle beam $10a1b1$ (see FIG. 7A) can be maximally deflected by the sub-deflector $10a1f$ (see FIG. 1), but size of subfield SFn, SFn+1 (see FIG. 5) is decided on the basis of size of area Af (see FIG. 11B) which is smaller than size of area Aa (see FIG. 11B).

Accordingly, in the charged particle beam drawing apparatus as described in Japanese Unexamined Patent Publication No. 2007-324229, the number of subfield SFn, SFn+1 (see FIG. 5) included in stripes STR1, STR2 and STR3 (see FIG. 4) increases, in accordance with decrease of size of subfield SFn, SFn+1 (see FIG. 5). Consequently, in the charged particle beam drawing apparatus as described in Japanese Unexamined Patent Publication No. 2007-324229, the number of settling of the main deflector $10a1e$ (see FIG. 1) increases when patterns are drawn on the workpiece M (see FIG. 1) by the charged particle beam $10a1b$ (see FIG. 1), therefore, it is impossible for the charged particle beam drawing apparatus as described in Japanese Unexamined Patent Publication No. 2007-324229 to increase a throughput sufficiently.

In the charged particle beam drawing apparatus 10 of the first embodiment of the present invention, size of subfield SFn, SFn+1 (see FIG. 5) is decided on the basis of size of area Aa (see FIG. 11B), although size of subfield SFn, SFn+1 (see FIG. 5) is decided on the basis of size of area Af (see FIG. 11B) in the charged particle beam drawing apparatus as described in Japanese Unexamined Patent Publication No. 2007-324229.

Figure 12A:
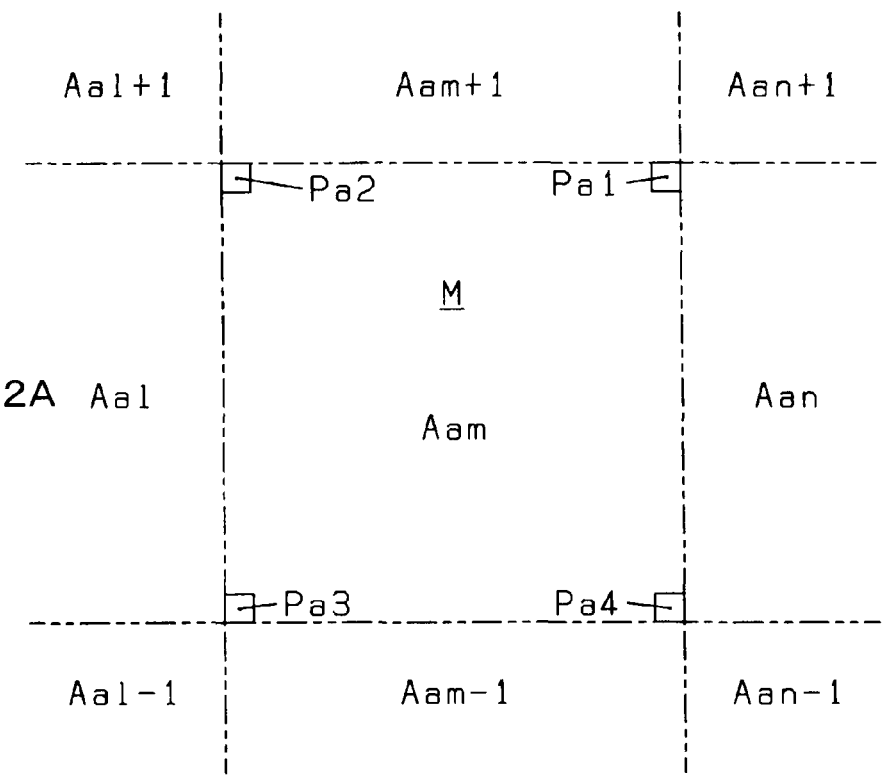
FIGS. 12A and 12B show patterns Pa1, Pa2, Pa3, Pa4 respectively corresponding to figures FGa1, FGa2, FGa3, FGa4, drawn at 4 corners in a limit area Aam in the charged particle beam drawing apparatus 10 of the first embodiment.
Figure 12B:
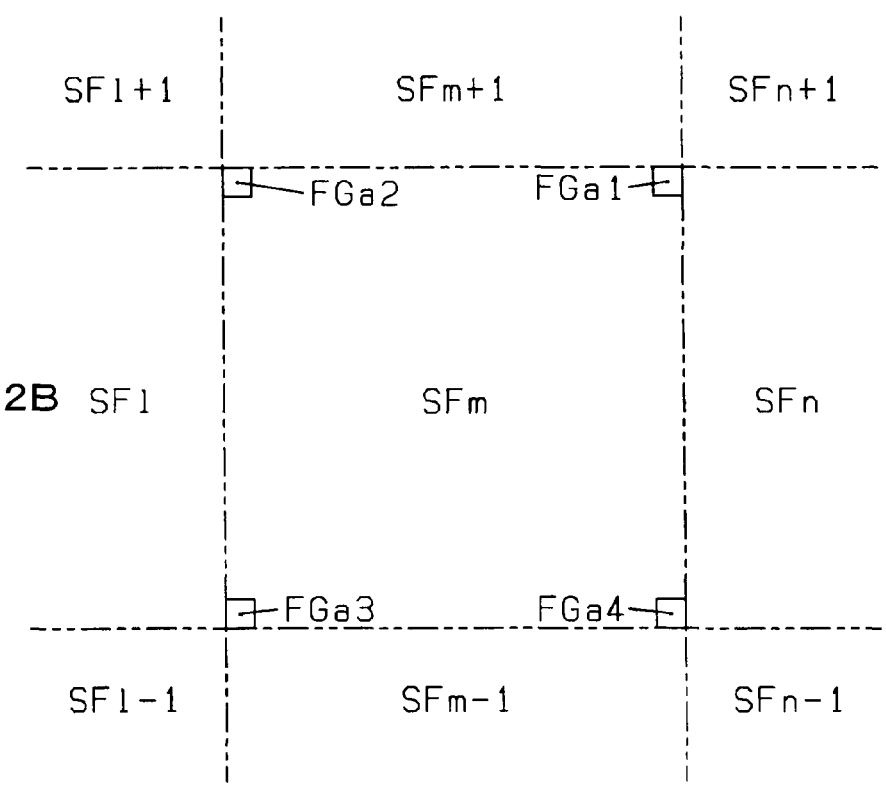
Figure 13A:
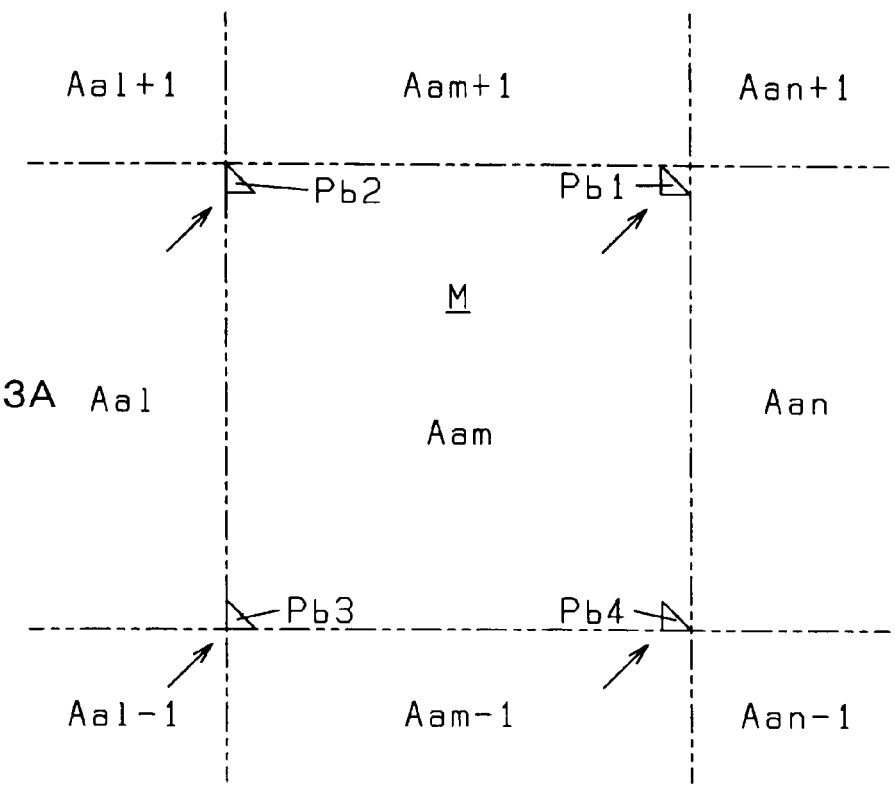
FIGS. 13A and 13B show cancel of position difference $\Delta x1'$ in X direction and position difference $\Delta y1'$ in Y direction of patterns Pb1, Pb2, Pb3, Pb4 respectively corresponding to figures FGb1, FGb2, FGb3, FGb4, performed by the charged particle beam drawing apparatus 10 of the first embodiment.
Figure 13B:
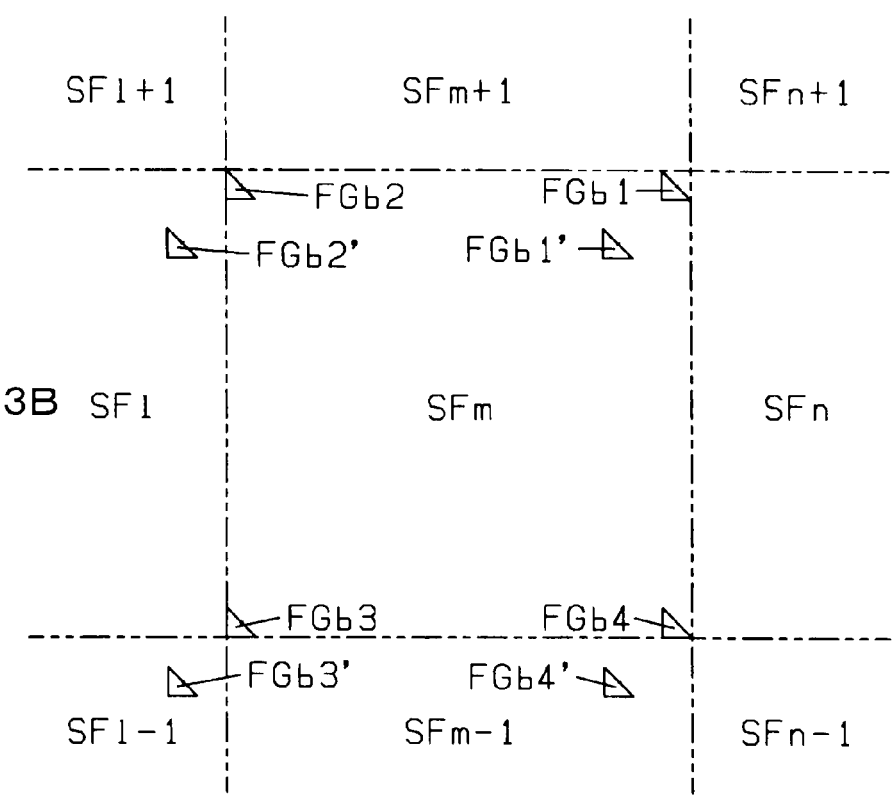
Figure 14A:
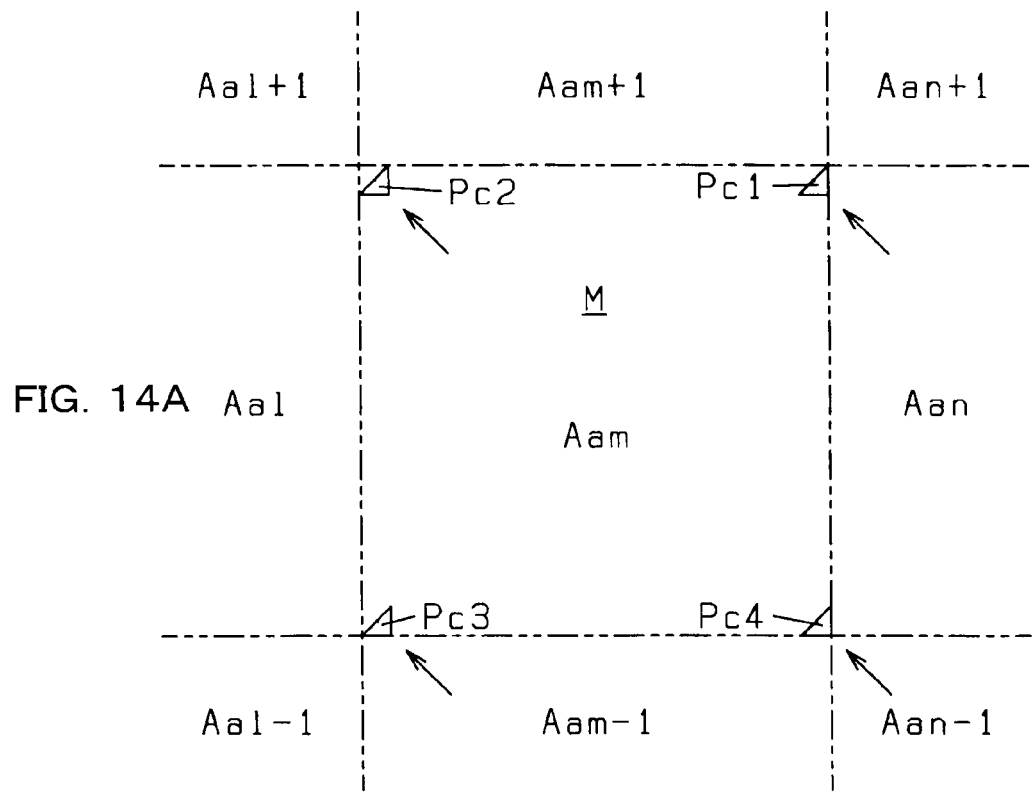
FIGS. 14A and 14B show cancel of position difference $\Delta x2'$ in X direction and position difference $\Delta y2'$ in Y direction of patterns Pc1, Pc2, Pc3, Pc4 respectively corresponding to figures FGc1, FGc2, FGc3, FGc4, performed by the charged particle beam drawing apparatus 10 of the first embodiment.
Figure 14B:
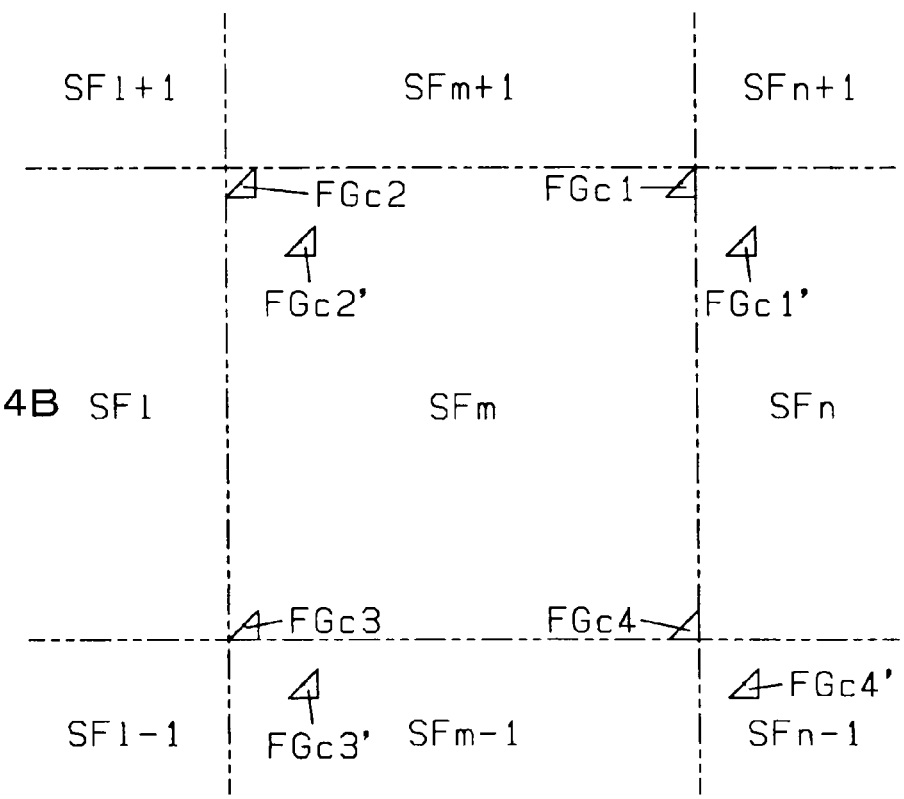
Figure 15A:
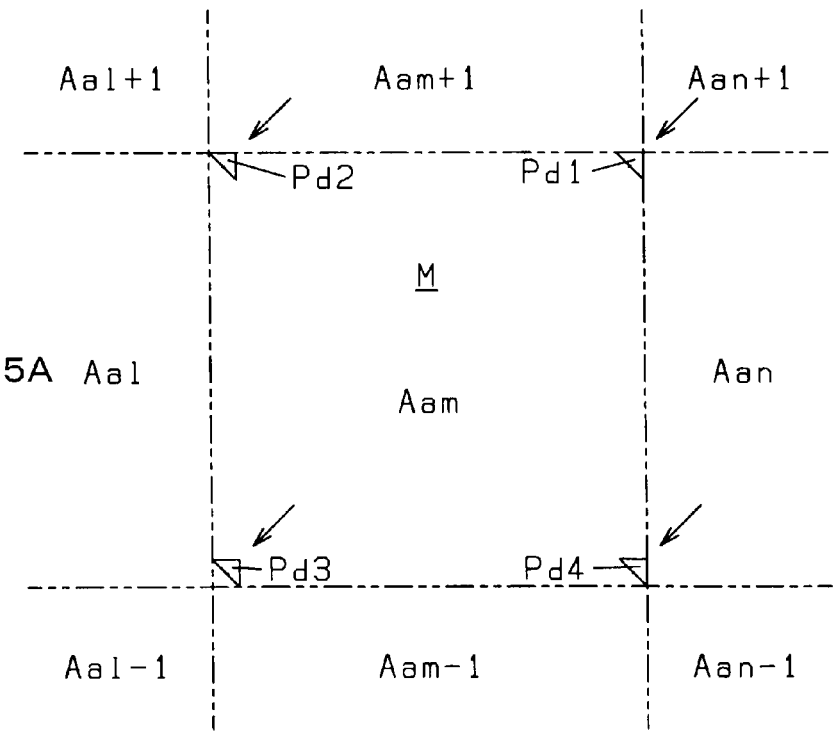
FIGS. 15A and 15B show cancel of position difference $\Delta x3'$ in X direction and position difference $\Delta y3'$ in Y direction of patterns Pd1, Pd2, Pd3, Pd4 respectively corresponding to figures FGd1, FGd2, FGd3, FGd4, performed by the charged particle beam drawing apparatus 10 of the first embodiment.
Figure 15B:
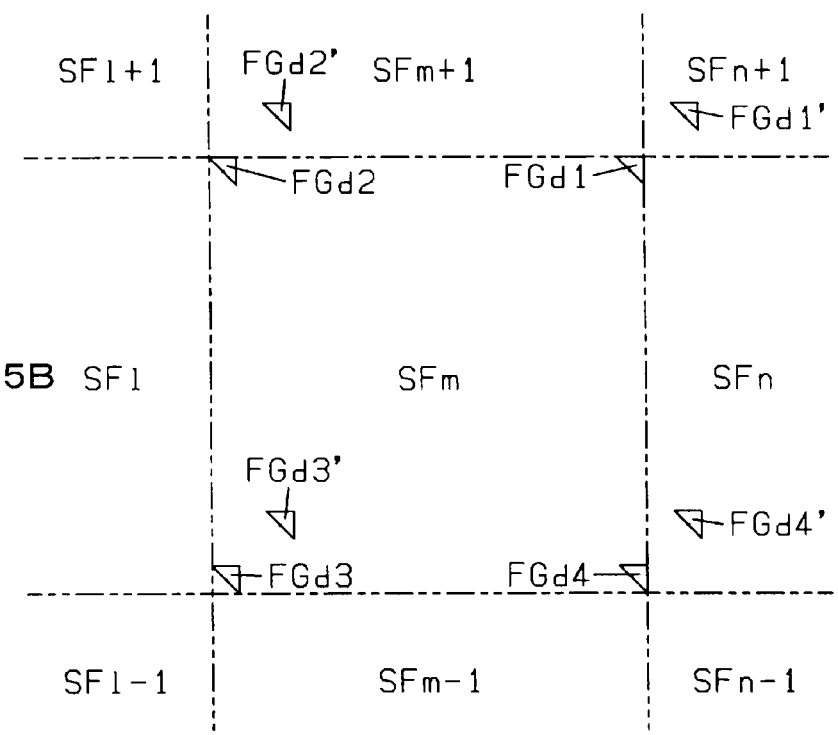
Figure 16A:
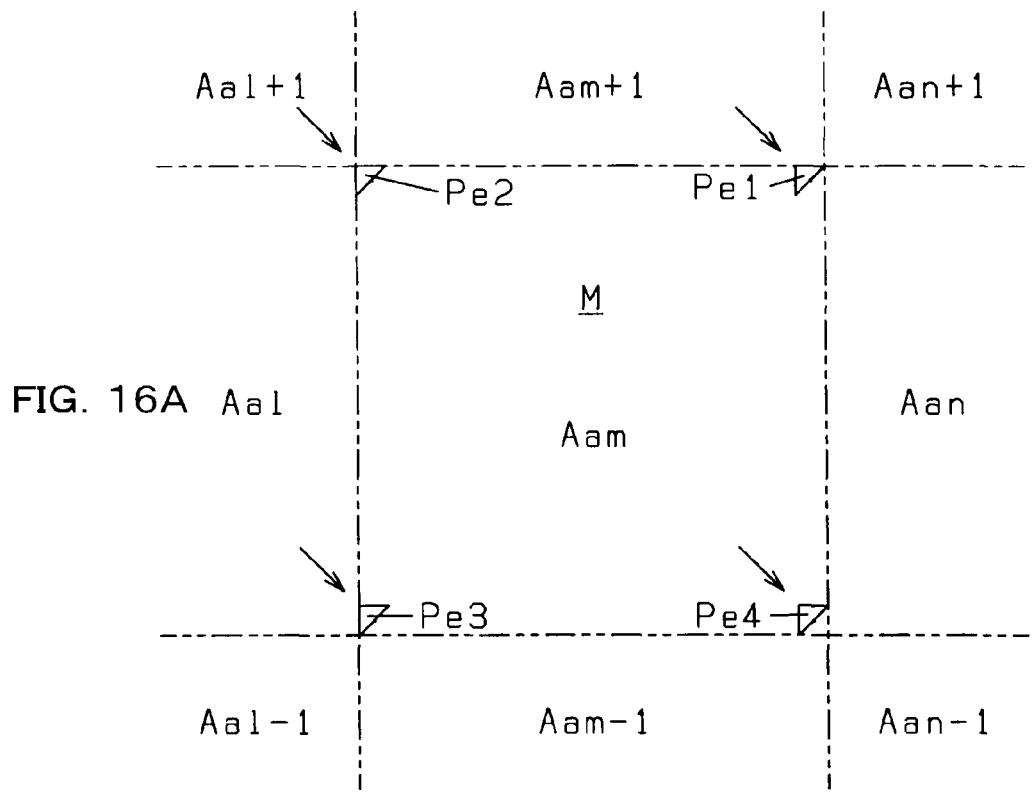
FIGS. 16A and 16B show cancel of position difference $\Delta x4'$ in X direction and position difference $\Delta y4'$ in Y direction of patterns Pe1, Pe2, Pe3, Pe4 respectively corresponding to figures FGe1, FGe2, FGe3, FGe4, performed by the charged particle beam drawing apparatus 10 of the first embodiment.
Figure 16B:
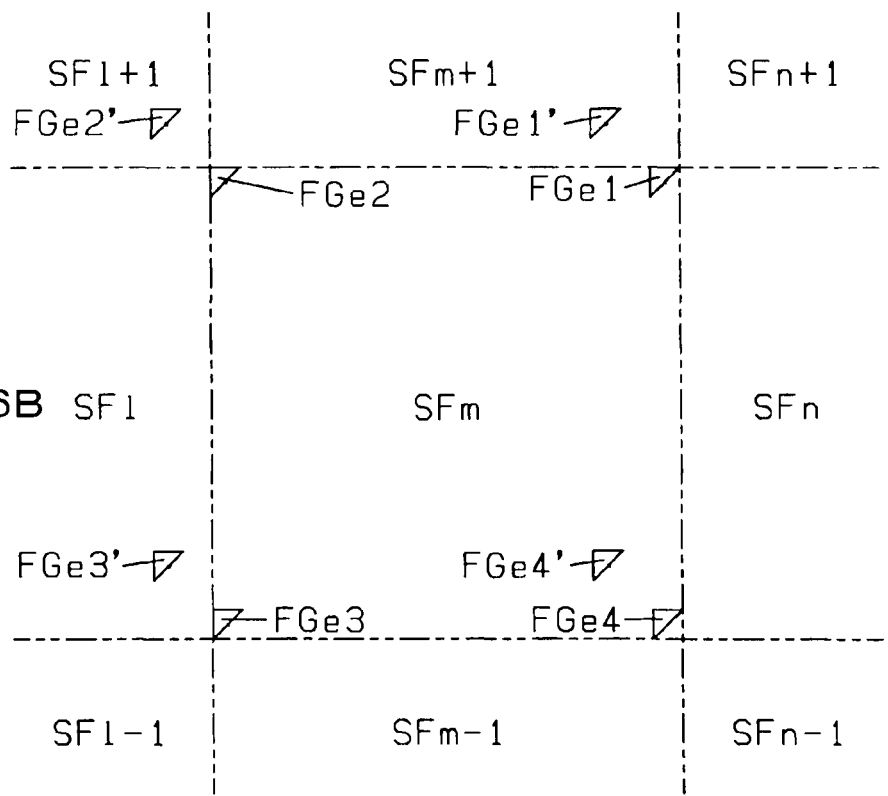

FIGS. 12A and 12B show patterns Pa1, Pa2, Pa3, Pa4 respectively corresponding to figures FGa1, FGa2, FGa3, FGa4, drawn at 4 corners in a limit area Aam in the charged particle beam drawing apparatus 10 of the first embodiment. FIGS. 13A and 13B show cancel of position difference $\Delta x1'$ (see FIG. 7B) in X direction and position difference $\Delta y1'$ (see FIG. 7B) in Y direction of patterns Pb1, Pb2, Pb3, Pb4 respectively corresponding to figures FGb1, FGb2, FGb3, FGb4, performed by the charged particle beam drawing apparatus 10 of the first embodiment. FIGS. 14A and 14B show cancel of position difference $\Delta x2'$ (see FIG. 7B) in X direction and position difference $\Delta y2'$ (see FIG. 7B) in Y direction of patterns Pc1, Pc2, Pc3, Pc4 respectively corresponding to figures FGc1, FGc2, FGc3, FGc4, performed by the charged particle beam drawing apparatus 10 of the first embodiment. FIGS. 15A and 15B show cancel of position difference $\Delta x3'$ (see FIG. 7B) in X direction and position difference $\Delta y3'$ (see FIG. 7B) in Y direction of patterns Pd1, Pd2, Pd3, Pd4 respectively corresponding to figures FGd1, FGd2, FGd3, FGd4, performed by the charged particle beam drawing apparatus 10 of the first embodiment. FIGS. 16A and 16B show cancel of position difference $\Delta x4'$ (see FIG. 7B) in X direction and position difference $\Delta y4'$ (see FIG. 7B) in Y direction of patterns Pe1, Pe2, Pe3, Pe4 respectively corresponding to figures FGe1, FGe2, FGe3, FGe4, performed by the charged particle beam drawing apparatus 10 of the first embodiment.

In the charged particle beam drawing apparatus 10 of the first embodiment, a subfield SFm (see FIG. 12B) is formed in the drawing data D (see FIG. 1) by the control computer $10b1$ (see FIG. 1) of the control portion $10b$ (see FIG. 1), size of the subfield SFm corresponding to size of area Aam (see FIG. 12A) on the workpiece M (see FIG. 12A). Similarly, subfields SFl-1, SFl, SFl+1, SFm-1, SFm+1, SFn-1, SFn, SFn+1 (see FIG. 12B) are formed in the drawing data D (see FIG. 1) by the control computer $10b1$ (see FIG. 1) of the control portion $10b$ (see FIG. 1), size of the subfields SFl-1, SFl, SFl+1, SFm-1, SFm+1, SFn-1, SFn, SFn+1 respectively corresponding to size of area Aal-1, Aal, Aal+1, Aam-1, Aam+1, Aan-1, Aan, Aan+1 (see FIG. 12A) on the workpiece M (see FIG. 12A).

In an example shown in FIGS. 12A and 12b, patterns Pa1, Pa2, Pa3, Pa4 (see FIG. 12A) respectively corresponding to figures FGa1, FGa2, FGa3, FGa4 (see FIG. 12B) in the subfield SFm (see FIG. 12B) are drawn at 4 corners of limit area Aam (see FIG. 12A) on the workpiece M (see FIG. 12A) by the charged particle beam $10a1b1$ (see FIG. 7A) having square horizontal sectional shape, passed through the opening $10a1m'$ (see FIG. 7A) of the second forming aperture member $10a1m$ (see FIG. 7A).

As shown in FIGS. 7A and 7B, the pattern Pa (see FIG. 7B) drawn by the charged particle beam $10a1b1$ (see FIG. 7A) having square horizontal sectional shape, passed through the opening $10a1m'$ (see FIG. 7A) of the second forming aperture member $10a1m$ (see FIG. 7A) has no position difference. Therefore, in the example shown in FIGS. 12A and 12B, cancel process of position difference with respect to patterns Pa1, Pa2, Pa3, Pa4 (see FIG. 12A) drawn by the charged particle beam $10a1b1$ (see FIG. 7A) having square horizontal sectional shape, passed through the opening $10a1m'$ (see FIG. 7A) of the second forming aperture member $10a1m$ (see FIG. 7A), is not necessary. As mentioned above, in fact, when a rectangular (square or oblong) pattern is drawn, the charged particle beam $10a1b6$ (see FIG. 7A) passed through the left lower end portion of the left lower area $10a1m3'$ (see FIG. 7A) of the opening $10a1m'$ (see FIG. 7A) of the second forming aperture member $10a1m$ (see FIG. 7A) is used, therefore, cancel process of position difference is performed.

FIGS. 13A and 13B show an example wherein patterns Pb1, Pb2, Pb3, Pb4 are drawn at 4 corners in limit area Aam in the charged particle beam drawing apparatus 10 of the first embodiment.

As shown in FIGS. 7A and 7B, the pattern Pb (see FIG. 7B) drawn by the charged particle beam $10a1b2$ (see FIG. 7A) having triangular horizontal sectional shape, passed through the opening $10a1m'$ (see FIG. 7A) of the second forming aperture member $10a1m$ (see FIG. 7A) has position difference $\Delta x1'$ (see FIG. 7B) in X direction and position difference $\Delta y1'$ (see FIG. 7B) in Y direction. Therefore, in the example shown in FIGS. 13A and 13B, cancel process of position difference is performed with respect to patterns Pb1, Pb2, Pb3, Pb4 (see FIG. 13A) drawn by the charged particle beam $10a1b2$ (see FIG. 7A) having triangular horizontal sectional shape, passed through the opening $10a1m'$ (see FIG. 7A) of the second forming aperture member $10a1m$ (see FIG. 7A).

In detail, in the charged particle beam drawing apparatus 10 of the first embodiment, figures FGb1, FGb2, FGb3, FGb4 (see FIG. 13B) in subfield SFm (see FIG. 13B) is judged to correspond to the pattern Pb (see FIG. 7B) drawn by the charged particle beam $10a1b2$ (see FIG. 7A) having triangular horizontal sectional shape, passed through right upper area $10a1m1'$ (see FIG. 7A) of the opening $10a1m'$ (see FIG. 7A) of the second forming aperture member $10a1m$ (see FIG. 7A).

In the charged particle beam drawing apparatus 10 of the first embodiment, drawing data correcting process is performed to cancel position difference Δx1' (see FIG. 7B) in X direction and position difference Δy1' (see FIG. 7B) in Y direction, wherein the position difference Δx1' (see FIG. 7B) in X direction and the position difference Δy1' (see FIG. 7B) in Y direction occur when the pattern Pb (see FIG. 7B) is drawn. In detail, figures FGb1, FGb2, FGb3, FGb4 (see FIG. 13B) in the subfield SFm (see FIG. 13B) in the drawing data D (see FIG. 1) are moved to minus side (left side of FIG. 13B) of X axis and to minus side (lower side of FIG. 13B) of Y axis, wherein amount of movement to minus side (left side of FIG. 13B) of X axis corresponds to the position difference Δx1' (see FIG. 7B) in X direction, and amount of movement to minus side (lower side of FIG. 13B) of Y axis corresponds to the position difference Δy1' (see FIG. 7B) in Y direction. Consequently, figures FGb1', FGb2', FGb3', FGb4' (see FIG. 13B) are prepared in the drawing data D (see FIG. 1), after drawing data correcting process is performed with respect to figures FGb1, FGb2, FGb3, FGb4 (see FIG. 13B).

Then, in the charged particle beam drawing apparatus 10 of the first embodiment, patterns Pb1, Pb2, Pb3, Pb4 (see FIG. 13A) are drawn by the charged particle beam 10a1b2 (see FIG. 7A) having triangular horizontal sectional shape, passed through right upper area 10a1m1' (see FIG. 7A) of the opening 10a1m' (see FIG. 7A) of the second forming aperture member 10a1m (see FIG. 7A), on the basis of figures FGb1', FGb2', FGb3', FGb4' (see FIG. 13B) prepared by the drawing data correcting process. When patterns Pb1, Pb2, Pb3, Pb4 (see FIG. 13A) are drawn, position difference Δx1' (see FIG. 7B) in X direction and position difference Δy1' (see FIG. 7B) in Y direction occur, as shown by arrows in FIG. 13A. Consequently, patterns Pb1, Pb2, Pb3, Pb4 (see FIG. 13A) are drawn at 4 corners in limit area Aam (see FIG. 13A) on the workpiece M (see FIG. 13A).

In detail, in the charged particle beam drawing apparatus 10 of the first embodiment, when patterns corresponding to figures included in subfield SFm (see FIG. 13B) are drawn, the pattern Pb1 (see FIG. 13A) corresponding to the figure FGb1' (see FIG. 13B) is drawn after drawing data correcting process is performed with respect to the figure FGb1 (see FIG. 13B). Consequently, in the charged particle beam drawing apparatus 10 of the first embodiment, the pattern Pb1 (see FIG. 13A) is drawn at a right upper corner in the limit area Aam (see FIG. 13A) by the charged particle beam 10a1b2 (see FIG. 7A) without a distortion of the pattern Pb1 (see FIG. 13A), wherein the limit area Aam (see FIG. 13A) is larger than the area Af (see FIG. 11B).

In the charged particle beam drawing apparatus 10 of the first embodiment, when patterns corresponding to figures included in subfield SFm (see FIG. 13B) are drawn, the pattern Pb2 (see FIG. 13A) corresponding to the figure FGb2' (see FIG. 13B) is not drawn. But, when patterns corresponding to figures included in subfield SF1 (see FIG. 13B) are drawn, the pattern Pb2 (see FIG. 13A) corresponding to the figure FGb2' (see FIG. 13B) is drawn after drawing data correcting process is performed with respect to the figure FGb2 (see FIG. 13B). Consequently, in the charged particle beam drawing apparatus 10 of the first embodiment, the pattern Pb2 (see FIG. 13A) is drawn at a left upper corner in the limit area Aam (see FIG. 13A) by the charged particle beam 10a1b2 (see FIG. 7A) without a distortion of the pattern Pb2 (see FIG. 13A), wherein the limit area Aam (see FIG. 13A) is larger than the area Af (see FIG. 11B).

In the charged particle beam drawing apparatus 10 of the first embodiment, when patterns corresponding to figures included in subfield SFm (see FIG. 13B) are drawn, the pattern Pb3 (see FIG. 13A) corresponding to the figure FGb3' (see FIG. 13B) is not drawn. But, when patterns corresponding to figures included in subfield SF1-1 (see FIG. 13B) are drawn, the pattern Pb3 (see FIG. 13A) corresponding to the figure FGb3' (see FIG. 13B) is drawn after drawing data correcting process is performed with respect to the figure FGb3 (see FIG. 13B). Consequently, in the charged particle beam drawing apparatus 10 of the first embodiment, the pattern Pb3 (see FIG. 13A) is drawn at a left lower corner in the limit area Aam (see FIG. 13A) by the charged particle beam 10a1b2 (see FIG. 7A) without a distortion of the pattern Pb3 (see FIG. 13A), wherein the limit area Aam (see FIG. 13A) is larger than the area Af (see FIG. 11B).

In the charged particle beam drawing apparatus 10 of the first embodiment, when patterns corresponding to figures included in subfield SFm (see FIG. 13B) are drawn, the pattern Pb4 (see FIG. 13A) corresponding to the figure FGb4' (see FIG. 13B) is not drawn. But, when patterns corresponding to figures included in subfield SFm-1 (see FIG. 13B) are drawn, the pattern Pb4 (see FIG. 13A) corresponding to the figure FGb4' (see FIG. 13B) is drawn after drawing data correcting process is performed with respect to the figure FGb4 (see FIG. 13B). Consequently, in the charged particle beam drawing apparatus 10 of the first embodiment, the pattern Pb4 (see FIG. 13A) is drawn at a right lower corner in the limit area Aam (see FIG. 13A) by the charged particle beam 10a1b2 (see FIG. 7A) without a distortion of the pattern Pb4 (see FIG. 13A), wherein the limit area Aam (see FIG. 13A) is larger than the area Af (see FIG. 11B).

FIGS. 14A and 14B show an example wherein patterns Pc1, Pc2, Pc3, Pc4 are drawn at 4 corners in limit area Aam in the charged particle beam drawing apparatus 10 of the first embodiment.

As shown in FIGS. 7A and 7B, the pattern Pc (see FIG. 7B) drawn by the charged particle beam 10a1b3 (see FIG. 7A) having triangular horizontal sectional shape, passed through the opening 10a1m' (see FIG. 7A) of the second forming aperture member 10a1m (see FIG. 7A) has position difference Δx2' (see FIG. 7B) in X direction and position difference Δy2' (see FIG. 7B) in Y direction. Therefore, in the example shown in FIGS. 14A and 14b, cancel process of position difference is performed with respect to patterns Pc1, Pc2, Pc3, Pc4 (see FIG. 14A) drawn by the charged particle beam 10a1b3 (see FIG. 7A) having triangular horizontal sectional shape, passed through the opening 10a1m' (see FIG. 7A) of the second forming aperture member 10a1m (see FIG. 7A).

In detail, in the charged particle beam drawing apparatus 10 of the first embodiment, figures FGc1, FGc2, FGc3, FGc4 (see FIG. 14B) in subfield SFm (see FIG. 14B) is judged to correspond to the pattern Pc (see FIG. 7B) drawn by the charged particle beam 10a1b3 (see FIG. 7A) having triangular horizontal sectional shape, passed through left upper area 10a1m2' (see FIG. 7A) of the opening 10a1m' (see FIG. 7A) of the second forming aperture member 10a1m (see FIG. 7A).

In the charged particle beam drawing apparatus 10 of the first embodiment, drawing data correcting process is performed to cancel position difference Δx2' (see FIG. 7B) in X direction and position difference Δy2' (see FIG. 7B) in Y direction, wherein the position difference Δx2' (see FIG. 7B) in X direction and the position difference Δy2' (see FIG. 7B) in Y direction occur when the pattern Pc (see FIG. 7B) is drawn. In detail, figures FGc1, FGc2, FGc3, FGc4 (see FIG. 14B) in the subfield SFm (see FIG. 14B) in the drawing data D (see FIG. 1) are moved to plus side (right side of FIG. 14B) of X axis and to minus side (lower side of FIG. 14B) of Y axis, wherein amount of movement to plus side (right side of FIG. 14B) of X axis corresponds to the position difference Δx2'

(see FIG. 7B) in X direction, and amount of movement to minus side (lower side of FIG. 14B) of Y axis corresponds to the position difference Δy2' (see FIG. 7B) in Y direction. Consequently, figures FGc1', FGc2', FGc3', FGc4' (see FIG. 14B) are prepared in the drawing data D (see FIG. 1), after drawing data correcting process is performed with respect to figures FGc1, FGc2, FGc3, FGc4 (see FIG. 14B).

Then, in the charged particle beam drawing apparatus 10 of the first embodiment, patterns Pc1, Pc2, Pc3, Pc4 (see FIG. 14A) are drawn by the charged particle beam 10a1b3 (see FIG. 7A) having triangular horizontal sectional shape, passed through left upper area 10a1m2' (see FIG. 7A) of the opening 10a1m' (see FIG. 7A) of the second forming aperture member 10a1m (see FIG. 7A), on the basis of figures FGc1', FGc2', FGc3', FGc4' (see FIG. 14B) prepared by the drawing data correcting process. When patterns Pc1, Pc2, Pc3, Pc4 (see FIG. 14A) are drawn, position difference Δx2' (see FIG. 7B) in X direction and position difference Δy2' (see FIG. 7B) in Y direction occur, as shown by arrows in FIG. 14A. Consequently, patterns Pc1, Pc2, Pc3, Pc4 (see FIG. 14A) are drawn at 4 corners in limit area Aam (see FIG. 14A) on the workpiece M (see FIG. 14A).

In detail, in the charged particle beam drawing apparatus 10 of the first embodiment, when patterns corresponding to figures included in subfield SFm (see FIG. 14B) are drawn, the pattern Pc1 (see FIG. 14A) corresponding to the figure FGc1' (see FIG. 14B) is not drawn. But, when patterns corresponding to figures included in subfield SFn (see FIG. 14B) are drawn, the pattern Pc1 (see FIG. 14A) corresponding to the figure FGc1' (see FIG. 14B) is drawn after drawing data correcting process is performed with respect to the figure FGc1 (see FIG. 14B). Consequently, in the charged particle beam drawing apparatus 10 of the first embodiment, the pattern Pc1 (see FIG. 14A) is drawn at a right upper corner in the limit area Aam (see FIG. 14A) by the charged particle beam 10a1b3 (see FIG. 7A) without a distortion of the pattern Pc1 (see FIG. 14A), wherein the limit area Aam (see FIG. 14A) is larger than the area Af (see FIG. 11B).

In the charged particle beam drawing apparatus 10 of the first embodiment, when patterns corresponding to figures included in subfield SFm (see FIG. 14B) are drawn, the pattern Pc2 (see FIG. 14A) corresponding to the figure FGc2' (see FIG. 14B) is drawn after drawing data correcting process is performed with respect to the figure FGc2 (see FIG. 14B). Consequently, in the charged particle beam drawing apparatus 10 of the first embodiment, the pattern Pc2 (see FIG. 14A) is drawn at a left upper corner in the limit area Aam (see FIG. 14A) by the charged particle beam 10a1b3 (see FIG. 7A) without a distortion of the pattern Pc2 (see FIG. 14A), wherein the limit area Aam (see FIG. 14A) is larger than the area Af (see FIG. 11B).

In the charged particle beam drawing apparatus 10 of the first embodiment, when patterns corresponding to figures included in subfield SFm (see FIG. 14B) are drawn, the pattern Pc3 (see FIG. 14A) corresponding to the figure FGc3' (see FIG. 14B) is not drawn. But, when patterns corresponding to figures included in subfield SFm−1 (see FIG. 14B) are drawn, the pattern Pc3 (see FIG. 14A) corresponding to the figure FGc3' (see FIG. 14B) is drawn after drawing data correcting process is performed with respect to the figure FGc3 (see FIG. 14B). Consequently, in the charged particle beam drawing apparatus 10 of the first embodiment, the pattern Pc3 (see FIG. 14A) is drawn at a left lower corner in the limit area Aam (see FIG. 14A) by the charged particle beam 10a1b3 (see FIG. 7A) without a distortion of the pattern Pc3 (see FIG. 14A), wherein the limit area Aam (see FIG. 14A) is larger than the area Af (see FIG. 11B).

In the charged particle beam drawing apparatus 10 of the first embodiment, when patterns corresponding to figures included in subfield SFm (see FIG. 14B) are drawn, the pattern Pc4 (see FIG. 14A) corresponding to the figure FGc4' (see FIG. 14B) is not drawn. But, when patterns corresponding to figures included in subfield SFn−1 (see FIG. 14B) are drawn, the pattern Pc4 (see FIG. 14A) corresponding to the figure FGc4' (see FIG. 14B) is drawn after drawing data correcting process is performed with respect to the figure FGc4 (see FIG. 14B). Consequently, in the charged particle beam drawing apparatus 10 of the first embodiment, the pattern Pc4 (see FIG. 14A) is drawn at a right lower corner in the limit area Aam (see FIG. 14A) by the charged particle beam 10a1b3 (see FIG. 7A) without a distortion of the pattern Pc4 (see FIG. 14A), wherein the limit area Aam (see FIG. 14A) is larger than the area Af (see FIG. 11B).

FIGS. 15A and 15B show an example wherein patterns Pd1, Pd2, Pd3, Pd4 are drawn at 4 corners in limit area Aam in the charged particle beam drawing apparatus 10 of the first embodiment.

As shown in FIGS. 7A and 7B, the pattern Pd (see FIG. 7B) drawn by the charged particle beam 10a1b4 (see FIG. 7A) having triangular horizontal sectional shape, passed through the opening 10a1m' (see FIG. 7A) of the second forming aperture member 10a1m (see FIG. 7A) has position difference Δx3' (see FIG. 7B) in X direction and position difference Δy3' (see FIG. 7B) in Y direction. Therefore, in the example shown in FIGS. 15A and 15b, cancel process of position difference is performed with respect to patterns Pd1, Pd2, Pd3, Pd4 (see FIG. 15A) drawn by the charged particle beam 10a1b4 (see FIG. 7A) having triangular horizontal sectional shape, passed through the opening 10a1m' (see FIG. 7A) of the second forming aperture member 10a1m (see FIG. 7A).

In detail, in the charged particle beam drawing apparatus 10 of the first embodiment, figures FGd1, FGd2, FGd3, FGd4 (see FIG. 15B) in subfield SFm (see FIG. 15B) is judged to correspond to the pattern Pd (see FIG. 7B) drawn by the charged particle beam 10a1b4 (see FIG. 7A) having triangular horizontal sectional shape, passed through left lower area 10a1m3' (see FIG. 7A) of the opening 10a1m' (see FIG. 7A) of the second forming aperture member 10a1m (see FIG. 7A).

In the charged particle beam drawing apparatus 10 of the first embodiment, drawing data correcting process is performed to cancel position difference Δx3' (see FIG. 7B) in X direction and position difference Δy3' (see FIG. 7B) in Y direction, wherein the position difference Δx3' (see FIG. 7B) in X direction and the position difference Δy3' (see FIG. 7B) in Y direction occur when the pattern Pd (see FIG. 7B) is drawn. In detail, figures FGd1, FGd2, FGd3, FGd4 (see FIG. 15B) in the subfield SFm (see FIG. 15B) in the drawing data D (see FIG. 1) are moved to plus side (right side of FIG. 15B) of X axis and to plus side (upper side of FIG. 15B) of Y axis, wherein amount of movement to plus side (right side of FIG. 15B) of X axis corresponds to the position difference Δx3' (see FIG. 7B) in X direction, and amount of movement to plus side (upper side of FIG. 15B) of Y axis corresponds to the position difference Δy3' (see FIG. 7B) in Y direction. Consequently, figures FGd1', FGd2', FGd3', FGd4' (see FIG. 15B) are prepared in the drawing data D (see FIG. 1), after drawing data correcting process is performed with respect to figures FGd1, FGd2, FGd3, FGd4 (see FIG. 15B).

Then, in the charged particle beam drawing apparatus 10 of the first embodiment, patterns Pd1, Pd2, Pd3, Pd4 (see FIG. 15A) are drawn by the charged particle beam 10a1b4 (see FIG. 7A) having triangular horizontal sectional shape, passed through left lower area 10a1m3' (see FIG. 7A) of the opening 10a1m' (see FIG. 7A) of the second forming aperture member 10a1m (see FIG. 7A), on the basis of figures FGd1', FGd2', FGd3', FGd4' (see FIG. 15B) prepared by the drawing data correcting process. When patterns Pd1, Pd2, Pd3, Pd4 (see FIG. 15A) are drawn, position difference Δx3' (see FIG. 7B) in X direction and position difference Δy3' (see FIG. 7B) in Y direction occur, as shown by arrows in FIG. 15A. Consequently, patterns Pd1, Pd2, Pd3, Pd4 (see FIG. 15A) are drawn at 4 corners in limit area Aam (see FIG. 15A) on the workpiece M (see FIG. 15A).

In detail, in the charged particle beam drawing apparatus 10 of the first embodiment, when patterns corresponding to figures included in subfield SFm (see FIG. 15B) are drawn, the pattern Pd1 (see FIG. 15A) corresponding to the figure FGd1' (see FIG. 15B) is not drawn. But, when patterns corresponding to figures included in subfield SFn+1 (see FIG. 15B) are drawn, the pattern Pd1 (see FIG. 15A) corresponding to the figure FGd1' (see FIG. 15B) is drawn after drawing data correcting process is performed with respect to the figure FGd1 (see FIG. 15B). Consequently, in the charged particle beam drawing apparatus 10 of the first embodiment, the pattern Pd1 (see FIG. 15A) is drawn at a right upper corner in the limit area Aam (see FIG. 15A) by the charged particle beam 10a1b4 (see FIG. 7A) without a distortion of the pattern Pd1 (see FIG. 15A), wherein the limit area Aam (see FIG. 15A) is larger than the area Af (see FIG. 11B).

In the charged particle beam drawing apparatus 10 of the first embodiment, when patterns corresponding to figures included in subfield SFm (see FIG. 15B) are drawn, the pattern Pd2 (see FIG. 15A) corresponding to the figure FGd2' (see FIG. 15B) is not drawn. But, when patterns corresponding to figures included in subfield SFm+1 (see FIG. 15B) are drawn, the pattern Pd2 (see FIG. 15A) corresponding to the figure FGd2' (see FIG. 15B) is drawn after drawing data correcting process is performed with respect to the figure FGd2 (see FIG. 15B). Consequently, in the charged particle beam drawing apparatus 10 of the first embodiment, the pattern Pd2 (see FIG. 15A) is drawn at a left upper corner in the limit area Aam (see FIG. 15A) by the charged particle beam 10a1b4 (see FIG. 7A) without a distortion of the pattern Pd2 (see FIG. 15A), wherein the limit area Aam (see FIG. 15A) is larger than the area Af (see FIG. 11B).

In the charged particle beam drawing apparatus 10 of the first embodiment, when patterns corresponding to figures included in subfield SFm (see FIG. 15B) are drawn, the pattern Pd3 (see FIG. 15A) corresponding to the figure FGd3' (see FIG. 15B) is drawn after drawing data correcting process is performed with respect to the figure FGd3 (see FIG. 15B). Consequently, in the charged particle beam drawing apparatus 10 of the first embodiment, the pattern Pd3 (see FIG. 15A) is drawn at a left lower corner in the limit area Aam (see FIG. 15A) by the charged particle beam 10a1b4 (see FIG. 7A) without a distortion of the pattern Pd3 (see FIG. 15A), wherein the limit area Aam (see FIG. 15A) is larger than the area Af (see FIG. 11B).

In the charged particle beam drawing apparatus 10 of the first embodiment, when patterns corresponding to figures included in subfield SFm (see FIG. 15B) are drawn, the pattern Pd4 (see FIG. 15A) corresponding to the figure FGd4' (see FIG. 15B) is not drawn. But, when patterns corresponding to figures included in subfield SFn (see FIG. 15B) are drawn, the pattern Pd4 (see FIG. 15A) corresponding to the figure FGd4' (see FIG. 15B) is drawn after drawing data correcting process is performed with respect to the figure FGd4 (see FIG. 15B). Consequently, in the charged particle beam drawing apparatus 10 of the first embodiment, the pattern Pd4 (see FIG. 15A) is drawn at a right lower corner in the limit area Aam (see FIG. 15A) by the charged particle beam 10a1b4 (see FIG. 7A) without a distortion of the pattern Pd4 (see FIG. 15A), wherein the limit area Aam (see FIG. 15A) is larger than the area Af (see FIG. 11B).

FIGS. 16A and 16B show an example wherein patterns Pe1, Pe2, Pe3, Pe4 are drawn at 4 corners in limit area Aam in the charged particle beam drawing apparatus 10 of the first embodiment.

As shown in FIGS. 7A and 7B, the pattern Pe (see FIG. 7B) drawn by the charged particle beam 10a1b5 (see FIG. 7A) having triangular horizontal sectional shape, passed through the opening 10a1m' (see FIG. 7A) of the second forming aperture member 10a1m (see FIG. 7A) has position difference Δx4' (see FIG. 7B) in X direction and position difference Δy4' (see FIG. 7B) in Y direction. Therefore, in the example shown in FIGS. 16A and 16b, cancel process of position difference is performed with respect to patterns Pe1, Pe2, Pe3, Pe4 (see FIG. 16A) drawn by the charged particle beam 10a1b5 (see FIG. 7A) having triangular horizontal sectional shape, passed through the opening 10a1m' (see FIG. 7A) of the second forming aperture member 10a1m (see FIG. 7A).

In detail, in the charged particle beam drawing apparatus 10 of the first embodiment, figures FGe1, FGe2, FGe3, FGe4 (see FIG. 16B) in subfield SFm (see FIG. 16B) is judged to correspond to the pattern Pe (see FIG. 7B) drawn by the charged particle beam 10a1b5 (see FIG. 7A) having triangular horizontal sectional shape, passed through right lower area 10a1m4' (see FIG. 7A) of the opening 10a1m' (see FIG. 7A) of the second forming aperture member 10a1m (see FIG. 7A).

In the charged particle beam drawing apparatus 10 of the first embodiment, drawing data correcting process is performed to cancel position difference Δx4' (see FIG. 7B) in X direction and position difference Δy4' (see FIG. 7B) in Y direction, wherein the position difference Δx4' (see FIG. 7B) in X direction and the position difference Δy4' (see FIG. 7B) in Y direction occur when the pattern Pe (see FIG. 7B) is drawn. In detail, figures FGe1, FGe2, FGe3, FGe4 (see FIG. 16B) in the subfield SFm (see FIG. 16B) in the drawing data D (see FIG. 1) are moved to minus side (left side of FIG. 16B) of X axis and to plus side (upper side of FIG. 16B) of Y axis, wherein amount of movement to minus side (left side of FIG. 16B) of X axis corresponds to the position difference Δx4' (see FIG. 7B) in X direction, and amount of movement to plus side (upper side of FIG. 16B) of Y axis corresponds to the position difference Δy4' (see FIG. 7B) in Y direction. Consequently, figures FGe1', FGe2', FGe3', FGe4' (see FIG. 16B) are prepared in the drawing data D (see FIG. 1), after drawing data correcting process is performed with respect to figures FGe1, FGe2, FGe3, FGe4 (see FIG. 16B).

Then, in the charged particle beam drawing apparatus 10 of the first embodiment, patterns Pe1, Pe2, Pe3, Pe4 (see FIG. 16A) are drawn by the charged particle beam 10a1b5 (see FIG. 7A) having triangular horizontal sectional shape, passed through right lower area 10a1m4' (see FIG. 7A) of the opening 10a1m' (see FIG. 7A) of the second forming aperture member 10a1m (see FIG. 7A), on the basis of figures FGe1', FGe2', FGe3', FGe4' (see FIG. 16B) prepared by the drawing data correcting process. When patterns Pe1, Pe2, Pe3, Pe4 (see FIG. 16A) are drawn, position difference Δx4' (see FIG. 7B) in X direction and position difference Δy4' (see FIG. 7B) in Y direction occur, as shown by arrows in FIG. 16A. Consequently, patterns Pe1, Pe2, Pe3, Pe4 (see FIG. 16A) are drawn at 4 corners in limit area Aam (see FIG. 16A) on the workpiece M (see FIG. 16A).

In detail, in the charged particle beam drawing apparatus 10 of the first embodiment, when patterns corresponding to figures included in subfield SFm (see FIG. 16B) are drawn, the pattern Pe1 (see FIG. 16A) corresponding to the figure FGe1' (see FIG. 16B) is not drawn. But, when patterns corresponding to figures included in subfield SFm+1 (see FIG. 16B) are drawn, the pattern Pe1 (see FIG. 16A) corresponding to the figure FGe1' (see FIG. 16B) is drawn after drawing data correcting process is performed with respect to the figure FGe1 (see FIG. 16B). Consequently, in the charged particle beam drawing apparatus 10 of the first embodiment, the pattern Pe1 (see FIG. 16A) is drawn at a right upper corner in the limit area Aam (see FIG. 16A) by the charged particle beam 10a1b5 (see FIG. 7A) without a distortion of the pattern Pe1 (see FIG. 16A), wherein the limit area Aam (see FIG. 16A) is larger than the area Af (see FIG. 11B).

In the charged particle beam drawing apparatus 10 of the first embodiment, when patterns corresponding to figures included in subfield SFm (see FIG. 16B) are drawn, the pattern Pe2 (see FIG. 16A) corresponding to the figure FGe2' (see FIG. 16B) is not drawn. But, when patterns corresponding to figures included in subfield SFl+1 (see FIG. 16B) are drawn, the pattern Pe2 (see FIG. 16A) corresponding to the figure FGe2' (see FIG. 16B) is drawn after drawing data correcting process is performed with respect to the figure FGe2 (see FIG. 16B). Consequently, in the charged particle beam drawing apparatus 10 of the first embodiment, the pattern Pe2 (see FIG. 16A) is drawn at a left upper corner in the limit area Aam (see FIG. 16A) by the charged particle beam 10a1b5 (see FIG. 7A) without a distortion of the pattern Pe2 (see FIG. 16A), wherein the limit area Aam (see FIG. 16A) is larger than the area Af (see FIG. 11B).

In the charged particle beam drawing apparatus 10 of the first embodiment, when patterns corresponding to figures included in subfield SFm (see FIG. 16B) are drawn, the pattern Pe3 (see FIG. 16A) corresponding to the figure FGe3' (see FIG. 16B) is not drawn. But, when patterns corresponding to figures included in subfield SFl (see FIG. 16B) are drawn, the pattern Pe3 (see FIG. 16A) corresponding to the figure FGe3' (see FIG. 16B) is drawn after drawing data correcting process is performed with respect to the figure FGe3 (see FIG. 16B). Consequently, in the charged particle beam drawing apparatus 10 of the first embodiment, the pattern Pe3 (see FIG. 16A) is drawn at a left lower corner in the limit area Aam (see FIG. 16A) by the charged particle beam 10a1b5 (see FIG. 7A) without a distortion of the pattern Pe3 (see FIG. 16A), wherein the limit area Aam (see FIG. 16A) is larger than the area Af (see FIG. 11B).

In the charged particle beam drawing apparatus 10 of the first embodiment, when patterns corresponding to figures included in subfield SFm (see FIG. 16B) are drawn, the pattern Pe4 (see FIG. 16A) corresponding to the figure FGe4' (see FIG. 16B) is drawn after drawing data correcting process is performed with respect to the figure FGe4 (see FIG. 16B). Consequently, in the charged particle beam drawing apparatus 10 of the first embodiment, the pattern Pe4 (see FIG. 16A) is drawn at a right lower corner in the limit area Aam (see FIG. 16A) by the charged particle beam 10a1b5 (see FIG. 7A) without a distortion of the pattern Pe4 (see FIG. 16A), wherein the limit area Aam (see FIG. 16A) is larger than the area Af (see FIG. 11B).

As mentioned above, in the charged particle beam drawing apparatus as described in Japanese Unexamined Patent Publication No. 2007-324229, offset process is performed by the sub-deflector 10a1f (see FIG. 1) in order to cancel position difference Δx1', Δx2', Δx3', Δx4' (see FIG. 7B) in X direction and position difference Δy1', Δy2', Δy3', Δy4' (see FIG. 7B) in Y direction, therefore, size of subfield is equal to size of area Af (see FIG. 11B) which is smaller than size of area Aa (see FIG. 11B).

In the charged particle beam drawing apparatus 10 of the first embodiment, offset process is not performed by the sub-deflector 10a1f (see FIG. 1) in order to cancel position difference Δx1', Δx2', Δx3', Δx4' (see FIG. 7B) in X direction and position difference Δy1', Δy2', Δy3', Δy4' (see FIG. 7B) in Y direction. But in the charged particle beam drawing apparatus 10 of the first embodiment, as shown in FIGS. 13B, 14B, 15B and 16B, figures FGb1, FGb2, FGb3, FGb4, FGc1, FGc2, FGc3, FGc4, FGd1, FGd2, FGd3, FGb4, FGe1, FGe2, FGe3, FGe4 in the drawing data are moved on the basis of positions in the opening 10a1m' (see FIG. 7A) of the second forming aperture 10a1m (see FIG. 7A) where the charged particle beam 10a1b2, 10a1b3, 10a1b4, 10a1b5 (see FIG. 7A) is passed through, by the drawing data correcting process. In other words, in the charged particle beam drawing apparatus 10 of the first embodiment, the drawing data correcting process is performed on the basis of area 10a1m1', 10a1m2', 10a1m3', 10a1m4' (see FIG. 7A) in the opening 10a1m' (see FIG. 7A) of the second forming aperture 10a1m (see FIG. 7A) where the charged particle beam 10a1b2, 10a1b3, 10a1b4, 10a1b5 (see FIG. 7A) is passed through. Namely, in the charged particle beam drawing apparatus 10 of the first embodiment, figures corresponding to patterns Pa, Pb, Pc, Pd (see FIG. 7A) are moved in the drawing data by the drawing data correcting process. Consequently, in the charged particle beam drawing apparatus 10 of the first embodiment, size of subfield SFl−1, SFl, SFl+1, SFm−1, SFm, SFm+1, SFn−1, SFn, SFn+1 (see FIGS. 12B, 13B, 14B, 15B and 16B) can be size of area Aa (see FIG. 11B) which is larger than size of area Af (see FIG. 11B).

Figure 17:
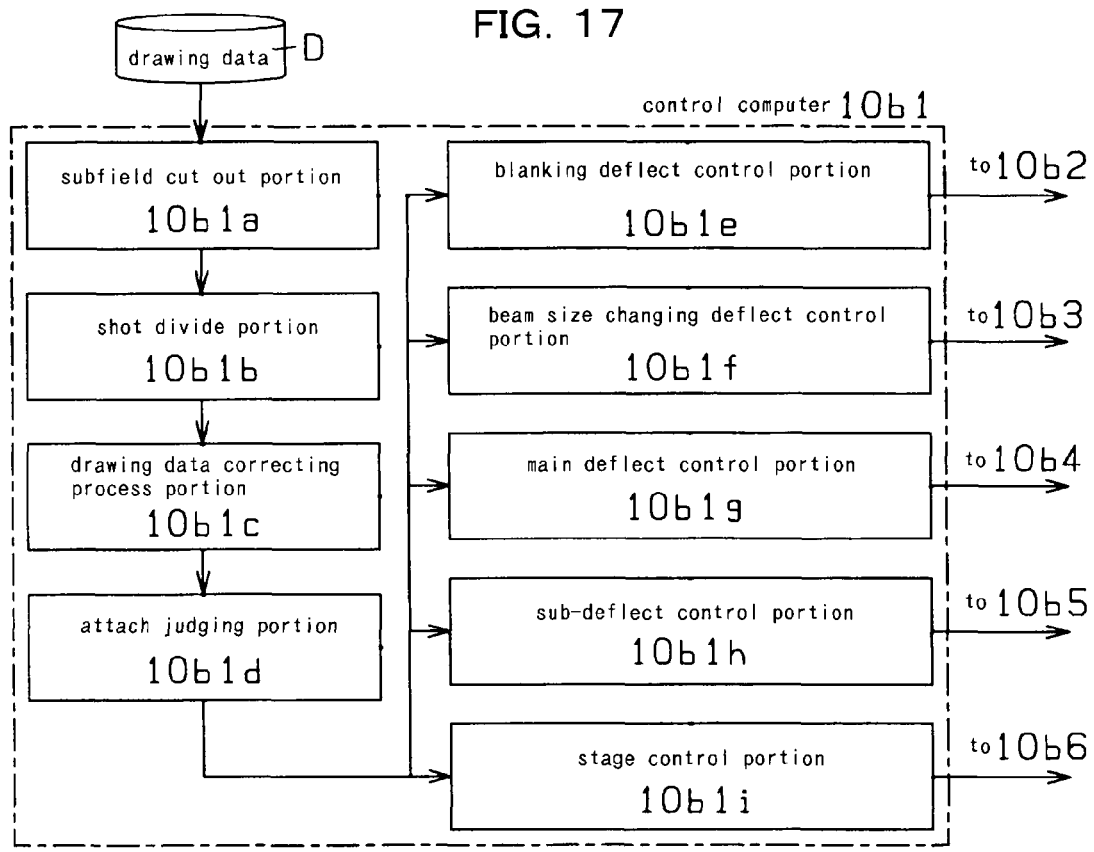
FIG. 17 shows the control computer 10b1 of the control portion 10b of the charged particle beam drawing apparatus 10 of the first embodiment shown in FIG. 1, in detail.

FIG. 17 shows the control computer 10b1 of the control portion 10b of the charged particle beam drawing apparatus 10 of the first embodiment shown in FIG. 1, in detail. In the charged particle beam drawing apparatus 10 of the first embodiment, drawing area on the workpiece M (see FIG. 1) are virtually divided into subfields SFl−1, SFl, SFl+1, SFm−1, SFm, SFm+1, SFn−1, SFn, SFn+1 (see FIGS. 5 and 16B) by a subfield cut out portion 10b1a (see FIG. 17), wherein patterns are drawn in the drawing area on the workpiece M (see FIG. 1) by the charged particle beam (see FIG. 1). Then, each figure FG1, FG2 (see FIG. 3) included in the drawing data D (see FIG. 17) is respectively attached to at least one subfield SFl−1, SFl, SFl+1, SFm−1, SFm, SFm+1, SFn−1, SFn, SFn+1 (see FIGS. 5 and 16B).

Then, in the charged particle beam drawing apparatus 10 of the first embodiment, each figure FG1, FG2 (see FIG. 3) included in the drawing data D (see FIG. 17) is divided into figures (such as figures FGa1, FGa2, FGa3, FGa4 (see FIG. 12B) and figures FGb1, FGb2, FGb3, FGb4 (see FIG. 13B)) by a shot divide portion 10b1b (see FIG. 17), wherein each of the figures corresponds to a pattern (such as pattern P1a, P1b, P1c, P1d, P1e, P1f, P1g, P1h, P1i (see FIGS. 6A to 6I)) which can be drawn by a shot of the charged particle beam 10a1b (see FIG. 2A).

Then, in the charged particle beam drawing apparatus 10 of the first embodiment, divided figures (such as figures FGb1, FGb2, FGb3, FGb4 (see FIG. 13B)) are moved in the drawing data D (see FIG. 17) by the drawing data correcting process of a drawing data correcting process portion 10b1c (see FIG. 17). In detail, in the example shown in FIG. 13B, each of figures FGb1, FGb2, FGb3, FGb4 is respectively moved to a position in which each of figures FGb1', FGb2', FGb3', FGb4' is respectively placed, in the drawing data D.

Then, in the charged particle beam drawing apparatus 10 of the first embodiment, by an attach judging portion 10b1d (see FIG. 17), figures (such as figures FGb1', FGb2', FGb3', FGb4' (see FIG. 13B)) in the drawing data D are judged after the drawing data correcting process. In detail, in the example shown in FIG. 13B, figure FGb1' is judged to be attached to subfield SFm after the drawing data correcting process, figure FGb2' is judged to be attached to subfield SFl after the drawing data correcting process, figure FGb3' is judged to be attached to subfield SFl−1 after the drawing data correcting process, and figure FGb4' is judged to be attached to subfield SFm−1 after the drawing data correcting process.

Then, in the charged particle beam drawing apparatus 10 of the first embodiment, the blanking deflector 10a1c (see FIG. 1) is controlled via the deflect control circuit 10b2 (see FIG. 1) by a blanking deflect control portion 10b1e (see FIG. 17), the beam size changing deflector 10a1d (see FIG. 1) is controlled via the deflect control circuit 10b3 (see FIG. 1) by a beam size changing deflect control portion 10b1f (see FIG. 17), the main deflector 10a1e (see FIG. 1) is controlled via the deflect control circuit 10b4 (see FIG. 1) by a main deflect control portion 10b1g (see FIG. 17), the sub-deflector 10a1f (see FIG. 1) is controlled via the deflect control circuit 10b5 (see FIG. 1) by a sub-deflect control portion 10b1h (see FIG. 17), and the movable stage 10a2a (see FIG. 1) is controlled via the stage control circuit 10b6 (see FIG. 1) by a stage control portion 10b1i (see FIG. 17). Consequently, patterns corresponding to figures included in the drawing data D (see FIG. 1) are drawn on the workpiece M (see FIG. 1) by the charged particle beam 10a1b (see FIG. 1).

In the example shown in FIGS. 13A and 13B, patterns corresponding to figures included in subfield SFl−1 (see FIG. 13B) are drawn on the workpiece M (see FIG. 13A) by the charged particle beam 10a1b (see FIG. 1). In detail, when patterns corresponding to figures included in subfield SFl−1 (see FIG. 13B) are drawn, the pattern Pb3 (see FIG. 13A) corresponding to the figure FGb3' (see FIG. 13B) included in subfield SFl−1 (see FIG. 13B) is drawn on the workpiece M (see FIG. 13A) by the charged particle beam 10a1b2 (see FIG. 7A). Namely, in the charged particle beam drawing apparatus 10 of the first embodiment, the figure FGb3 (see FIG. 13B) is attached to the subfield SFm (see FIG. 13B) before the drawing data correcting process, then the figure FGb3' (see FIG. 13B) is attached to the subfield SFl−1 (see FIG. 13B) after the drawing data correcting process. The pattern Pb3 (see FIG. 13A) corresponding to the figure FGb3' (see FIG. 13B) is not drawn when figures attached to the subfield SFm (see FIG. 13B) are drawn, but the pattern Pb3 (see FIG. 13A) corresponding to the figure FGb3' (see FIG. 13B) is drawn when figures attached to the subfield SFl−1 (see FIG. 13B) are drawn.

Then, in the example shown in FIGS. 13A and 13B, patterns corresponding to figures included in subfield SFl (see FIG. 13B) are drawn on the workpiece M (see FIG. 13A) by the charged particle beam 10a1b (see FIG. 1). In detail, when patterns corresponding to figures included in subfield SFl (see FIG. 13B) are drawn, the pattern Pb2 (see FIG. 13A) corresponding to the figure FGb2' (see FIG. 13B) included in subfield SFl (see FIG. 13B) is drawn on the workpiece M (see FIG. 13A) by the charged particle beam 10a1b2 (see FIG. 7A).

Then, in the example shown in FIGS. 13A and 13B, patterns corresponding to figures included in subfield SFl+1 (see FIG. 13B) are drawn on the workpiece M (see FIG. 13A) by the charged particle beam 10a1b (see FIG. 1).

Then, in the example shown in FIGS. 13A and 13B, patterns corresponding to figures included in subfield SFm−1 (see FIG. 13B) are drawn on the workpiece M (see FIG. 13A) by the charged particle beam 10a1b (see FIG. 1). In detail, when patterns corresponding to figures included in subfield SFm−1 (see FIG. 13B) are drawn, the pattern Pb4 (see FIG. 13A) corresponding to the figure FGb4' (see FIG. 13B) included in subfield SFm−1 (see FIG. 13B) is drawn on the workpiece M (see FIG. 13A) by the charged particle beam 10a1b2 (see FIG. 7A).

Then, in the example shown in FIGS. 13A and 13B, patterns corresponding to figures included in subfield SFm (see FIG. 13B) are drawn on the workpiece M (see FIG. 13A) by the charged particle beam 10a1b (see FIG. 1). In detail, when patterns corresponding to figures included in subfield SFm (see FIG. 13B) are drawn, the pattern Pb1 (see FIG. 13A) corresponding to the figure FGb1' (see FIG. 13B) included in subfield SFm (see FIG. 13B) is drawn on the workpiece M (see FIG. 13A) by the charged particle beam 10a1b2 (see FIG. 7A).

Then, in the example shown in FIGS. 13A and 13B, patterns corresponding to figures included in subfield SFm+1 (see FIG. 13B) are drawn on the workpiece M (see FIG. 13A) by the charged particle beam 10a1b (see FIG. 1). Then, patterns corresponding to figures included in subfield SFn−1 (see FIG. 13B) are drawn on the workpiece M (see FIG. 13A) by the charged particle beam 10a1b (see FIG. 1). Then, patterns corresponding to figures included in subfield SFn (see FIG. 13B) are drawn on the workpiece M (see FIG. 13A) by the charged particle beam 10a1b (see FIG. 1). Then, patterns corresponding to figures included in subfield SFn+1 (see FIG. 13B) are drawn on the workpiece M (see FIG. 13A) by the charged particle beam 10a1b (see FIG. 1).

In the charged particle beam drawing apparatus 10 of the first embodiment, before each figure FG1, FG2 (see FIG. 3) included in the drawing data D (see FIG. 17) is respectively attached to subfield SFl−1, SFl, SFl+1, SFm−1, SFm, SFm+1, SFn−1, SFn, SFn+1 (see FIGS. 5 and 16B) by the subfield cut out portion 10b1a (see FIG. 17), the drawing data correcting process is not performed by the drawing data correcting process portion 10b1c (see FIG. 17). Therefore, after each figure FG1, FG2 (see FIG. 3) included in the drawing data D (see FIG. 17) is respectively attached to subfield SFl−1, SFl, SFl+1, SFm−1, SFm, SFm+1, SFn−1, SFn, SFn+1 (see FIGS. 5 and 16B) by the subfield cut out portion 10b1a (see FIG. 17), when the drawing data correcting process is performed by the drawing data correcting process portion 10b1c (see FIG. 17), figures FG1, FG2 (see FIG. 3) may be moved from one subfield to another subfield. Consequently, in the charged particle beam drawing apparatus 10 of the first embodiment, a following process is performed.

Figure 18:
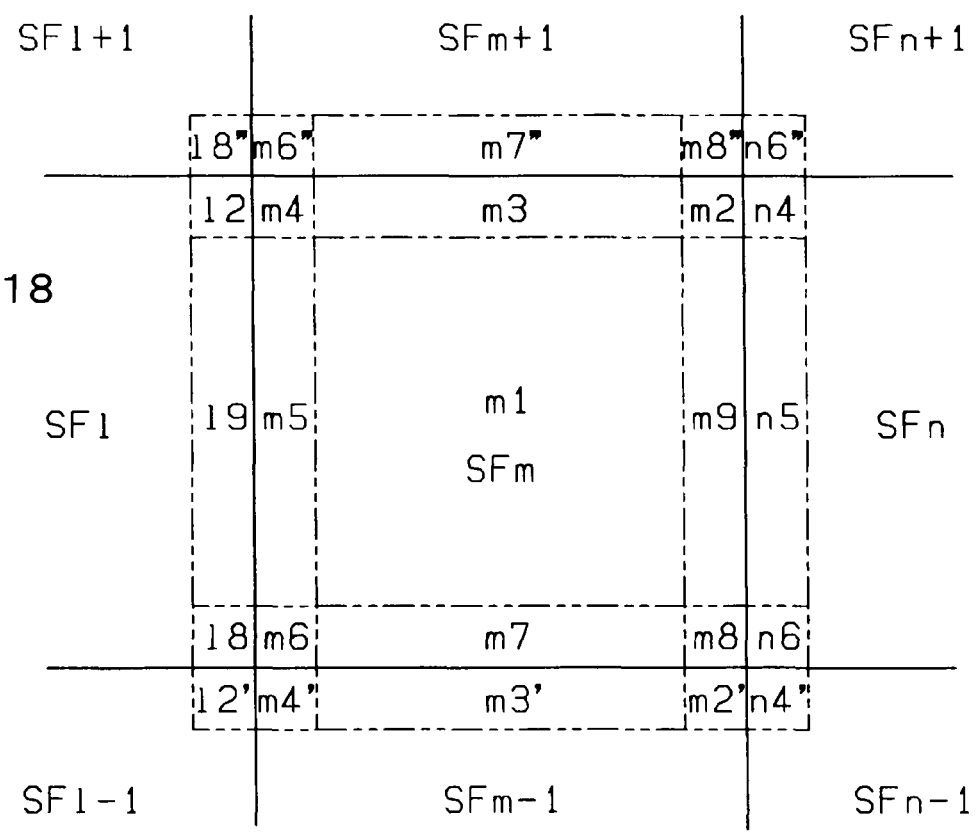
FIG. 18 shows a subfield SFm divided into 9 areas m1, m2, m3, m4, m5, m6, m7, m8, m9.
Figure 19A:
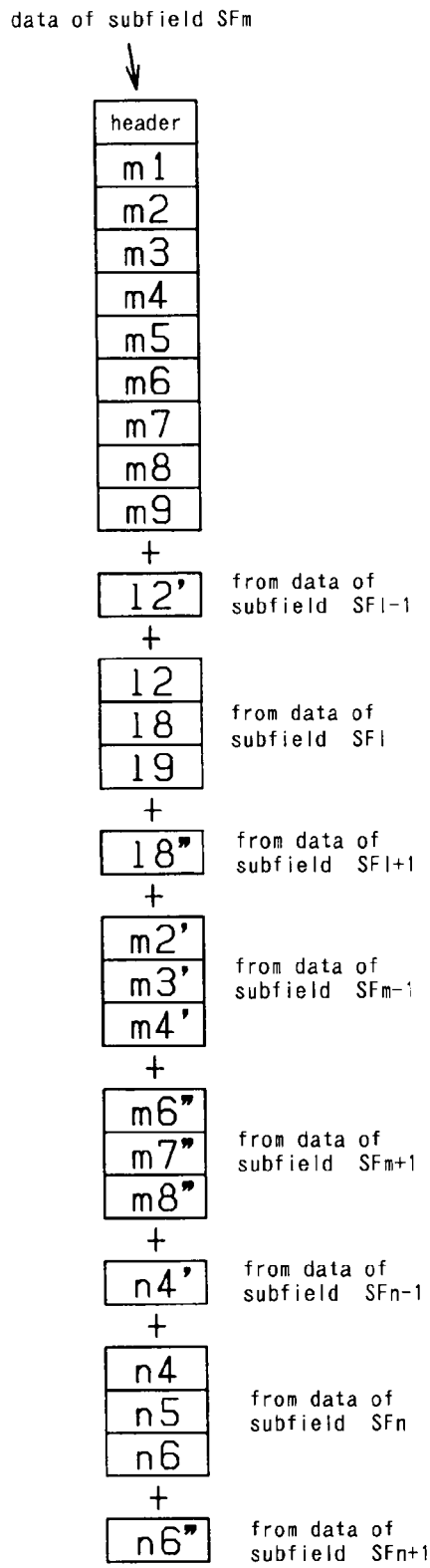
FIGS. 19A and 19B show a data processing method of subfield SFm in the charged particle beam drawing apparatus 10 of the first embodiment.
Figure 19B:
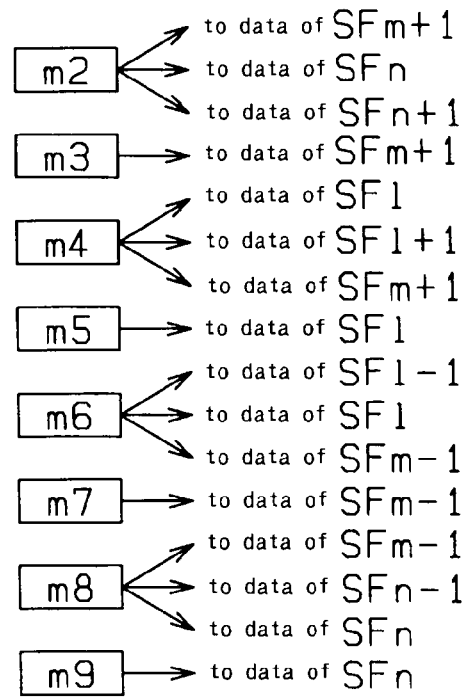

FIG. 18 shows a subfield SFm divided into 9 areas m1, m2, m3, m4, m5, m6, m7, m8, m9. FIGS. 19A and 19B show a data processing method of subfield SFm in the charged particle beam drawing apparatus 10 of the first embodiment.

In the charged particle beam drawing apparatus 10 of the first embodiment, the standard point O of the charged particle beam 10a1b (see FIG. 1) is placed in a position shown in FIG. 7A. Namely, the charged particle beam 10a1b which is not deflected by the beam size changing deflector 10a1d is passed through the standard point O.

In the charged particle beam drawing apparatus 10 of the first embodiment, if a figure (such as figure FGb1 (see FIG. 13B)) corresponding to a pattern (such as pattern Pb1 (see FIG. 13A)) drawn by the charged particle beam 10a1b2 (see FIG. 7A), is included in area m2 (see FIG. 18) of subfield SFm (see FIG. 18), the figure is moved to minus side (left side of FIG. 13B) of X axis and minus side (lower side of FIG. 13B) of Y axis (such as to a position where figure FGb1' is placed as shown in FIG. 13B) by the drawing data correcting process.

In the charged particle beam drawing apparatus 10 of the first embodiment, if a figure (such as figure FGc1 (see FIG.

14B)) corresponding to a pattern (such as pattern Pc1 (see FIG. 14A)) drawn by the charged particle beam $10a1b3$ (see FIG. 7A), is included in area m2 (see FIG. 18) of subfield SFm (see FIG. 18), the figure is moved to plus side (right side of FIG. 14B) of X axis and minus side (lower side of FIG. 14B) of Y axis (such as to a position where figure FGc1' is placed as shown in FIG. 14B) by the drawing data correcting process. Namely, in this case, the figure is attached to subfield SFm (see FIG. 18) before the drawing data correcting process, then the figure is attached to subfield SFn (see FIG. 18) after the drawing data correcting process. Consequently, in the charged particle beam drawing apparatus 10 of the first embodiment, figures included in area m2 (see FIG. 18) which is placed near the borderline between subfield SFm (see FIG. 18) and subfield SFn (see FIG. 18), are included in data of subfield SFm (see FIG. 18) as shown in FIG. 19A, and are included in data of subfield SFn (see FIG. 18) as shown in FIG. 19B by the subfield cut out portion $10b1a$ (see FIG. 17). Then, after the figures are moved to plus side of X axis and minus side of Y axis by the drawing data correcting process, and after the figures are judged by the attach judging portion $10b1d$ (see FIG. 17), the figures are included only in data of subfield SFn (see FIG. 18).

In the charged particle beam drawing apparatus 10 of the first embodiment, if a figure (such as figure FGd1 (see FIG. 15B)) corresponding to a pattern (such as pattern Pd1 (see FIG. 15A)) drawn by the charged particle beam $10a1b4$ (see FIG. 7A), is included in area m2 (see FIG. 18) of subfield SFm (see FIG. 18), the figure is moved to plus side (right side of FIG. 15B) of X axis and plus side (upper side of FIG. 15B) of Y axis (such as to a position where figure FGd1' is placed as shown in FIG. 15B) by the drawing data correcting process. Namely, in this case, the figure is attached to subfield SFm (see FIG. 18) before the drawing data correcting process, then the figure is attached to subfield SFn+1 (see FIG. 18) after the drawing data correcting process. Consequently, in the charged particle beam drawing apparatus 10 of the first embodiment, figures included in area m2 (see FIG. 18) which is placed near the borderline between subfield SFm (see FIG. 18) and subfield SFn+1 (see FIG. 18), are included in data of subfield SFm (see FIG. 18) as shown in FIG. 19A, and are included in data of subfield SFn+1 (see FIG. 18) as shown in FIG. 19B by the subfield cut out portion $10b1a$ (see FIG. 17). Then, after the figures are moved to plus side of X axis and plus side of Y axis by the drawing data correcting process, and after the figures are judged by the attach judging portion $10b1d$ (see FIG. 17), the figures are included only in data of subfield SFn+1 (see FIG. 18).

In the charged particle beam drawing apparatus 10 of the first embodiment, if a figure (such as figure FGe1 (see FIG. 16B)) corresponding to a pattern (such as pattern Pe1 (see FIG. 16A)) drawn by the charged particle beam $10a1b5$ (see FIG. 7A), is included in area m2 (see FIG. 18) of subfield SFm (see FIG. 18), the figure is moved to minus side (left side of FIG. 16B) of X axis and plus side (upper side of FIG. 16B) of Y axis (such as to a position where figure FGe1' is placed as shown in FIG. 16B) by the drawing data correcting process. Namely, in this case, the figure is attached to subfield SFm (see FIG. 18) before the drawing data correcting process, then the figure is attached to subfield SFm+1 (see FIG. 18) after the drawing data correcting process. Consequently, in the charged particle beam drawing apparatus 10 of the first embodiment, figures included in area m2 (see FIG. 18) which is placed near the borderline between subfield SFm (see FIG. 18) and subfield SFm+1 (see FIG. 18), are included in data of subfield SFm (see FIG. 18) as shown in FIG. 19A, and are included in data of subfield SFm+1 (see FIG. 18) as shown in FIG. 19B by the subfield cut out portion $10b1a$ (see FIG. 17). Then, after the figures are moved to minus side of X axis and plus side of Y axis by the drawing data correcting process, and after the figures are judged by the attach judging portion $10b1d$ (see FIG. 17), the figures are included only in data of subfield SFm+1 (see FIG. 18).

Similarly, in the charged particle beam drawing apparatus 10 of the first embodiment, figures included in area m3 (see FIG. 18) which is placed near the borderline between subfield SFm (see FIG. 18) and subfield SFm+1 (see FIG. 18), are included in data of subfield SFm (see FIG. 18) as shown in FIG. 19A, and are included in data of subfield SFm+1 (see FIG. 18) as shown in FIG. 19B by the subfield cut out portion $10b1a$ (see FIG. 17). Then, after the figures are moved by the drawing data correcting process, and after the figures are judged by the attach judging portion $10b1d$ (see FIG. 17), the figures are included in only one of data of subfield SFm (see FIG. 18) and data of subfield SFm+1 (see FIG. 18).

In the charged particle beam drawing apparatus 10 of the first embodiment, figures included in area m4 (see FIG. 18) which is placed near the borderline between subfield SFm (see FIG. 18) and subfields SFl, SFl+1, SFm+1 (see FIG. 18), are included in data of subfield SFm (see FIG. 18) as shown in FIG. 19A, and are included in data of subfields SFl, SFl+1, SFm+1 (see FIG. 18) as shown in FIG. 19B by the subfield cut out portion $10b1a$ (see FIG. 17). Then, after the figures are moved by the drawing data correcting process, and after the figures are judged by the attach judging portion $10b1d$ (see FIG. 17), the figures are included in only one of data of subfield SFm (see FIG. 18), data of subfield SFl (see FIG. 18), data of subfield SFl+1 (see FIG. 18), and data of subfield SFm+1 (see FIG. 18).

In the charged particle beam drawing apparatus 10 of the first embodiment, figures included in area m5 (see FIG. 18) which is placed near the borderline between subfield SFm (see FIG. 18) and subfield SFl (see FIG. 18), are included in data of subfield SFm (see FIG. 18) as shown in FIG. 19A, and are included in data of subfield SFl (see FIG. 18) as shown in FIG. 19B by the subfield cut out portion $10b1a$ (see FIG. 17). Then, after the figures are moved by the drawing data correcting process, and after the figures are judged by the attach judging portion $10b1d$ (see FIG. 17), the figures are included in only one of data of subfield SFm (see FIG. 18) and data of subfield SFl (see FIG. 18).

In the charged particle beam drawing apparatus 10 of the first embodiment, figures included in area m6 (see FIG. 18) which is placed near the borderline between subfield SFm (see FIG. 18) and subfields SFl−1, SFl, SFm−1 (see FIG. 18), are included in data of subfield SFm (see FIG. 18) as shown in FIG. 19A, and are included in data of subfields SFl−1, SFl, SFm−1 (see FIG. 18) as shown in FIG. 19B by the subfield cut out portion $10b1a$ (see FIG. 17). Then, after the figures are moved by the drawing data correcting process, and after the figures are judged by the attach judging portion $10b1d$ (see FIG. 17), the figures are included in only one of data of subfield SFm (see FIG. 18), data of subfield SFl−1 (see FIG. 18), data of subfield SFl (see FIG. 18), and data of subfield SFm−1 (see FIG. 18).

In the charged particle beam drawing apparatus 10 of the first embodiment, figures included in area m7 (see FIG. 18) which is placed near the borderline between subfield SFm (see FIG. 18) and subfield SFm−1 (see FIG. 18), are included in data of subfield SFm (see FIG. 18) as shown in FIG. 19A, and are included in data of subfield SFm−1 (see FIG. 18) as shown in FIG. 19B by the subfield cut out portion $10b1a$ (see FIG. 17). Then, after the figures are moved by the drawing data correcting process, and after the figures are judged by the attach judging portion 10*b*1*d* (see FIG. 17), the figures are included in only one of data of subfield SFm (see FIG. 18) and data of subfield SFm−1 (see FIG. 18).

In the charged particle beam drawing apparatus 10 of the first embodiment, figures included in area m8 (see FIG. 18) which is placed near the borderline between subfield SFm (see FIG. 18) and subfields SFm−1, SFn−1, SFn (see FIG. 18), are included in data of subfield SFm (see FIG. 18) as shown in FIG. 19A, and are included in data of subfields SFm−1, SFn−1, SFn (see FIG. 18) as shown in FIG. 19B by the subfield cut out portion 10*b*1*a* (see FIG. 17). Then, after the figures are moved by the drawing data correcting process, and after the figures are judged by the attach judging portion 10*b*1*d* (see FIG. 17), the figures are included in only one of data of subfield SFm (see FIG. 18), data of subfield SFm−1 (see FIG. 18), data of subfield SFn−1 (see FIG. 18), and data of subfield SFn (see FIG. 18).

In the charged particle beam drawing apparatus 10 of the first embodiment, figures included in area m9 (see FIG. 18) which is placed near the borderline between subfield SFm (see FIG. 18) and subfield SFn (see FIG. 18), are included in data of subfield SFm (see FIG. 18) as shown in FIG. 19A, and are included in data of subfield SFn (see FIG. 18) as shown in FIG. 19B by the subfield cut out portion 10*b*1*a* (see FIG. 17). Then, after the figures are moved by the drawing data correcting process, and after the figures are judged by the attach judging portion 10*b*1*d* (see FIG. 17), the figures are included in only one of data of subfield SFm (see FIG. 18) and data of subfield SFn (see FIG. 18).

Similarly, in the charged particle beam drawing apparatus 10 of the first embodiment, figures included in area 12' (see FIG. 18) of subfield SFl−1 (see FIG. 18) are included in data of subfields SFl−1, SFl, SFm−1, SFm (see FIG. 18) as shown in FIG. 19A by the subfield cut out portion 10*b*1*a* (see FIG. 17). Then, after the figures are moved by the drawing data correcting process, and after the figures are judged by the attach judging portion 10*b*1*d* (see FIG. 17), the figures are included in only one of data of subfield SFl−1 (see FIG. 18), data of subfield SFl (see FIG. 18), data of subfield SFm−1 (see FIG. 18), and data of subfield SFm (see FIG. 18).

In the charged particle beam drawing apparatus 10 of the first embodiment, figures included in area 12 (see FIG. 18) of subfield SFl (see FIG. 18) are included in data of subfields SFl, SFl+1, SFm, SFm+1 (see FIG. 18) as shown in FIG. 19A by the subfield cut out portion 10*b*1*a* (see FIG. 17). Then, after the figures are moved by the drawing data correcting process, and after the figures are judged by the attach judging portion 10*b*1*d* (see FIG. 17), the figures are included in only one of data of subfield SFl (see FIG. 18), data of subfield SFl+1 (see FIG. 18), data of subfield SFm (see FIG. 18), and data of subfield SFm+1 (see FIG. 18).

In the charged particle beam drawing apparatus 10 of the first embodiment, figures included in area 18 (see FIG. 18) of subfield SFl (see FIG. 18) are included in data of subfields SFl−1, SFl, SFm−1, SFm (see FIG. 18) as shown in FIG. 19A by the subfield cut out portion 10*b*1*a* (see FIG. 17). Then, after the figures are moved by the drawing data correcting process, and after the figures are judged by the attach judging portion 10*b*1*d* (see FIG. 17), the figures are included in only one of data of subfield SFl−1 (see FIG. 18), data of subfield SFl (see FIG. 18), data of subfield SFm−1 (see FIG. 18), and data of subfield SFm (see FIG. 18).

In the charged particle beam drawing apparatus 10 of the first embodiment, figures included in area 19 (see FIG. 18) of subfield SFl (see FIG. 18) are included in data of subfields SFl, SFm (see FIG. 18) as shown in FIG. 19A by the subfield cut out portion 10*b*1*a* (see FIG. 17). Then, after the figures are moved by the drawing data correcting process, and after the figures are judged by the attach judging portion 10*b*1*d* (see FIG. 17), the figures are included in only one of data of subfield SFl (see FIG. 18) and data of subfield SFm (see FIG. 18).

In the charged particle beam drawing apparatus 10 of the first embodiment, figures included in area 18" (see FIG. 18) of subfield SFl+1 (see FIG. 18) are included in data of subfields SFl, SFl+1, SFm, SFm+1 (see FIG. 18) as shown in FIG. 19A by the subfield cut out portion 10*b*1*a* (see FIG. 17). Then, after the figures are moved by the drawing data correcting process, and after the figures are judged by the attach judging portion 10*b*1*d* (see FIG. 17), the figures are included in only one of data of subfield SFl (see FIG. 18), data of subfield SFl+1 (see FIG. 18), data of subfield SFm (see FIG. 18), and data of subfield SFm+1 (see FIG. 18).

In the charged particle beam drawing apparatus 10 of the first embodiment, figures included in area m2' (see FIG. 18) of subfield SFm−1 (see FIG. 18) are included in data of subfields SFm−1, SFm, SFn−1, SFn (see FIG. 18) as shown in FIG. 19A by the subfield cut out portion 10*b*1*a* (see FIG. 17). Then, after the figures are moved by the drawing data correcting process, and after the figures are judged by the attach judging portion 10*b*1*d* (see FIG. 17), the figures are included in only one of data of subfield SFm−1 (see FIG. 18), data of subfield SFm (see FIG. 18), data of subfield SFn−1 (see FIG. 18), and data of subfield SFn (see FIG. 18).

In the charged particle beam drawing apparatus 10 of the first embodiment, figures included in area m3' (see FIG. 18) of subfield SFm−1 (see FIG. 18) are included in data of subfields SFm−1, SFm (see FIG. 18) as shown in FIG. 19A by the subfield cut out portion 10*b*1*a* (see FIG. 17). Then, after the figures are moved by the drawing data correcting process, and after the figures are judged by the attach judging portion 10*b*1*d* (see FIG. 17), the figures are included in only one of data of subfield SFm−1 (see FIG. 18) and data of subfield SFm (see FIG. 18).

In the charged particle beam drawing apparatus 10 of the first embodiment, figures included in area m4' (see FIG. 18) of subfield SFm−1 (see FIG. 18) are included in data of subfields SFl−1, SFl, SFm−1, SFm (see FIG. 18) as shown in FIG. 19A by the subfield cut out portion 10*b*1*a* (see FIG. 17). Then, after the figures are moved by the drawing data correcting process, and after the figures are judged by the attach judging portion 10*b*1*d* (see FIG. 17), the figures are included in only one of data of subfield SFl−1 (see FIG. 18), data of subfield SFl (see FIG. 18), data of subfield SFm−1 (see FIG. 18), and data of subfield SFm (see FIG. 18).

In the charged particle beam drawing apparatus 10 of the first embodiment, figures included in area m6" (see FIG. 18) of subfield SFm+1 (see FIG. 18) are included in data of subfields SFl, SFl+1, SFm, SFm+1 (see FIG. 18) as shown in FIG. 19A by the subfield cut out portion 10*b*1*a* (see FIG. 17). Then, after the figures are moved by the drawing data correcting process, and after the figures are judged by the attach judging portion 10*b*1*d* (see FIG. 17), the figures are included in only one of data of subfield SFl (see FIG. 18), data of subfield SFl+1 (see FIG. 18), data of subfield SFm (see FIG. 18), and data of subfield SFm+1 (see FIG. 18).

In the charged particle beam drawing apparatus 10 of the first embodiment, figures included in area m7" (see FIG. 18) of subfield SFm+1 (see FIG. 18) are included in data of subfields SFm, SFm+1 (see FIG. 18) as shown in FIG. 19A by the subfield cut out portion 10*b*1*a* (see FIG. 17). Then, after the figures are moved by the drawing data correcting process, and after the figures are judged by the attach judging portion 10*b*1*d* (see FIG. 17), the figures are included in only one of data of subfield SFm (see FIG. 18) and data of subfield SFm+1 (see FIG. 18).

In the charged particle beam drawing apparatus 10 of the first embodiment, figures included in area m8" (see FIG. 18) of subfield SFm+1 (see FIG. 18) are included in data of subfields SFm, SFm+1, SFn, SFn+1 (see FIG. 18) as shown in FIG. 19A by the subfield cut out portion 10*b*1*a* (see FIG. 17). Then, after the figures are moved by the drawing data correcting process, and after the figures are judged by the attach judging portion 10*b*1*d* (see FIG. 17), the figures are included in only one of data of subfield SFm (see FIG. 18), data of subfield SFm+1 (see FIG. 18), data of subfield SFn (see FIG. 18), and data of subfield SFn+1 (see FIG. 18).

In the charged particle beam drawing apparatus 10 of the first embodiment, figures included in area n4' (see FIG. 18) of subfield SFn−1 (see FIG. 18) are included in data of subfields SFm−1, SFm, SFn−1, SFn (see FIG. 18) as shown in FIG. 19A by the subfield cut out portion 10*b*1*a* (see FIG. 17). Then, after the figures are moved by the drawing data correcting process, and after the figures are judged by the attach judging portion 10*b*1*d* (see FIG. 17), the figures are included in only one of data of subfield SFm−1 (see FIG. 18), data of subfield SFm (see FIG. 18), data of subfield SFn−1 (see FIG. 18), and data of subfield SFn (see FIG. 18).

In the charged particle beam drawing apparatus 10 of the first embodiment, figures included in area n4 (see FIG. 18) of subfield SFn (see FIG. 18) are included in data of subfields SFm, SFm+1, SFn, SFn+1 (see FIG. 18) as shown in FIG. 19A by the subfield cut out portion 10*b*1*a* (see FIG. 17). Then, after the figures are moved by the drawing data correcting process, and after the figures are judged by the attach judging portion 10*b*1*d* (see FIG. 17), the figures are included in only one of data of subfield SFm (see FIG. 18), data of subfield SFm+1 (see FIG. 18), data of subfield SFn (see FIG. 18), and data of subfield SFn+1 (see FIG. 18).

In the charged particle beam drawing apparatus 10 of the first embodiment, figures included in area n5 (see FIG. 18) of subfield SFn (see FIG. 18) are included in data of subfields SFm, SFn (see FIG. 18) as shown in FIG. 19A by the subfield cut out portion 10*b*1*a* (see FIG. 17). Then, after the figures are moved by the drawing data correcting process, and after the figures are judged by the attach judging portion 10*b*1*d* (see FIG. 17), the figures are included in only one of data of subfield SFm (see FIG. 18) and data of subfield SFn (see FIG. 18).

In the charged particle beam drawing apparatus 10 of the first embodiment, figures included in area n6 (see FIG. 18) of subfield SFn (see FIG. 18) are included in data of subfields SFm−1, SFm, SFn−1, SFn (see FIG. 18) as shown in FIG. 19A by the subfield cut out portion 10*b*1*a* (see FIG. 17). Then, after the figures are moved by the drawing data correcting process, and after the figures are judged by the attach judging portion 10*b*1*d* (see FIG. 17), the figures are included in only one of data of subfield SFm−1 (see FIG. 18), data of subfield SFm (see FIG. 18), data of subfield SFn−1 (see FIG. 18), and data of subfield SFn (see FIG. 18).

In the charged particle beam drawing apparatus 10 of the first embodiment, figures included in area n6" (see FIG. 18) of subfield SFn+1 (see FIG. 18) are included in data of subfields SFm, SFm+1, SFn, SFn+1 (see FIG. 18) as shown in FIG. 19A by the subfield cut out portion 10*b*1*a* (see FIG. 17). Then, after the figures are moved by the drawing data correcting process, and after the figures are judged by the attach judging portion 10*b*1*d* (see FIG. 17), the figures are included in only one of data of subfield SFm (see FIG. 18), data of subfield SFm+1 (see FIG. 18), data of subfield SFn (see FIG. 18), and data of subfield SFn+1 (see FIG. 18).

Figure 20:
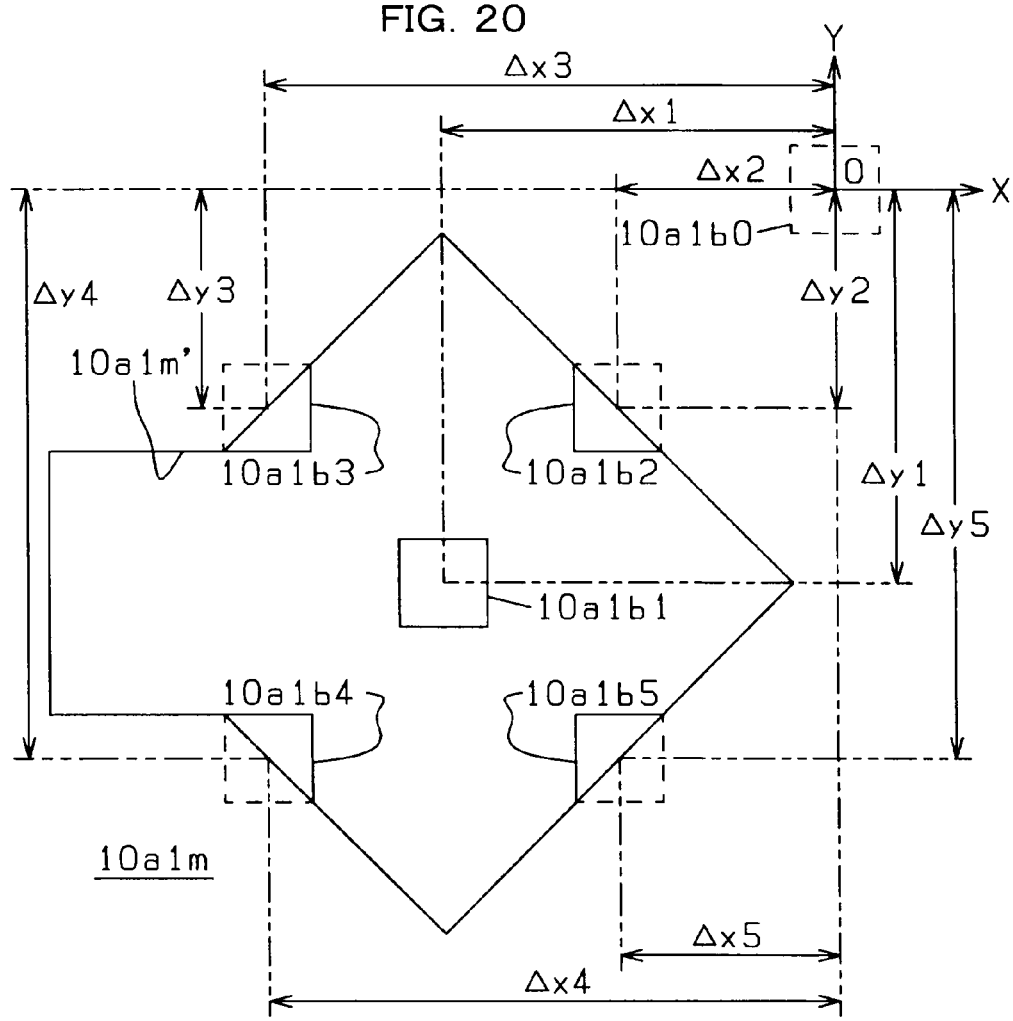
FIGS. 20 and 21 explain a position difference of the charged particle beam 10a1b on the workpiece M in the charged particle beam drawing apparatus 10 of a third embodiment.
Figure 21:
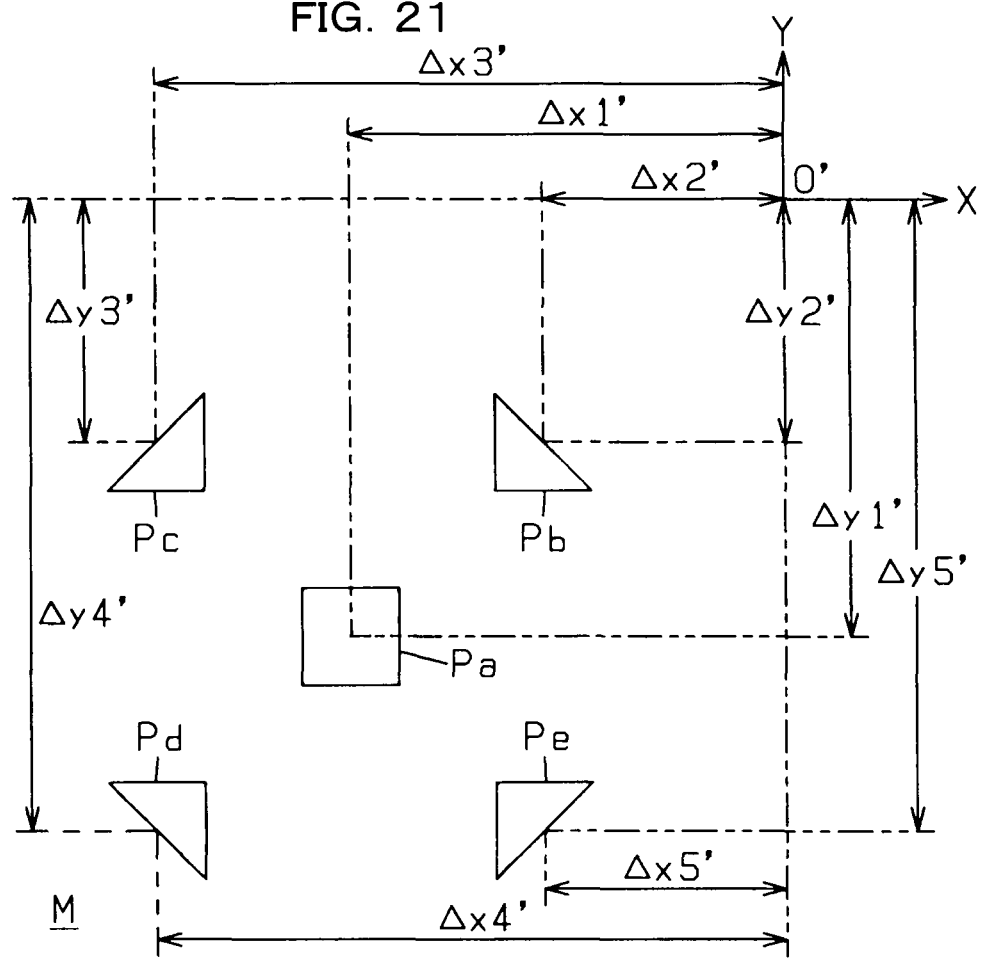

FIGS. 20 and 21 explain a position difference of the charged particle beam 10*a*1*b* on the workpiece M in the charged particle beam drawing apparatus 10 of a third embodiment. In an example shown in FIGS. 20 and 21, a first standard point is placed on a point O shown in FIG. 20. In other words, in the example shown in FIGS. 20 and 21, if the charge particle beam 10*a*1*b* (see FIG. 2A) passed through the square opening 10*a*1*l*' (see FIG. 2A) of the first forming aperture member 10*a*1*l* (see FIG. 2A) is not deflected by the beam size changing deflector 10*a*1*d* (see FIG. 1), a charged particle beam 10*a*1*b*0 (see FIG. 20) having a square horizontal sectional shape is interrupted by the second forming aperture member 10*a*1*m* (see FIG. 20).

In the example shown in FIGS. 20 and 21, if the charge particle beam 10*a*1*b* (see FIG. 2A) passed through the square opening 10*a*1*l*' (see FIG. 2A) of the first forming aperture member 10*a*1*l* (see FIG. 2A) is deflected by the beam size changing deflector (see FIG. 1), deflecting amount to minus side (left side of FIG. 20) of X axis is $\Delta x1$ (see FIG. 20), and deflecting amount to minus side (lower side of FIG. 20) of Y axis is $\Delta y1$ (see FIG. 20), a charged particle beam 10*a*1*b*1 (see FIG. 20) having a square horizontal sectional shape is passed through the opening 10*a*1*m*' (see FIG. 20) of the second forming aperture member 10*a*1*m* (see FIG. 20). Accordingly, a square pattern Pa (see FIG. 21) is drawn on the workpiece M (see FIG. 21) by the charged particle beam 10*a*1*b*1 (see FIG. 20) passed through the opening 10*a*1*m*' (see FIG. 20) of the second forming aperture member 10*a*1*m* (see FIG. 20). Position difference amount to minus side (left side of FIG. 21) of X axis of the square pattern Pa (see FIG. 21) with respect to a second standard point O' (see FIG. 21) on the workpiece M (see FIG. 21) corresponding to the first standard point O (see FIG. 20) on the second forming aperture member 10*a*1*m* (see FIG. 20) is $\Delta x1'$ (see FIG. 21), and position difference amount to minus side (lower side of FIG. 21) of Y axis of the square pattern Pa (see FIG. 21) with respect to the second standard point O' (see FIG. 21) on the workpiece M (see FIG. 21) corresponding to the first standard point O (see FIG. 20) on the second forming aperture member 10*a*1*m* (see FIG. 20) is $\Delta y1'$ (see FIG. 21).

In the example shown in FIGS. 20 and 21, if the charge particle beam 10*a*1*b* (see FIG. 2A) passed through the square opening 10*a*1*l*' (see FIG. 2A) of the first forming aperture member 10*a*1*l* (see FIG. 2A) is deflected by the beam size changing deflector (see FIG. 1), deflecting amount to minus side (left side of FIG. 20) of X axis is $\Delta x2$ (see FIG. 20), and deflecting amount to minus side (lower side of FIG. 20) of Y axis is $\Delta y2$ (see FIG. 20), a charged particle beam 10*a*1*b*2 (see FIG. 20) having a triangular horizontal sectional shape is passed through the opening 10*a*1*m*' (see FIG. 20) of the second forming aperture member 10*a*1*m* (see FIG. 20). Accordingly, a triangular pattern Pb (see FIG. 21) is drawn on the workpiece M (see FIG. 21) by the charged particle beam 10*a*1*b*2 (see FIG. 20) passed through the opening 10*a*1*m*' (see FIG. 20) of the second forming aperture member 10*a*1*m* (see FIG. 20). Position difference amount to minus side (left side of FIG. 21) of X axis of the triangular pattern Pb (see FIG. 21) with respect to the second standard point O' (see FIG. 21) on the workpiece M (see FIG. 21) corresponding to the first standard point O (see FIG. 20) on the second forming aperture member 10*a*1*m* (see FIG. 20) is $\Delta x2'$ (see FIG. 21), and position difference amount to minus side (lower side of FIG. 21) of Y axis of the triangular pattern Pb (see FIG. 21) with respect to the second standard point O' (see FIG. 21) on the workpiece M (see FIG. 21) corresponding to the first standard point O (see FIG. 20) on the second forming aperture member 10a1m (see FIG. 20) is Δy2' (see FIG. 21).

In the example shown in FIGS. 20 and 21, if the charge particle beam 10a1b (see FIG. 2A) passed through the square opening 10a1l' (see FIG. 2A) of the first forming aperture member 10a1l (see FIG. 2A) is deflected by the beam size changing deflector (see FIG. 1), deflecting amount to minus side (left side of FIG. 20) of X axis is Δx3 (see FIG. 20), and deflecting amount to minus side (lower side of FIG. 20) of Y axis is Δy3 (see FIG. 20), a charged particle beam 10a1b3 (see FIG. 20) having a triangular horizontal sectional shape is passed through the opening 10a1m' (see FIG. 20) of the second forming aperture member 10a1m (see FIG. 20). Accordingly, a triangular pattern Pc (see FIG. 21) is drawn on the workpiece M (see FIG. 21) by the charged particle beam 10a1b3 (see FIG. 20) passed through the opening 10a1m' (see FIG. 20) of the second forming aperture member 10a1m (see FIG. 20). Position difference amount to minus side (left side of FIG. 21) of X axis of the triangular pattern Pc (see FIG. 21) with respect to the second standard point O' (see FIG. 21) on the workpiece M (see FIG. 21) corresponding to the first standard point O (see FIG. 20) on the second forming aperture member 10a1m (see FIG. 20) is Δx3' (see FIG. 21), and position difference amount to minus side (lower side of FIG. 21) of Y axis of the triangular pattern Pc (see FIG. 21) with respect to the second standard point O' (see FIG. 21) on the workpiece M (see FIG. 21) corresponding to the first standard point O (see FIG. 20) on the second forming aperture member 10a1m (see FIG. 20) is Δy3' (see FIG. 21).

In the example shown in FIGS. 20 and 21, if the charge particle beam 10a1b (see FIG. 2A) passed through the square opening 10a1l' (see FIG. 2A) of the first forming aperture member 10a1l (see FIG. 2A) is deflected by the beam size changing deflector (see FIG. 1), deflecting amount to minus side (left side of FIG. 20) of X axis is Δx4 (see FIG. 20), and deflecting amount to minus side (lower side of FIG. 20) of Y axis is Δy4 (see FIG. 20), a charged particle beam 10a1b4 (see FIG. 20) having a triangular horizontal sectional shape is passed through the opening 10a1m' (see FIG. 20) of the second forming aperture member 10a1m (see FIG. 20). Accordingly, a triangular pattern Pd (see FIG. 21) is drawn on the workpiece M (see FIG. 21) by the charged particle beam 10a1b4 (see FIG. 20) passed through the opening 10a1m' (see FIG. 20) of the second forming aperture member 10a1m (see FIG. 20). Position difference amount to minus side (left side of FIG. 21) of X axis of the triangular pattern Pd (see FIG. 21) with respect to the second standard point O' (see FIG. 21) on the workpiece M (see FIG. 21) corresponding to the first standard point O (see FIG. 20) on the second forming aperture member 10a1m (see FIG. 20) is Δx4' (see FIG. 21), and position difference amount to minus side (lower side of FIG. 21) of Y axis of the triangular pattern Pd (see FIG. 21) with respect to the second standard point O' (see FIG. 21) on the workpiece M (see FIG. 21) corresponding to the first standard point O (see FIG. 20) on the second forming aperture member 10a1m (see FIG. 20) is Δy4' (see FIG. 21).

In the example shown in FIGS. 20 and 21, if the charge particle beam 10a1b (see FIG. 2A) passed through the square opening 10a1l' (see FIG. 2A) of the first forming aperture member 10a1l (see FIG. 2A) is deflected by the beam size changing deflector (see FIG. 1), deflecting amount to minus side (left side of FIG. 20) of X axis is Δx5 (see FIG. 20), and deflecting amount to minus side (lower side of FIG. 20) of Y axis is Δy5 (see FIG. 20), a charged particle beam 10a1b5 (see FIG. 20) having a triangular horizontal sectional shape is passed through the opening 10a1m' (see FIG. 20) of the second forming aperture member 10a1m (see FIG. 20). Accordingly, a triangular pattern Pe (see FIG. 21) is drawn on the workpiece M (see FIG. 21) by the charged particle beam 10a1b5 (see FIG. 20) passed through the opening 10a1m' (see FIG. 20) of the second forming aperture member 10a1m (see FIG. 20). Position difference amount to minus side (left side of FIG. 21) of X axis of the triangular pattern Pe (see FIG. 21) with respect to the second standard point O' (see FIG. 21) on the workpiece M (see FIG. 21) corresponding to the first standard point O (see FIG. 20) on the second forming aperture member 10a1m (see FIG. 20) is Δx5' (see FIG. 21), and position difference amount to minus side (lower side of FIG. 21) of Y axis of the triangular pattern Pe (see FIG. 21) with respect to the second standard point O' (see FIG. 21) on the workpiece M (see FIG. 21) corresponding to the first standard point O (see FIG. 20) on the second forming aperture member 10a1m (see FIG. 20) is Δy5' (see FIG. 21).

Figure 22A:
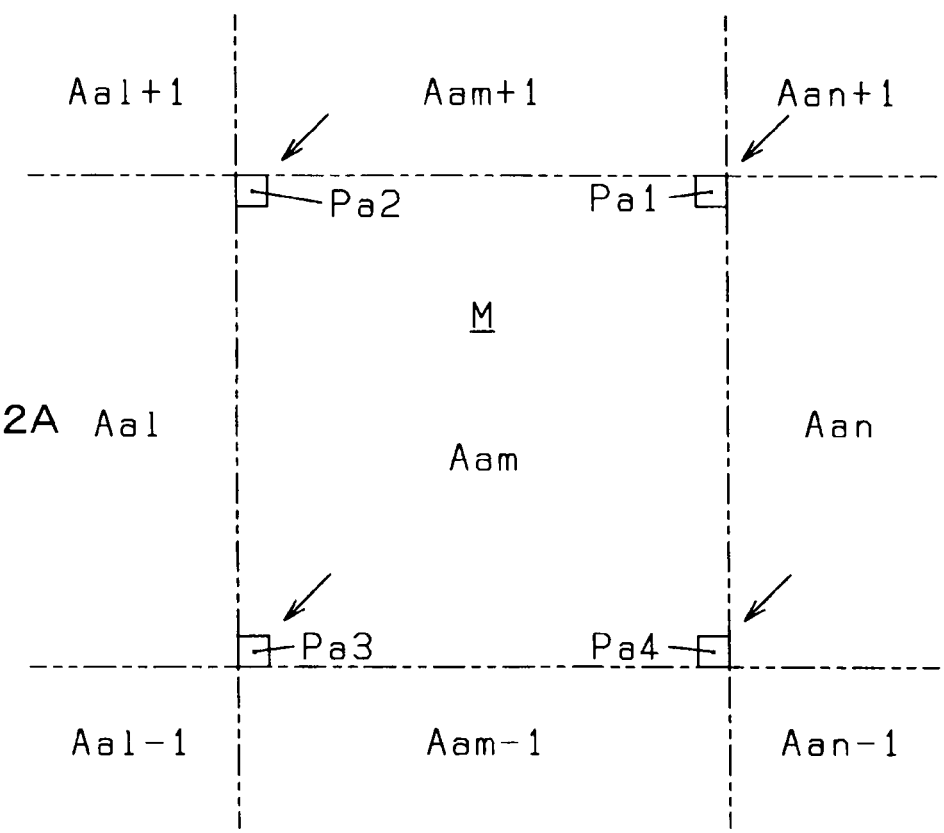
FIGS. 22A and 22B show cancel of position difference $\Delta x1'$ in X direction and position difference $\Delta y1'$ in Y direction of patterns Pa1, Pa2, Pa3, Pa4 respectively corresponding to figures FGa1, FGa2, FGa3, FGa4, performed by the charged particle beam drawing apparatus 10 of the third embodiment.
Figure 22B:
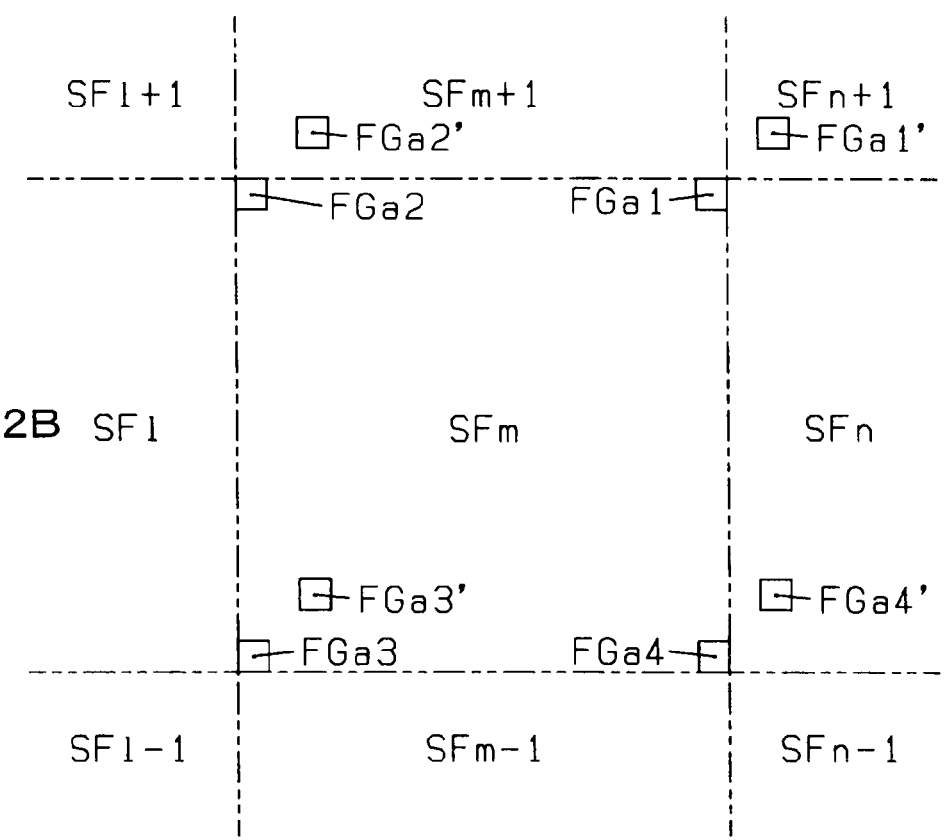
Figure 23A:
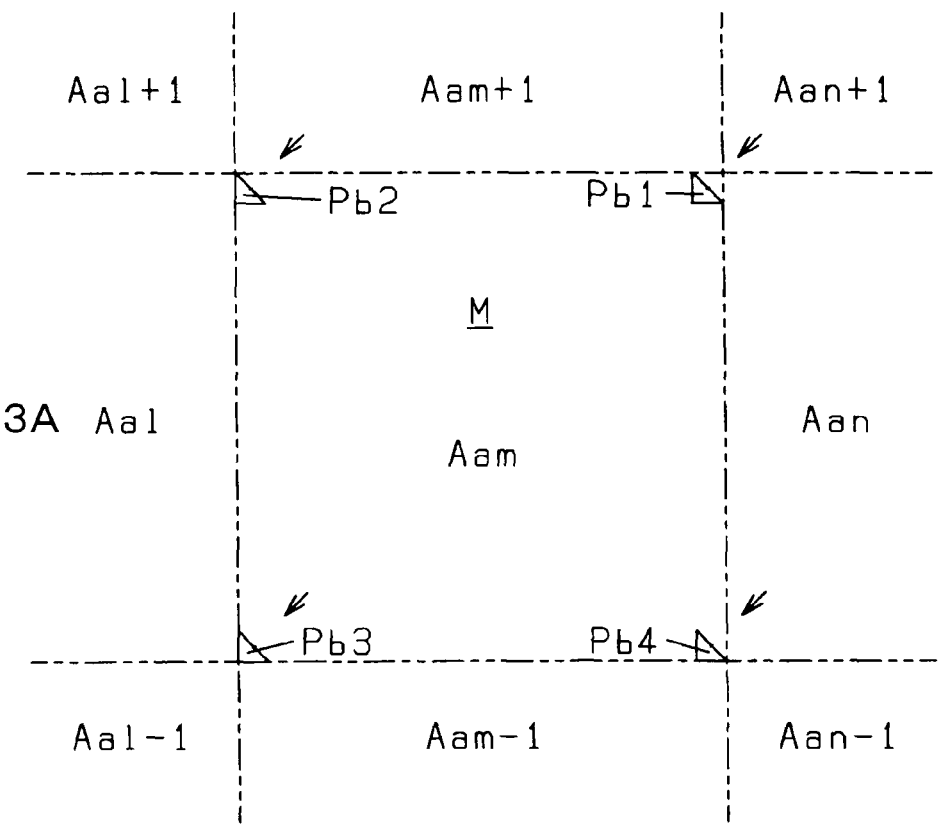
FIGS. 23A and 23B show cancel of position difference $\Delta x2'$ in X direction and position difference $\Delta y2'$ in Y direction of patterns Pb1, Pb2, Pb3, Pb4 respectively corresponding to figures FGb1, FGb2, FGb3, FGb4, performed by the charged particle beam drawing apparatus 10 of the third embodiment.
Figure 23B:
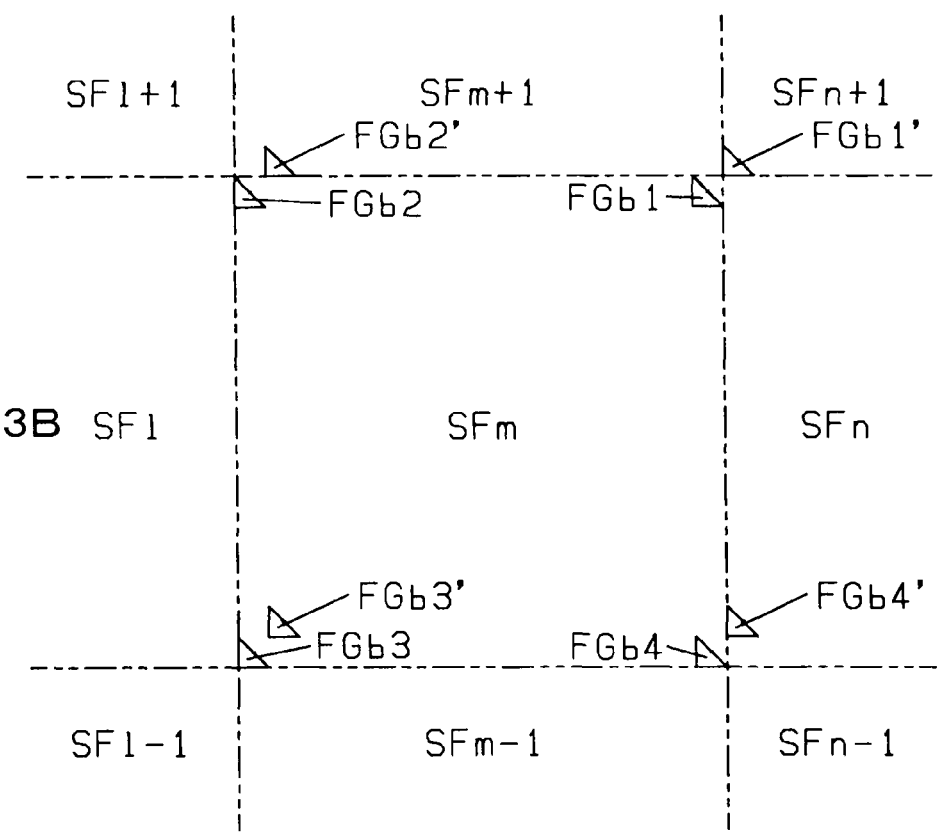
Figure 24A:
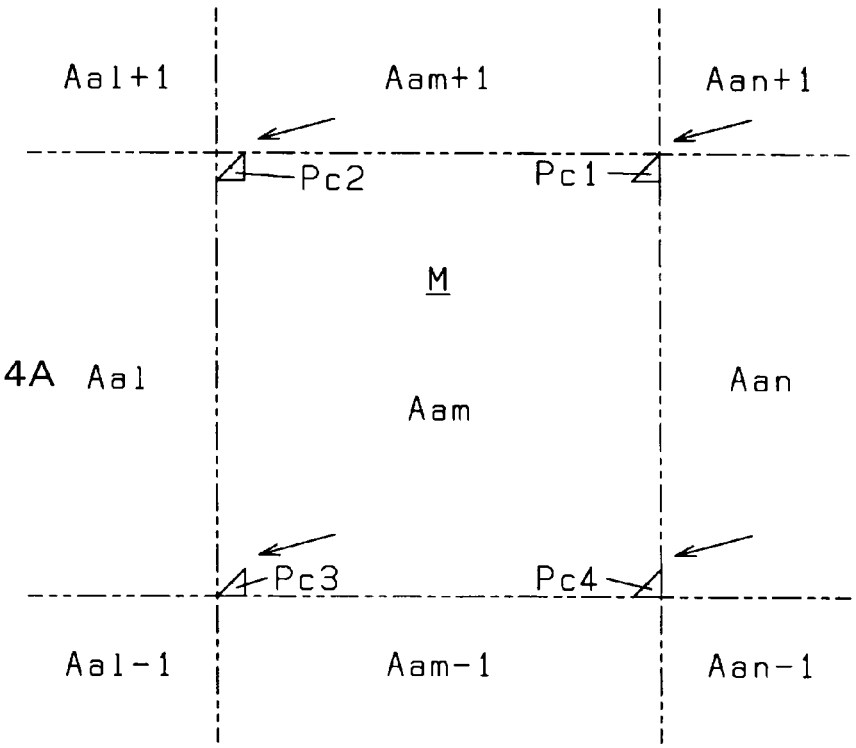
FIGS. 24A and 24B show cancel of position difference $\Delta x3'$ in X direction and position difference $\Delta y3'$ in Y direction of patterns Pc1, Pc2, Pc3, Pc4 respectively corresponding to figures FGc1, FGc2, FGc3, FGc4, performed by the charged particle beam drawing apparatus 10 of the third embodiment.
Figure 24B:
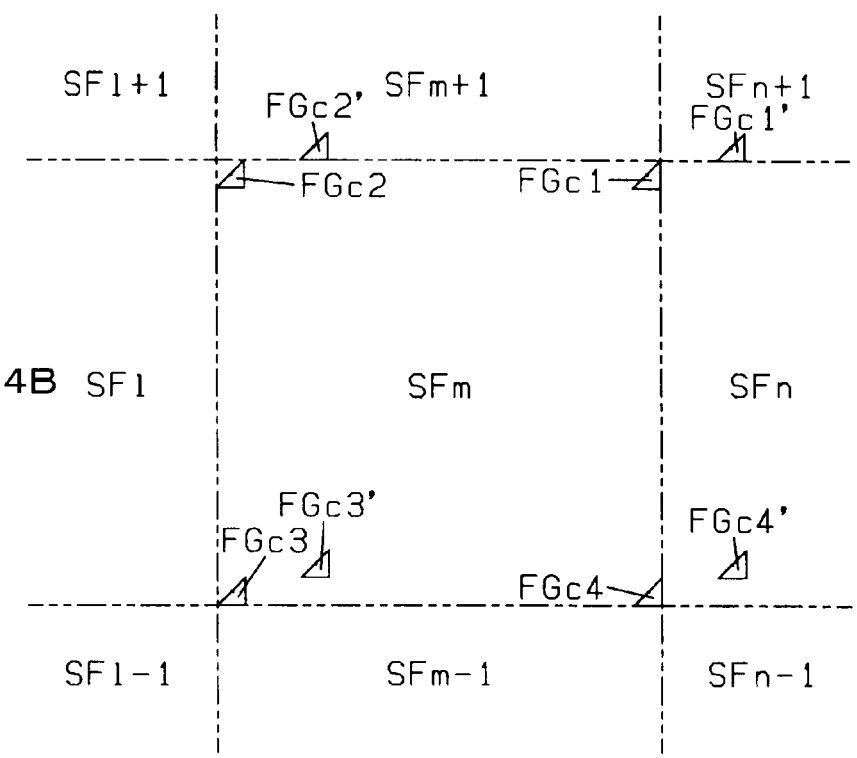
Figure 25A:
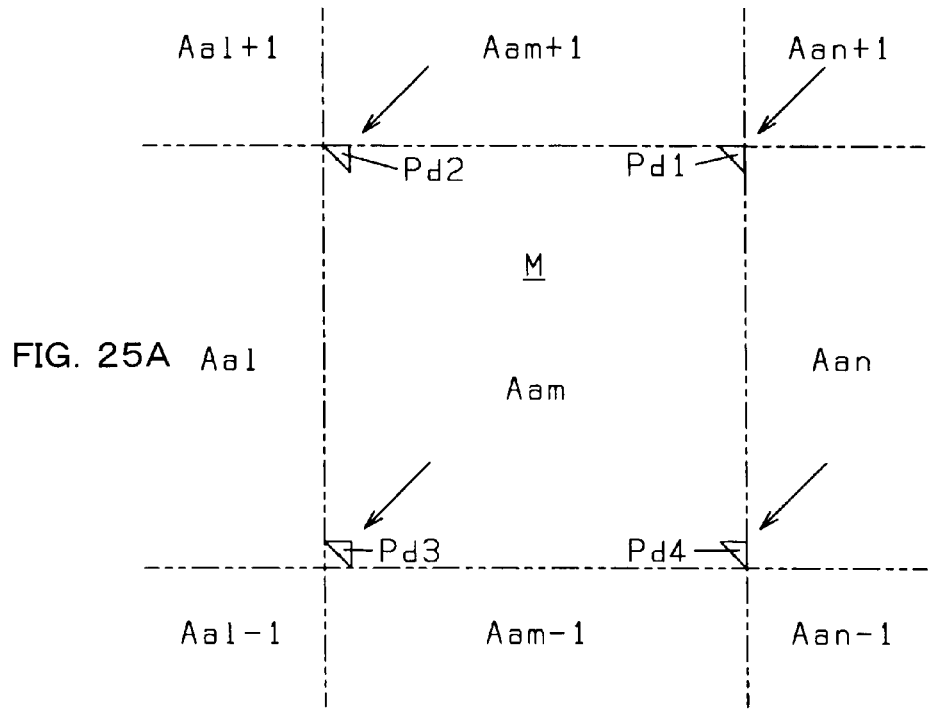
FIGS. 25A and 25B show cancel of position difference $\Delta x4'$ in X direction and position difference $\Delta y4'$ in Y direction of patterns Pd1, Pd2, Pd3, Pd4 respectively corresponding to figures FGd1, FGd2, FGd3, FGd4, performed by the charged particle beam drawing apparatus 10 of the third embodiment.
Figure 25B:
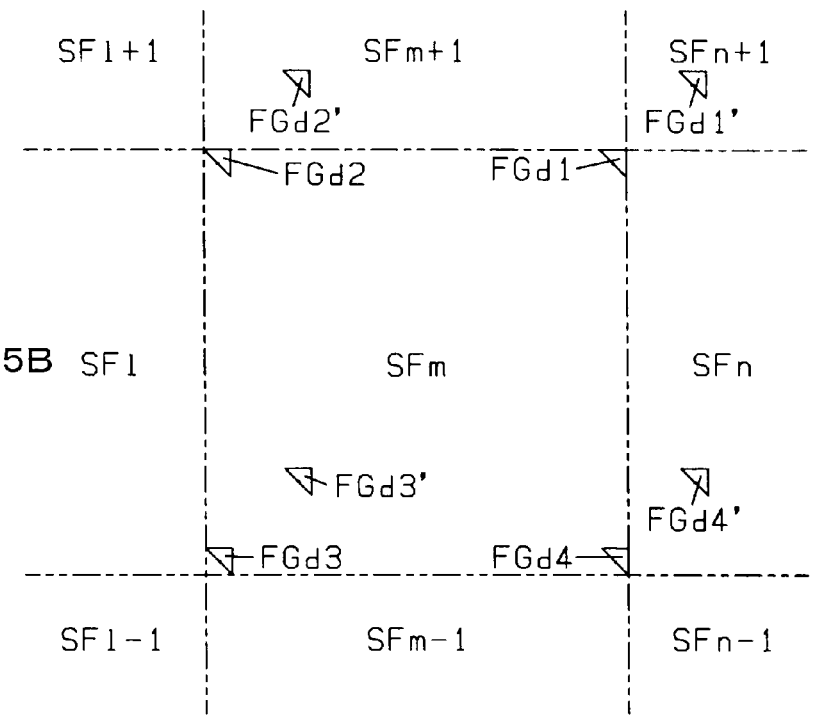
Figure 26A:
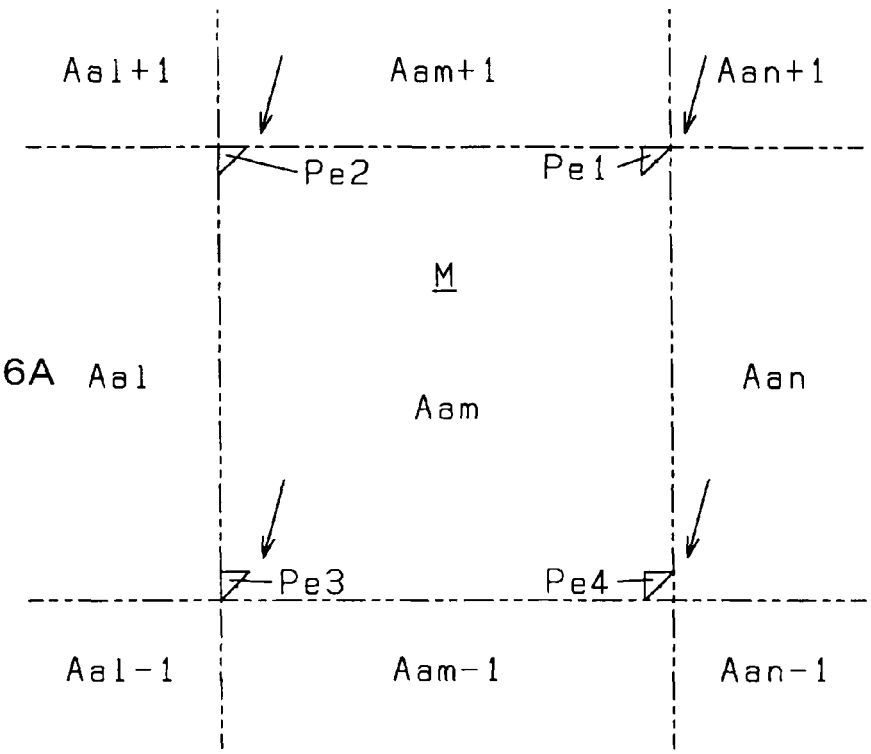
FIGS. 26A and 26B show cancel of position difference $\Delta x5'$ in X direction and position difference $\Delta y5'$ in Y direction of patterns Pe1, Pe2, Pe3, Pe4 respectively corresponding to figures FGe1, FGe2, FGe3, FGe4, performed by the charged particle beam drawing apparatus 10 of the third embodiment.
Figure 26B:
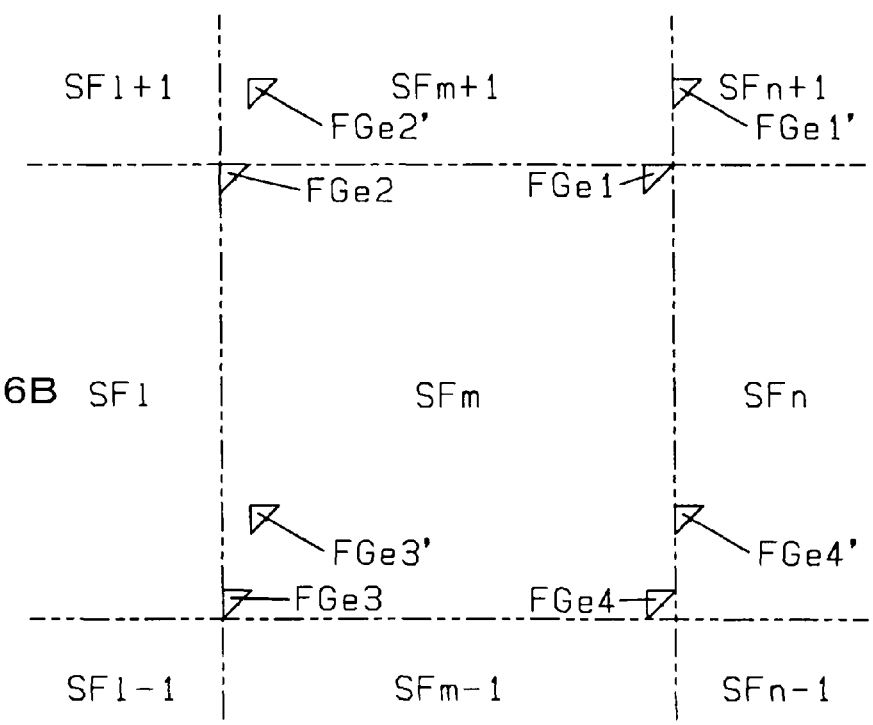

FIGS. 22A and 22B show cancel of position difference Δx1' in X direction and position difference Δy1' in Y direction of patterns Pa1, Pa2, Pa3, Pa4 respectively corresponding to figures FGa1, FGa2, FGa3, FGa4, performed by the charged particle beam drawing apparatus 10 of the third embodiment. FIGS. 23A and 23B show cancel of position difference Δx2' in X direction and position difference Δy2' in Y direction of patterns Pb1, Pb2, Pb3, Pb4 respectively corresponding to figures FGb1, FGb2, FGb3, FGb4, performed by the charged particle beam drawing apparatus 10 of the third embodiment. FIGS. 24A and 24B show cancel of position difference Δx3' in X direction and position difference Δy3' in Y direction of patterns Pc1, Pc2, Pc3, Pc4 respectively corresponding to figures FGc1, FGc2, FGc3, FGc4, performed by the charged particle beam drawing apparatus 10 of the third embodiment. FIGS. 25A and 25B show cancel of position difference Δx4' in X direction and position difference Δy4' in Y direction of patterns Pd1, Pd2, Pd3, Pd4 respectively corresponding to figures FGd1, FGd2, FGd3, FGd4, performed by the charged particle beam drawing apparatus 10 of the third embodiment. FIGS. 26A and 26B show cancel of position difference Δx5' in X direction and position difference Δy5' in Y direction of patterns Pe1, Pe2, Pe3, Pe4 respectively corresponding to figures FGe1, FGe2, FGe3, FGe4, performed by the charged particle beam drawing apparatus 10 of the third embodiment.

In detail, FIGS. 22A and 22B show an example wherein patterns Pa1, Pa2, Pa3, Pa4 are drawn at 4 corners in limit area Aam in the charged particle beam drawing apparatus 10 of the third embodiment. In the charged particle beam drawing apparatus 10 of the third embodiment, a subfield SFm (see FIG. 22B) is formed in the drawing data D (see FIG. 1) by the control computer 10b1 (see FIG. 1) of the control portion 10b (see FIG. 1), size of the subfield SFm corresponding to size of area Aam (see FIG. 22A) on the workpiece M (see FIG. 22A). Similarly, subfields SFl−1, SFl, SFl+1, SFm−1, SFm+1, SFn−1, SFn, SFn+1 (see FIG. 22B) are formed in the drawing data D (see FIG. 1) by the control computer 10b1 (see FIG. 1) of the control portion 10b (see FIG. 1), size of the subfields SFl−1, SFl, SFl+1, SFm−1, SFm+1, SFn−1, SFn, SFn+1 respectively corresponding to size of area Aal−1, Aal, Aal+1, Aam−1, Aam+1, Aan−1, Aan, Aan+1 (see FIG. 22A) on the workpiece M (see FIG. 22A).

In the example shown in FIGS. 22A and 22B, patterns Pa1, Pa2, Pa3, Pa4 (see FIG. 22A) respectively corresponding to figures FGa1, FGa2, FGa3, FGa4 (see FIG. 22B) in the subfield SFm (see FIG. 22B) are drawn at 4 corners of limit area Aam (see FIG. 22A) on the workpiece M (see FIG. 22A) by the charged particle beam 10a1b1 (see FIG. 20) having square horizontal sectional shape, passed through the opening 10a1m' (see FIG. 20) of the second forming aperture member 10a1m (see FIG. 20). As mentioned above, in fact, when a rectangular (square or oblong) pattern is drawn, the process shown in FIGS. 22A and 22B is not performed, but the charged particle beam 10a1b (see FIG. 2A) passed through the left lower end portion of the left lower area 10a1m3' (see FIG. 7A) of the opening 10a1m' (see FIG. 7A) of the second forming aperture member 10a1m (see FIG. 7A) is used, therefore, cancel process of position difference is performed.

As shown in FIGS. 20 and 21, the pattern Pa (see FIG. 21) drawn by the charged particle beam 10a1b1 (see FIG. 20) having square horizontal sectional shape, passed through the opening 10a1m' (see FIG. 20) of the second forming aperture member 10a1m (see FIG. 20) has position difference Δx1' (see FIG. 21) in X direction and position difference Δy1' (see FIG. 21) in Y direction. Therefore, in the example shown in FIGS. 22A and 22B, cancel process of position difference is performed with respect to patterns Pa1, Pa2, Pa3, Pa4 (see FIG. 22A) drawn by the charged particle beam 10a1b1 (see FIG. 20) having square horizontal sectional shape, passed through the opening 10a1m' (see FIG. 20) of the second forming aperture member 10a1m (see FIG. 20).

In detail, in the charged particle beam drawing apparatus 10 of the third embodiment, figures FGa1, FGa2, FGa3, FGa4 (see FIG. 22B) in subfield SFm (see FIG. 22B) is judged to correspond to the pattern Pa (see FIG. 21) drawn by the charged particle beam 10a1b1 (see FIG. 20) having square horizontal sectional shape, passed through the opening 10a1m' (see FIG. 20) of the second forming aperture member 10a1m (see FIG. 20).

In the charged particle beam drawing apparatus 10 of the third embodiment, drawing data correcting process is performed to cancel position difference Δx1' (see FIG. 21) in X direction and position difference Δy1' (see FIG. 21) in Y direction, wherein the position difference Δx1' (see FIG. 21) in X direction and the position difference Δy1' (see FIG. 21) in Y direction occur when the pattern Pa (see FIG. 21) is drawn. In detail, figures FGa1, FGa2, FGa3, FGa4 (see FIG. 22B) in the subfield SFm (see FIG. 22B) in the drawing data D (see FIG. 1) are moved to plus side (right side of FIG. 22B) of X axis and to plus side (upper side of FIG. 22B) of Y axis, wherein amount of movement to plus side (right side of FIG. 22B) of X axis corresponds to the position difference Δx1' (see FIG. 21) in X direction, and amount of movement to plus side (upper side of FIG. 22B) of Y axis corresponds to the position difference Δy1' (see FIG. 21) in Y direction. Consequently, figures FGa1', FGa2', FGa3', FGa4' (see FIG. 22B) are prepared in the drawing data D (see FIG. 1), after drawing data correcting process is performed with respect to figures FGa1, FGa2, FGa3, FGa4 (see FIG. 22B).

Then, in the charged particle beam drawing apparatus 10 of the third embodiment, patterns Pa1, Pa2, Pa3, Pa4 (see FIG. 22A) are drawn by the charged particle beam 10a1b1 (see FIG. 20) having square horizontal sectional shape, passed the opening 10a1m' (see FIG. 20) of the second forming aperture member 10a1m (see FIG. 20), on the basis of figures FGa1', FGa2', FGa3', FGa4' (see FIG. 22B) prepared by the drawing data correcting process. When patterns Pa1, Pa2, Pa3, Pa4 (see FIG. 22A) are drawn, position difference Δx1' (see FIG. 21) in X direction and position difference Δy1' (see FIG. 21) in Y direction occur, as shown by arrows in FIG. 22A. Consequently, patterns Pa1, Pa2, Pa3, Pa4 (see FIG. 22A) are drawn at 4 corners in limit area Aam (see FIG. 22A) on the workpiece M (see FIG. 22A).

In detail, in the charged particle beam drawing apparatus 10 of the third embodiment, when patterns corresponding to figures included in subfield SFm (see FIG. 22B) are drawn, the pattern Pa1 (see FIG. 22A) corresponding to the figure FGa1' (see FIG. 22B) is not drawn. But, when patterns corresponding to figures included in subfield SFn+1 (see FIG. 22B) are drawn, the pattern Pa1 (see FIG. 22A) corresponding to the figure FGa1' (see FIG. 22B) is drawn after drawing data correcting process is performed with respect to the figure FGa1 (see FIG. 22B). Consequently, in the charged particle beam drawing apparatus 10 of the third embodiment, the pattern Pa1 (see FIG. 22A) is drawn at a right upper corner in the limit area Aam (see FIG. 22A) by the charged particle beam 10a1b1 (see FIG. 20) without a distortion of the pattern Pa1 (see FIG. 22A), wherein the limit area Aam (see FIG. 22A) is larger than the area Af (see FIG. 11B).

In the charged particle beam drawing apparatus 10 of the third embodiment, when patterns corresponding to figures included in subfield SFm (see FIG. 22B) are drawn, the pattern Pa2 (see FIG. 22A) corresponding to the figure FGa2' (see FIG. 22B) is not drawn. But, when patterns corresponding to figures included in subfield SFm+1 (see FIG. 22B) are drawn, the pattern Pa2 (see FIG. 22A) corresponding to the figure FGa2' (see FIG. 22B) is drawn after drawing data correcting process is performed with respect to the figure FGa2 (see FIG. 22B). Consequently, in the charged particle beam drawing apparatus 10 of the third embodiment, the pattern Pa2 (see FIG. 22A) is drawn at a left upper corner in the limit area Aam (see FIG. 22A) by the charged particle beam 10a1b1 (see FIG. 20) without a distortion of the pattern Pa2 (see FIG. 22A), wherein the limit area Aam (see FIG. 22A) is larger than the area Af (see FIG. 11B).

In the charged particle beam drawing apparatus 10 of the third embodiment, when patterns corresponding to figures included in subfield SFm (see FIG. 22B) are drawn, the pattern Pa3 (see FIG. 22A) corresponding to the figure FGa3' (see FIG. 22B) is drawn after drawing data correcting process is performed with respect to the figure FGa3 (see FIG. 22B). Consequently, in the charged particle beam drawing apparatus 10 of the third embodiment, the pattern Pa3 (see FIG. 22A) is drawn at a left lower corner in the limit area Aam (see FIG. 22A) by the charged particle beam 10a1b1 (see FIG. 20) without a distortion of the pattern Pa3 (see FIG. 22A), wherein the limit area Aam (see FIG. 22A) is larger than the area Af (see FIG. 11B).

In the charged particle beam drawing apparatus 10 of the third embodiment, when patterns corresponding to figures included in subfield SFm (see FIG. 22B) are drawn, the pattern Pa4 (see FIG. 22A) corresponding to the figure FGa4' (see FIG. 22B) is not drawn. But, when patterns corresponding to figures included in subfield SFn (see FIG. 22B) are drawn, the pattern Pa4 (see FIG. 22A) corresponding to the figure FGa4' (see FIG. 22B) is drawn after drawing data correcting process is performed with respect to the figure FGa4 (see FIG. 22B). Consequently, in the charged particle beam drawing apparatus 10 of the third embodiment, the pattern Pa4 (see FIG. 22A) is drawn at a right lower corner in the limit area Aam (see FIG. 22A) by the charged particle beam 10a1b1 (see FIG. 20) without a distortion of the pattern Pa4 (see FIG. 22A), wherein the limit area Aam (see FIG. 22A) is larger than the area Af (see FIG. 11B).

FIGS. 23A and 23B show an example wherein patterns Pb1, Pb2, Pb3, Pb4 are drawn at 4 corners in limit area Aam in the charged particle beam drawing apparatus 10 of the third embodiment.

In the example shown in FIGS. 23A and 23B, patterns Pb1, Pb2, Pb3, Pb4 (see FIG. 23A) respectively corresponding to figures FGb1, FGb2, FGb3, FGb4 (see FIG. 23B) in the subfield SFm (see FIG. 23B) are drawn at 4 corners of limit area Aam (see FIG. 23A) on the workpiece M (see FIG. 23A) by the charged particle beam 10a1b2 (see FIG. 20) having triangular horizontal sectional shape, passed through the opening 10a1m' (see FIG. 20) of the second forming aperture member 10a1m (see FIG. 20).

As shown in FIGS. 20 and 21, the pattern Pb (see FIG. 21) drawn by the charged particle beam 10a1b2 (see FIG. 20) having triangular horizontal sectional shape, passed through the opening 10a1m' (see FIG. 20) of the second forming aperture member 10a1m (see FIG. 20) has position difference Δx2' (see FIG. 21) in X direction and position difference Δy2' (see FIG. 21) in Y direction. Therefore, in the example shown in FIGS. 23A and 23B, cancel process of position difference is performed with respect to patterns Pb1, Pb2, Pb3, Pb4 (see FIG. 23A) drawn by the charged particle beam 10a1b2 (see FIG. 20) having triangular horizontal sectional shape, passed through the opening 10a1m' (see FIG. 20) of the second forming aperture member 10a1m (see FIG. 20).

In detail, in the charged particle beam drawing apparatus 10 of the third embodiment, figures FGb1, FGb2, FGb3, FGb4 (see FIG. 23B) in subfield SFm (see FIG. 23B) is judged to correspond to the pattern Pb (see FIG. 21) drawn by the charged particle beam 10a1b2 (see FIG. 20) having triangular horizontal sectional shape, passed through the opening 10a1m' (see FIG. 20) of the second forming aperture member 10a1m (see FIG. 20).

In the charged particle beam drawing apparatus 10 of the third embodiment, drawing data correcting process is performed to cancel position difference Δx2' (see FIG. 21) in X direction and position difference Δy2' (see FIG. 21) in Y direction, wherein the position difference Δx2' (see FIG. 21) in X direction and the position difference Δy2' (see FIG. 21) in Y direction occur when the pattern Pb (see FIG. 21) is drawn. In detail, figures FGb1, FGb2, FGb3, FGb4 (see FIG. 23B) in the subfield SFm (see FIG. 23B) in the drawing data D (see FIG. 1) are moved to plus side (right side of FIG. 23B) of X axis and to plus side (upper side of FIG. 23B) of Y axis, wherein amount of movement to plus side (right side of FIG. 23B) of X axis corresponds to the position difference Δx2' (see FIG. 21) in X direction, and amount of movement to plus side (upper side of FIG. 23B) of Y axis corresponds to the position difference Δy2' (see FIG. 21) in Y direction. Consequently, figures FGb1', FGb2', FGb3', FGb4' (see FIG. 23B) are prepared in the drawing data D (see FIG. 1), after drawing data correcting process is performed with respect to figures FGb1, FGb2, FGb3, FGb4 (see FIG. 23B).

Then, in the charged particle beam drawing apparatus 10 of the third embodiment, patterns Pb1, Pb2, Pb3, Pb4 (see FIG. 23A) are drawn by the charged particle beam 10a1b2 (see FIG. 20) having triangular horizontal sectional shape, passed the opening 10a1m' (see FIG. 20) of the second forming aperture member 10a1m (see FIG. 20), on the basis of figures FGb1', FGb2', FGb3', FGb4' (see FIG. 23B) prepared by the drawing data correcting process. When patterns Pb1, Pb2, Pb3, Pb4 (see FIG. 23A) are drawn, position difference Δx2' (see FIG. 21) in X direction and position difference Δy2' (see FIG. 21) in Y direction occur, as shown by arrows in FIG. 23A. Consequently, patterns Pb1, Pb2, Pb3, Pb4 (see FIG. 23A) are drawn at 4 corners in limit area Aam (see FIG. 23A) on the workpiece M (see FIG. 23A).

In detail, in the charged particle beam drawing apparatus 10 of the third embodiment, when patterns corresponding to figures included in subfield SFm (see FIG. 23B) are drawn, the pattern Pb1 (see FIG. 23A) corresponding to the figure FGb1' (see FIG. 23B) is not drawn. But, when patterns corresponding to figures included in subfield SFn+1 (see FIG. 23B) are drawn, the pattern Pb1 (see FIG. 23A) corresponding to the figure FGb1' (see FIG. 23B) is drawn after drawing data correcting process is performed with respect to the figure FGb1 (see FIG. 23B). Consequently, in the charged particle beam drawing apparatus 10 of the third embodiment, the pattern Pb1 (see FIG. 23A) is drawn at a right upper corner in the limit area Aam (see FIG. 23A) by the charged particle beam 10a1b2 (see FIG. 20) without a distortion of the pattern Pb1 (see FIG. 23A), wherein the limit area Aam (see FIG. 23A) is larger than the area Af (see FIG. 11B).

In the charged particle beam drawing apparatus 10 of the third embodiment, when patterns corresponding to figures included in subfield SFm (see FIG. 23B) are drawn, the pattern Pb2 (see FIG. 23A) corresponding to the figure FGb2' (see FIG. 23B) is not drawn. But, when patterns corresponding to figures included in subfield SFm+1 (see FIG. 23B) are drawn, the pattern Pb2 (see FIG. 23A) corresponding to the figure FGb2' (see FIG. 23B) is drawn after drawing data correcting process is performed with respect to the figure FGb2 (see FIG. 23B). Consequently, in the charged particle beam drawing apparatus 10 of the third embodiment, the pattern Pb2 (see FIG. 23A) is drawn at a left upper corner in the limit area Aam (see FIG. 23A) by the charged particle beam 10a1b2 (see FIG. 20) without a distortion of the pattern Pb2 (see FIG. 23A), wherein the limit area Aam (see FIG. 23A) is larger than the area Af (see FIG. 11B).

In the charged particle beam drawing apparatus 10 of the third embodiment, when patterns corresponding to figures included in subfield SFm (see FIG. 23B) are drawn, the pattern Pb3 (see FIG. 23A) corresponding to the figure FGb3' (see FIG. 23B) is drawn after drawing data correcting process is performed with respect to the figure FGb3 (see FIG. 23B). Consequently, in the charged particle beam drawing apparatus 10 of the third embodiment, the pattern Pb3 (see FIG. 23A) is drawn at a left lower corner in the limit area Aam (see FIG. 23A) by the charged particle beam 10a1b2 (see FIG. 20) without a distortion of the pattern Pb3 (see FIG. 23A), wherein the limit area Aam (see FIG. 23A) is larger than the area Af (see FIG. 11B).

In the charged particle beam drawing apparatus 10 of the third embodiment, when patterns corresponding to figures included in subfield SFm (see FIG. 23B) are drawn, the pattern Pb4 (see FIG. 23A) corresponding to the figure FGb4' (see FIG. 23B) is not drawn. But, when patterns corresponding to figures included in subfield SFn (see FIG. 23B) are drawn, the pattern Pb4 (see FIG. 23A) corresponding to the figure FGb4' (see FIG. 23B) is drawn after drawing data correcting process is performed with respect to the figure FGb4 (see FIG. 23B). Consequently, in the charged particle beam drawing apparatus 10 of the third embodiment, the pattern Pb4 (see FIG. 23A) is drawn at a right lower corner in the limit area Aam (see FIG. 23A) by the charged particle beam 10a1b2 (see FIG. 20) without a distortion of the pattern Pb4 (see FIG. 23A), wherein the limit area Aam (see FIG. 23A) is larger than the area Af (see FIG. 11B).

FIGS. 24A and 24B show an example wherein patterns Pc1, Pc2, Pc3, Pc4 are drawn at 4 corners in limit area Aam in the charged particle beam drawing apparatus 10 of the third embodiment.

In the example shown in FIGS. 24A and 24B, patterns Pc1, Pc2, Pc3, Pc4 (see FIG. 24A) respectively corresponding to figures FGc1, FGc2, FGc3, FGc4 (see FIG. 24B) in the subfield SFm (see FIG. 24B) are drawn at 4 corners of limit area Aam (see FIG. 24A) on the workpiece M (see FIG. 24A) by the charged particle beam 10a1b3 (see FIG. 20) having triangular horizontal sectional shape, passed through the opening 10a1m' (see FIG. 20) of the second forming aperture member 10a1m (see FIG. 20).

As shown in FIGS. 20 and 21, the pattern Pc (see FIG. 21) drawn by the charged particle beam 10a1b3 (see FIG. 20) having triangular horizontal sectional shape, passed through the opening 10a1m' (see FIG. 20) of the second forming aperture member 10a1m (see FIG. 20) has position difference Δx3' (see FIG. 21) in X direction and position difference Δy3' (see FIG. 21) in Y direction. Therefore, in the example shown in FIGS. 24A and 24B, cancel process of position difference is performed with respect to patterns Pc1, Pc2, Pc3, Pc4 (see FIG. 24A) drawn by the charged particle beam 10a1b3 (see FIG. 20) having triangular horizontal sectional shape, passed through the opening 10a1m' (see FIG. 20) of the second forming aperture member 10a1m (see FIG. 20).

In detail, in the charged particle beam drawing apparatus 10 of the third embodiment, figures FGc1, FGc2, FGc3, FGc4 (see FIG. 24B) in subfield SFm (see FIG. 24B) is judged to correspond to the pattern Pc (see FIG. 21) drawn by the charged particle beam 10a1b3 (see FIG. 20) having triangular horizontal sectional shape, passed through the opening 10a1m' (see FIG. 20) of the second forming aperture member 10a1m (see FIG. 20).

In the charged particle beam drawing apparatus 10 of the third embodiment, drawing data correcting process is performed to cancel position difference Δx3' (see FIG. 21) in X direction and position difference Δy3' (see FIG. 21) in Y direction, wherein the position difference Δx3' (see FIG. 21) in X direction and the position difference Δy3' (see FIG. 21) in Y direction occur when the pattern Pc (see FIG. 21) is drawn. In detail, figures FGc1, FGc2, FGc3, FGc4 (see FIG. 24B) in the subfield SFm (see FIG. 24B) in the drawing data D (see FIG. 1) are moved to plus side (right side of FIG. 24B) of X axis and to plus side (upper side of FIG. 24B) of Y axis, wherein amount of movement to plus side (right side of FIG. 24B) of X axis corresponds to the position difference Δx3' (see FIG. 21) in X direction, and amount of movement to plus side (upper side of FIG. 24B) of Y axis corresponds to the position difference Δy3' (see FIG. 21) in Y direction. Consequently, figures FGc1', FGc2', FGc3', FGc4' (see FIG. 24B) are prepared in the drawing data D (see FIG. 1), after drawing data correcting process is performed with respect to figures FGc1, FGc2, FGc3, FGc4 (see FIG. 24B).

Then, in the charged particle beam drawing apparatus 10 of the third embodiment, patterns Pc1, Pc2, Pc3, Pc4 (see FIG. 24A) are drawn by the charged particle beam 10a1b3 (see FIG. 20) having triangular horizontal sectional shape, passed the opening 10a1m' (see FIG. 20) of the second forming aperture member 10a1m (see FIG. 20), on the basis of figures FGc1', FGc2', FGc3', FGc4' (see FIG. 24B) prepared by the drawing data correcting process. When patterns Pc1, Pc2, Pc3, Pc4 (see FIG. 24A) are drawn, position difference Δx3' (see FIG. 21) in X direction and position difference Δy3' (see FIG. 21) in Y direction occur, as shown by arrows in FIG. 24A. Consequently, patterns Pc1, Pc2, Pc3, Pc4 (see FIG. 24A) are drawn at 4 corners in limit area Aam (see FIG. 24A) on the workpiece M (see FIG. 24A).

In detail, in the charged particle beam drawing apparatus 10 of the third embodiment, when patterns corresponding to figures included in subfield SFm (see FIG. 24B) are drawn, the pattern Pc1 (see FIG. 24A) corresponding to the figure FGc1' (see FIG. 24B) is not drawn. But, when patterns corresponding to figures included in subfield SFn+1 (see FIG. 24B) are drawn, the pattern Pc1 (see FIG. 24A) corresponding to the figure FGc1' (see FIG. 24B) is drawn after drawing data correcting process is performed with respect to the figure FGc1 (see FIG. 24B). Consequently, in the charged particle beam drawing apparatus 10 of the third embodiment, the pattern Pc1 (see FIG. 24A) is drawn at a right upper corner in the limit area Aam (see FIG. 24A) by the charged particle beam 10a1b3 (see FIG. 20) without a distortion of the pattern Pc1 (see FIG. 24A), wherein the limit area Aam (see FIG. 24A) is larger than the area Af (see FIG. 11B).

In the charged particle beam drawing apparatus 10 of the third embodiment, when patterns corresponding to figures included in subfield SFm (see FIG. 24B) are drawn, the pattern Pc2 (see FIG. 24A) corresponding to the figure FGc2' (see FIG. 24B) is not drawn. But, when patterns corresponding to figures included in subfield SFm+1 (see FIG. 24B) are drawn, the pattern Pc2 (see FIG. 24A) corresponding to the figure FGc2' (see FIG. 24B) is drawn after drawing data correcting process is performed with respect to the figure FGc2 (see FIG. 24B). Consequently, in the charged particle beam drawing apparatus 10 of the third embodiment, the pattern Pc2 (see FIG. 24A) is drawn at a left upper corner in the limit area Aam (see FIG. 24A) by the charged particle beam 10a1b3 (see FIG. 20) without a distortion of the pattern Pc2 (see FIG. 24A), wherein the limit area Aam (see FIG. 24A) is larger than the area Af (see FIG. 11B).

In the charged particle beam drawing apparatus 10 of the third embodiment, when patterns corresponding to figures included in subfield SFm (see FIG. 24B) are drawn, the pattern Pc3 (see FIG. 24A) corresponding to the figure FGc3' (see FIG. 24B) is drawn after drawing data correcting process is performed with respect to the figure FGc3 (see FIG. 24B). Consequently, in the charged particle beam drawing apparatus 10 of the third embodiment, the pattern Pc3 (see FIG. 24A) is drawn at a left lower corner in the limit area Aam (see FIG. 24A) by the charged particle beam 10a1b3 (see FIG. 20) without a distortion of the pattern Pc3 (see FIG. 24A), wherein the limit area Aam (see FIG. 24A) is larger than the area Af (see FIG. 11B).

In the charged particle beam drawing apparatus 10 of the third embodiment, when patterns corresponding to figures included in subfield SFm (see FIG. 24B) are drawn, the pattern Pc4 (see FIG. 24A) corresponding to the figure FGc4' (see FIG. 24B) is not drawn. But, when patterns corresponding to figures included in subfield SFn (see FIG. 24B) are drawn, the pattern Pc4 (see FIG. 24A) corresponding to the figure FGc4' (see FIG. 24B) is drawn after drawing data correcting process is performed with respect to the figure FGc4 (see FIG. 24B). Consequently, in the charged particle beam drawing apparatus 10 of the third embodiment, the pattern Pc4 (see FIG. 24A) is drawn at a right lower corner in the limit area Aam (see FIG. 24A) by the charged particle beam 10a1b3 (see FIG. 20) without a distortion of the pattern Pc4 (see FIG. 24A), wherein the limit area Aam (see FIG. 24A) is larger than the area Af (see FIG. 11B).

FIGS. 25A and 25B show an example wherein patterns Pd1, Pd2, Pd3, Pd4 are drawn at 4 corners in limit area Aam in the charged particle beam drawing apparatus 10 of the third embodiment.

In the example shown in FIGS. 25A and 25B, patterns Pd1, Pd2, Pd3, Pd4 (see FIG. 25A) respectively corresponding to figures FGd1, FGd2, FGd3, FGd4 (see FIG. 25B) in the subfield SFm (see FIG. 25B) are drawn at 4 corners of limit area Aam (see FIG. 25A) on the workpiece M (see FIG. 25A) by the charged particle beam 10a1b4 (see FIG. 20) having triangular horizontal sectional shape, passed through the opening 10a1m' (see FIG. 20) of the second forming aperture member 10a1m (see FIG. 20).

As shown in FIGS. 20 and 21, the pattern Pd (see FIG. 21) drawn by the charged particle beam 10a1b4 (see FIG. 20) having triangular horizontal sectional shape, passed through the opening 10a1m' (see FIG. 20) of the second forming aperture member 10a1m (see FIG. 20) has position difference Δx4' (see FIG. 21) in X direction and position difference Δy4' (see FIG. 21) in Y direction. Therefore, in the example shown in FIGS. 25A and 25B, cancel process of position difference is performed with respect to patterns Pd1, Pd2, Pd3, Pd4 (see FIG. 25A) drawn by the charged particle beam 10a1b4 (see FIG. 20) having triangular horizontal sectional shape, passed through the opening 10a1m' (see FIG. 20) of the second forming aperture member 10a1m (see FIG. 20).

In detail, in the charged particle beam drawing apparatus 10 of the third embodiment, figures FGd1, FGd2, FGd3, FGd4 (see FIG. 25B) in subfield SFm (see FIG. 25B) is judged to correspond to the pattern Pd (see FIG. 21) drawn by the charged particle beam 10a1b4 (see FIG. 20) having triangular horizontal sectional shape, passed through the opening 10a1m' (see FIG. 20) of the second forming aperture member 10a1m (see FIG. 20).

In the charged particle beam drawing apparatus 10 of the third embodiment, drawing data correcting process is performed to cancel position difference Δx4' (see FIG. 21) in X direction and position difference Δy4' (see FIG. 21) in Y direction, wherein the position difference Δx4' (see FIG. 21) in X direction and the position difference Δy4' (see FIG. 21) in Y direction occur when the pattern Pd (see FIG. 21) is drawn. In detail, figures FGd1, FGd2, FGd3, FGd4 (see FIG. 25B) in the subfield SFm (see FIG. 25B) in the drawing data D (see FIG. 1) are moved to plus side (right side of FIG. 25B) of X axis and to plus side (upper side of FIG. 25B) of Y axis, wherein amount of movement to plus side (right side of FIG. 25B) of X axis corresponds to the position difference Δx4' (see FIG. 21) in X direction, and amount of movement to plus side (upper side of FIG. 25B) of Y axis corresponds to the position difference Δy4' (see FIG. 21) in Y direction. Consequently, figures FGd1', FGd2', FGd3', FGd4' (see FIG. 25B) are prepared in the drawing data D (see FIG. 1), after drawing data correcting process is performed with respect to figures FGd1, FGd2, FGd3, FGd4 (see FIG. 25B).

Then, in the charged particle beam drawing apparatus 10 of the third embodiment, patterns Pd1, Pd2, Pd3, Pd4 (see FIG. 25A) are drawn by the charged particle beam 10a1b4 (see FIG. 20) having triangular horizontal sectional shape, passed the opening 10a1m' (see FIG. 20) of the second forming aperture member 10a1m (see FIG. 20), on the basis of figures FGd1', FGd2', FGd3', FGd4' (see FIG. 25B) prepared by the drawing data correcting process. When patterns Pd1, Pd2, Pd3, Pd4 (see FIG. 25A) are drawn, position difference Δx4' (see FIG. 21) in X direction and position difference Δy4' (see FIG. 21) in Y direction occur, as shown by arrows in FIG. 25A. Consequently, patterns Pd1, Pd2, Pd3, Pd4 (see FIG. 25A) are drawn at 4 corners in limit area Aam (see FIG. 25A) on the workpiece M (see FIG. 25A).

In detail, in the charged particle beam drawing apparatus 10 of the third embodiment, when patterns corresponding to figures included in subfield SFm (see FIG. 25B) are drawn, the pattern Pd1 (see FIG. 25A) corresponding to the figure FGd1' (see FIG. 25B) is not drawn. But, when patterns corresponding to figures included in subfield SFn+1 (see FIG. 25B) are drawn, the pattern Pd1 (see FIG. 25A) corresponding to the figure FGd1' (see FIG. 25B) is drawn after drawing data correcting process is performed with respect to the figure FGd1 (see FIG. 25B). Consequently, in the charged particle beam drawing apparatus 10 of the third embodiment, the pattern Pd1 (see FIG. 25A) is drawn at a right upper corner in the limit area Aam (see FIG. 25A) by the charged particle beam 10a1b4 (see FIG. 20) without a distortion of the pattern Pd1 (see FIG. 25A), wherein the limit area Aam (see FIG. 25A) is larger than the area Af (see FIG. 11B).

In the charged particle beam drawing apparatus 10 of the third embodiment, when patterns corresponding to figures included in subfield SFm (see FIG. 25B) are drawn, the pattern Pd2 (see FIG. 25A) corresponding to the figure FGd2' (see FIG. 25B) is not drawn. But, when patterns corresponding to figures included in subfield SFm+1 (see FIG. 25B) are drawn, the pattern Pd2 (see FIG. 25A) corresponding to the figure FGd2' (see FIG. 25B) is drawn after drawing data correcting process is performed with respect to the figure FGd2 (see FIG. 25B). Consequently, in the charged particle beam drawing apparatus 10 of the third embodiment, the pattern Pd2 (see FIG. 25A) is drawn at a left upper corner in the limit area Aam (see FIG. 25A) by the charged particle beam 10a1b4 (see FIG. 20) without a distortion of the pattern Pd2 (see FIG. 25A), wherein the limit area Aam (see FIG. 25A) is larger than the area Af (see FIG. 11B).

In the charged particle beam drawing apparatus 10 of the third embodiment, when patterns corresponding to figures included in subfield SFm (see FIG. 25B) are drawn, the pattern Pd3 (see FIG. 25A) corresponding to the figure FGd3' (see FIG. 25B) is drawn after drawing data correcting process is performed with respect to the figure FGd3 (see FIG. 25B). Consequently, in the charged particle beam drawing apparatus 10 of the third embodiment, the pattern Pd3 (see FIG. 25A) is drawn at a left lower corner in the limit area Aam (see FIG. 25A) by the charged particle beam 10a1b4 (see FIG. 20) without a distortion of the pattern Pd3 (see FIG. 25A), wherein the limit area Aam (see FIG. 25A) is larger than the area Af (see FIG. 11B).

In the charged particle beam drawing apparatus 10 of the third embodiment, when patterns corresponding to figures included in subfield SFm (see FIG. 25B) are drawn, the pattern Pd4 (see FIG. 25A) corresponding to the figure FGd4' (see FIG. 25B) is not drawn. But, when patterns corresponding to figures included in subfield SFn (see FIG. 25B) are drawn, the pattern Pd4 (see FIG. 25A) corresponding to the figure FGd4' (see FIG. 25B) is drawn after drawing data correcting process is performed with respect to the figure FGd4 (see FIG. 25B). Consequently, in the charged particle beam drawing apparatus 10 of the third embodiment, the pattern Pd4 (see FIG. 25A) is drawn at a right lower corner in the limit area Aam (see FIG. 25A) by the charged particle beam 10a1b4 (see FIG. 20) without a distortion of the pattern Pd4 (see FIG. 25A), wherein the limit area Aam (see FIG. 25A) is larger than the area Af (see FIG. 11B).

FIGS. 26A and 26B show an example wherein patterns Pe1, Pe2, Pe3, Pe4 are drawn at 4 corners in limit area Aam in the charged particle beam drawing apparatus 10 of the third embodiment.

In the example shown in FIGS. 26A and 26B, patterns Pe1, Pe2, Pe3, Pe4 (see FIG. 26A) respectively corresponding to figures FGe1, FGe2, FGe3, FGe4 (see FIG. 26B) in the subfield SFm (see FIG. 26B) are drawn at 4 corners of limit area Aam (see FIG. 26A) on the workpiece M (see FIG. 26A) by the charged particle beam 10a1b5 (see FIG. 20) having triangular horizontal sectional shape, passed through the opening 10a1m' (see FIG. 20) of the second forming aperture member 10a1m (see FIG. 20).

As shown in FIGS. 20 and 21, the pattern Pe (see FIG. 21) drawn by the charged particle beam 10a1b5 (see FIG. 20) having triangular horizontal sectional shape, passed through the opening 10a1m' (see FIG. 20) of the second forming aperture member 10a1m (see FIG. 20) has position difference Δx5' (see FIG. 21) in X direction and position difference Δy5' (see FIG. 21) in Y direction. Therefore, in the example shown in FIGS. 26A and 26B, cancel process of position difference is performed with respect to patterns Pe1, Pe2, Pe3, Pe4 (see FIG. 26A) drawn by the charged particle beam 10a1b5 (see FIG. 20) having triangular horizontal sectional shape, passed through the opening 10a1m' (see FIG. 20) of the second forming aperture member 10a1m (see FIG. 20).

In detail, in the charged particle beam drawing apparatus 10 of the third embodiment, figures FGe1, FGe2, FGe3, FGe4 (see FIG. 26B) in subfield SFm (see FIG. 26B) is judged to correspond to the pattern Pe (see FIG. 21) drawn by the charged particle beam 10a1b5 (see FIG. 20) having triangular horizontal sectional shape, passed through the opening 10a1m' (see FIG. 20) of the second forming aperture member 10a1m (see FIG. 20).

In the charged particle beam drawing apparatus 10 of the third embodiment, drawing data correcting process is performed to cancel position difference Δx5' (see FIG. 21) in X direction and position difference Δy5' (see FIG. 21) in Y direction, wherein the position difference Δx5' (see FIG. 21) in X direction and the position difference Δy5' (see FIG. 21) in Y direction occur when the pattern Pe (see FIG. 21) is drawn. In detail, figures FGe1, FGe2, FGe3, FGe4 (see FIG. 26B) in the subfield SFm (see FIG. 26B) in the drawing data D (see FIG. 1) are moved to plus side (right side of FIG. 26B) of X axis and to plus side (upper side of FIG. 26B) of Y axis, wherein amount of movement to plus side (right side of FIG. 26B) of X axis corresponds to the position difference Δx5' (see FIG. 21) in X direction, and amount of movement to plus side (upper side of FIG. 26B) of Y axis corresponds to the position difference Δy5' (see FIG. 21) in Y direction. Consequently, figures FGe1', FGe2', FGe3', FGe4' (see FIG. 26B) are prepared in the drawing data D (see FIG. 1), after drawing data correcting process is performed with respect to figures FGe1, FGe2, FGe3, FGe4 (see FIG. 26B).

Then, in the charged particle beam drawing apparatus 10 of the third embodiment, patterns Pe1, Pe2, Pe3, Pe4 (see FIG. 26A) are drawn by the charged particle beam 10a1b5 (see FIG. 20) having triangular horizontal sectional shape, passed the opening 10a1m' (see FIG. 20) of the second forming aperture member 10a1m (see FIG. 20), on the basis of figures FGe1', FGe2', FGe3', FGe4' (see FIG. 26B) prepared by the drawing data correcting process. When patterns Pe1, Pe2, Pe3, Pe4 (see FIG. 26A) are drawn, position difference Δx5' (see FIG. 21) in X direction and position difference 1y5' (see FIG. 21) in Y direction occur, as shown by arrows in FIG. 26A. Consequently, patterns Pe1, Pe2, Pe3, Pe4 (see FIG. 26A) are drawn at 4 corners in limit area Aam (see FIG. 26A) on the workpiece M (see FIG. 26A).

In detail, in the charged particle beam drawing apparatus 10 of the third embodiment, when patterns corresponding to figures included in subfield SFm (see FIG. 26B) are drawn, the pattern Pe1 (see FIG. 26A) corresponding to the figure FGe1' (see FIG. 26B) is not drawn. But, when patterns corresponding to figures included in subfield SFn+1 (see FIG. 26B) are drawn, the pattern Pe1 (see FIG. 26A) corresponding to the figure FGe1' (see FIG. 26B) is drawn after drawing data correcting process is performed with respect to the figure FGe1 (see FIG. 26B). Consequently, in the charged particle beam drawing apparatus 10 of the third embodiment, the pattern Pe1 (see FIG. 26A) is drawn at a right upper corner in the limit area Aam (see FIG. 26A) by the charged particle beam 10a1b5 (see FIG. 20) without a distortion of the pattern Pe1 (see FIG. 26A), wherein the limit area Aam (see FIG. 26A) is larger than the area Af (see FIG. 11B).

In the charged particle beam drawing apparatus 10 of the third embodiment, when patterns corresponding to figures included in subfield SFm (see FIG. 26B) are drawn, the pattern Pe2 (see FIG. 26A) corresponding to the figure FGe2' (see FIG. 26B) is not drawn. But, when patterns corresponding to figures included in subfield SFm+1 (see FIG. 26B) are drawn, the pattern Pe2 (see FIG. 26A) corresponding to the figure FGe2' (see FIG. 26B) is drawn after drawing data correcting process is performed with respect to the figure FGe2 (see FIG. 26B). Consequently, in the charged particle beam drawing apparatus 10 of the third embodiment, the pattern Pe2 (see FIG. 26A) is drawn at a left upper corner in the limit area Aam (see FIG. 26A) by the charged particle beam 10a1b5 (see FIG. 20) without a distortion of the pattern Pe2 (see FIG. 26A), wherein the limit area Aam (see FIG. 26A) is larger than the area Af (see FIG. 11B).

In the charged particle beam drawing apparatus 10 of the third embodiment, when patterns corresponding to figures included in subfield SFm (see FIG. 26B) are drawn, the pattern Pe3 (see FIG. 26A) corresponding to the figure FGe3' (see FIG. 26B) is drawn after drawing data correcting process is performed with respect to the figure FGe3 (see FIG. 26B). Consequently, in the charged particle beam drawing apparatus 10 of the third embodiment, the pattern Pe3 (see FIG. 26A) is drawn at a left lower corner in the limit area Aam (see FIG. 26A) by the charged particle beam 10a1b5 (see FIG. 20) without a distortion of the pattern Pe3 (see FIG. 26A), wherein the limit area Aam (see FIG. 26A) is larger than the area Af (see FIG. 11B).

In the charged particle beam drawing apparatus 10 of the third embodiment, when patterns corresponding to figures included in subfield SFm (see FIG. 26B) are drawn, the pattern Pe4 (see FIG. 26A) corresponding to the figure FGe4' (see FIG. 26B) is not drawn. But, when patterns corresponding to figures included in subfield SFn (see FIG. 26B) are drawn, the pattern Pe4 (see FIG. 26A) corresponding to the figure FGe4' (see FIG. 26B) is drawn after drawing data correcting process is performed with respect to the figure FGe4 (see FIG. 26B). Consequently, in the charged particle beam drawing apparatus 10 of the third embodiment, the pattern Pe4 (see FIG. 26A) is drawn at a right lower corner in the limit area Aam (see FIG. 26A) by the charged particle beam 10a1b5 (see FIG. 20) without a distortion of the pattern Pe4 (see FIG. 26A), wherein the limit area Aam (see FIG. 26A) is larger than the area Af (see FIG. 11B).

In the charged particle beam drawing apparatus 10 of the third embodiment, as in the charged particle beam drawing apparatus 10 of the first embodiment, before each figure FG1, FG2 (see FIG. 3) included in the drawing data D (see FIG. 17) is respectively attached to subfield SFl−1, SFl, SFl+1, SFm−1, SFm, SFm+1, SFn−1, SFn, SFn+1 (see FIGS. 5 and 26B) by the subfield cut out portion 10b1a (see FIG. 17), the drawing data correcting process is not performed by the drawing data correcting process portion 10b1c (see FIG. 17). Therefore, after each figure FG1, FG2 (see FIG. 3) included in the drawing data D (see FIG. 17) is respectively attached to subfield SFl−1, SFl, SFl+1, SFm−1, SFm, SFm+1, SFn−1, SFn, SFn+1 (see FIGS. 5 and 26B) by the subfield cut out portion 10b1a (see FIG. 17), when the drawing data correcting process is performed by the drawing data correcting process portion 10b1c (see FIG. 17), figures FG1, FG2 (see FIG. 3) may be moved from one subfield to another subfield. Consequently, in the charged particle beam drawing apparatus 10 of the third embodiment, a following process is performed.

Figure 27:
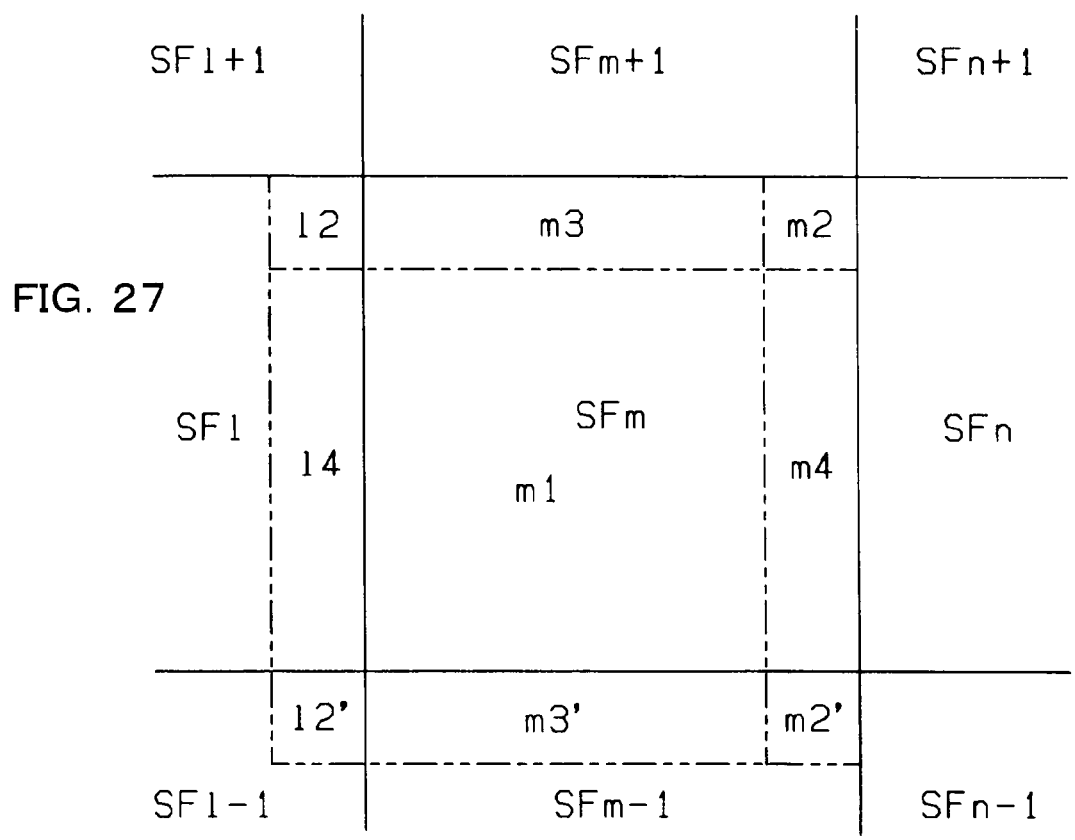
FIG. 27 shows a subfield SFm divided into 4 areas m1, m2, m3, m4.
Figure 28A:
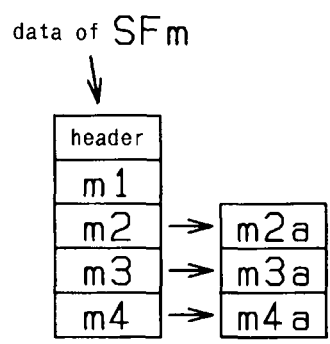
FIGS. 28A and 28B show a data processing method of subfield SFm in the charged particle beam drawing apparatus 10 of the third embodiment.
Figure 28B:
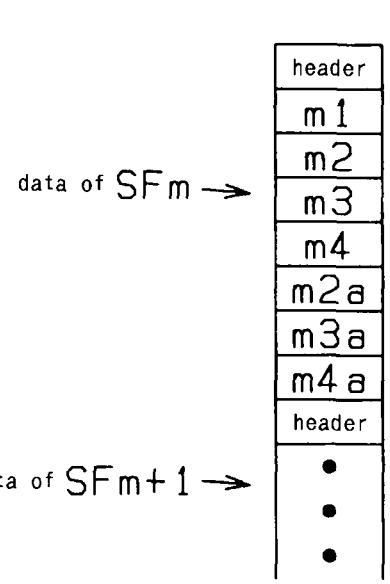

FIG. 27 shows a subfield SFm divided into 4 areas m1, m2, m3, m4. FIGS. 28A and 28B show a data processing method of subfield SFm in the charged particle beam drawing apparatus 10 of the third embodiment. In the charged particle beam drawing apparatus 10 of the third embodiment, the first standard point O of the charged particle beam 10a1b (see FIG. 1) is placed in a position shown in FIG. 20. Namely, the charged particle beam 10a1b which is not deflected by the beam size changing deflector 10a1d (see FIG. 1) reaches the first standard point O (see FIG. 20) on the second forming aperture member 10a1m (see FIG. 20).

Therefore, in the charged particle beam drawing apparatus 10 of the third embodiment, figures included in area m2 (see FIG. 27) which is placed near the borderline between subfield SFm (see FIG. 27) and subfields SFm+1, SFn, SFn+1 (see FIG. 27), have a possibility that the figures are not attached to subfield SFm (see FIG. 27), but the figures are attached to one of subfields SFm+1, SFn, SFn+1 (see FIG. 27) after drawing data correcting process is performed by the drawing data correcting process portion 10b1c (see FIG. 17).

In the charged particle beam drawing apparatus 10 of the first embodiment, figures included in area m2 (see FIG. 18) are included in data of subfield SFm (see FIG. 18) as shown in FIG. 19A, and are included in data of subfields SFm+1, SFn, SFn+1 (see FIG. 18) as shown in FIG. 19B by the subfield cut out portion 10b1a (see FIG. 17). In the charged particle beam drawing apparatus 10 of the third embodiment, figures included in area m2 (see FIG. 27) are not included in data of subfields SFm+1, SFn, SFn+1 (see FIG. 27), but are included in data of subfield SFm (see FIGS. 27 and 28A) when a process is performed by the subfield cut out portion 10b1a (see FIG. 17).

In the charged particle beam drawing apparatus 10 of the third embodiment, after figures included in area m2 (see FIG. 27) are moved by the drawing data correcting process portion 10b1c (see FIG. 17), if the moved figures are judged that the moved figures are attached to one of subfields SFm+1, SFn, SFn+1 (see FIG. 27) by the attach judging portion 10b1d (see FIG. 17), a data concerning the moved figures is newly prepared for the one of subfields SFm+1, SFn, SFn+1 (see FIG. 27). In detail, the data concerning the moved figures is included in a buffer m2a (see FIGS. 28A and 28B) for processing the figures wherein the figures are moved out of area m2 of subfield SFm by the drawing data correcting process portion 10b1c (see FIG. 17). Namely, the data concerning the moved figures is secured by a memory. Then, as shown in FIG. 28B, the data concerning the moved figures, included in the buffer m2a (see FIGS. 28A and 28B) is forwarded to a following process portion (not shown) which is latter than the attach judging portion 10b1d (see FIG. 17).

In the charged particle beam drawing apparatus 10 of the third embodiment, figures included in area m3 (see FIG. 27) which is placed near the borderline between subfield SFm (see FIG. 27) and subfield SFm+1 (see FIG. 27), have a possibility that the figures are not attached to subfield SFm (see FIG. 27), but the figures are attached to subfield SFm+1 (see FIG. 27) after drawing data correcting process is performed by the drawing data correcting process portion 10b1c (see FIG. 17).

In the charged particle beam drawing apparatus 10 of the first embodiment, figures included in area m3 (see FIG. 18) are included in data of subfield SFm (see FIG. 18) as shown in FIG. 19A, and are included in data of subfield SFm+1 (see FIG. 18) as shown in FIG. 19B by the subfield cut out portion 10b1a (see FIG. 17). In the charged particle beam drawing apparatus 10 of the third embodiment, figures included in area m3 (see FIG. 27) are not included in data of subfield SFm+1 (see FIG. 27), but are included in data of subfield SFm (see FIGS. 27 and 28A) when a process is performed by the subfield cut out portion 10b1a (see FIG. 17).

In the charged particle beam drawing apparatus 10 of the third embodiment, after figures included in area m3 (see FIG. 27) are moved by the drawing data correcting process portion 10b1c (see FIG. 17), if the moved figures are judged that the moved figures are attached to subfield SFm+1 (see FIG. 27) by the attach judging portion 10b1d (see FIG. 17), a data concerning the moved figures is newly prepared for subfield SFm+1 (see FIG. 27). In detail, the data concerning the moved figures is included in a buffer m3a (see FIGS. 28A and 28B) for processing the figures wherein the figures are moved out of area m3 of subfield SFm by the drawing data correcting process portion 10b1c (see FIG. 17). Namely, the data concerning the moved figures is secured by a memory. Then, as shown in FIG. 28B, the data concerning the moved figures, included in the buffer m3a (see FIGS. 28A and 28B) is forwarded to the following process portion (not shown) which is latter than the attach judging portion 10b1d (see FIG. 17).

In the charged particle beam drawing apparatus 10 of the third embodiment, figures included in area m4 (see FIG. 27) which is placed near the borderline between subfield SFm (see FIG. 27) and subfield SFn (see FIG. 27), have a possibility that the figures are not attached to subfield SFm (see FIG. 27), but the figures are attached to subfield SFn (see FIG. 27) after drawing data correcting process is performed by the drawing data correcting process portion 10b1c (see FIG. 17).

In the charged particle beam drawing apparatus 10 of the first embodiment, figures included in area m9 (see FIG. 18) are included in data of subfield SFm (see FIG. 18) as shown in FIG. 19A, and are included in data of subfield SFn (see FIG. 18) as shown in FIG. 19B by the subfield cut out portion 10b1a (see FIG. 17). In the charged particle beam drawing apparatus 10 of the third embodiment, figures included in area m4 (see FIG. 27) are not included in data of subfield SFn (see FIG. 27), but are included in data of subfield SFm (see FIGS. 27 and 28A) when a process is performed by the subfield cut out portion 10b1a (see FIG. 17).

In the charged particle beam drawing apparatus 10 of the third embodiment, after figures included in area m4 (see FIG. 27) are moved by the drawing data correcting process portion 10b1c (see FIG. 17), if the moved figures are judged that the moved figures are attached to subfield SFn (see FIG. 27) by the attach judging portion 10b1d (see FIG. 17), a data concerning the moved figures is newly prepared for subfield SFn (see FIG. 27). In detail, the data concerning the moved figures is included in a buffer m4a (see FIGS. 28A and 28B) for processing the figures wherein the figures are moved out of area m4 of subfield SFm by the drawing data correcting process portion 10b1c (see FIG. 17). Namely, the data concerning the moved figures is secured by a memory. Then, as shown in FIG. 28B, the data concerning the moved figures, included in the buffer m4a (see FIGS. 28A and 28B) is forwarded to the following process portion (not shown) which is latter than the attach judging portion 10b1d (see FIG. 17).

In the charged particle beam drawing apparatus 10 of the third embodiment, after figures included in area 12' (see FIG. 27) of subfield SFl−1 (see FIG. 27) are moved by the drawing data correcting process portion 10b1c (see FIG. 17), if the moved figures are judged that the moved figures are attached to subfield SFm (see FIG. 27) by the attach judging portion 10b1d (see FIG. 17), a data concerning the moved figures is newly prepared for subfield SFm (see FIG. 27). In detail, the data concerning the moved figures is included in a buffer (not shown) for processing the figures wherein the figures are moved out of area 12' of subfield SFl−1 by the drawing data correcting process portion 10b1c (see FIG. 17). Namely, the data concerning the moved figures is secured by a memory. Then, the data concerning the moved figures, included in the buffer is forwarded to the following process portion (not shown) which is latter than the attach judging portion 10b1d (see FIG. 17).

In the charged particle beam drawing apparatus 10 of the third embodiment, after figures included in areas 12, 14 (see FIG. 27) of subfield SFl (see FIG. 27) are moved by the drawing data correcting process portion 10*b*1*c* (see FIG. 17), if the moved figures are judged that the moved figures are attached to subfield SFm (see FIG. 27) by the attach judging portion 10*b*1*d* (see FIG. 17), a data concerning the moved figures is newly prepared for subfield SFm (see FIG. 27). In detail, the data concerning the moved figures is included in a buffer (not shown) for processing the figures wherein the figures are moved out of areas 12, 14 of subfield SFl by the drawing data correcting process portion 10*b*1*c* (see FIG. 17). Namely, the data concerning the moved figures is secured by a memory. Then, the data concerning the moved figures, included in the buffer is forwarded to the following process portion (not shown) which is latter than the attach judging portion 10*b*1*d* (see FIG. 17).

In the charged particle beam drawing apparatus 10 of the third embodiment, after figures included in areas m2', m3' (see FIG. 27) of subfield SFm−1 (see FIG. 27) are moved by the drawing data correcting process portion 10*b*1*c* (see FIG. 17), if the moved figures are judged that the moved figures are attached to subfield SFm (see FIG. 27) by the attach judging portion 10*b*1*d* (see FIG. 17), a data concerning the moved figures is newly prepared for subfield SFm (see FIG. 27). In detail, the data concerning the moved figures is included in a buffer (not shown) for processing the figures wherein the figures are moved out of areas m2', m3' of subfield SFm−1 by the drawing data correcting process portion 10*b*1*c* (see FIG. 17). Namely, the data concerning the moved figures is secured by a memory. Then, the data concerning the moved figures, included in the buffer is forwarded to the following process portion (not shown) which is latter than the attach judging portion 10*b*1*d* (see FIG. 17).

In the charged particle beam drawing apparatus 10 of the third embodiment, the first standard point O (see FIG. 20) on the second forming aperture member 10*a*1*m* (see FIG. 20) is placed, so that all patterns Pa, Pb, Pc, Pd, Pe (see FIG. 21) drawn on the workpiece M (see FIG. 21) by the charged particle beam 10*a*1*b*1, 10*a*1*b*2, 10*a*1*b*3, 10*a*1*b*4, 10*a*1*b*5 (see FIG. 20) passed through the opening 10*a*1*m*' (see FIG. 20) of the second forming aperture member 10*a*1*m* (see FIG. 20), have position difference Δx1', Δx2', Δx3', Δx4', Δx5' (see FIG. 21) to minus side (left side of FIG. 21) of X axis and position difference Δy1', Δy2', Δy3', Δy4', Δy5' (see FIG. 21) to minus side (lower side of FIG. 21) of Y axis with respect to the second standard point O' (see FIG. 21) on the workpiece M (see FIG. 21) corresponding to the first standard point O (see FIG. 20) on the second forming aperture member 10*a*1*m* (see FIG. 20), wherein the charged particle beam 10*a*1*b* (see FIG. 1) which is not deflected by the beam size changing deflector 10*a*1*d* (see FIG. 1) reaches the first standard point O (see FIG. 20) on the second forming aperture member 10*a*1*m* (see FIG. 20).

Consequently, in the charged particle beam drawing apparatus 10 of the third embodiment, it is possible to decrease capacity of buffers m2*a*, m3*a*, m4*a* (see FIGS. 28A and 28B) for processing the figures moved out of area m2, m3, m4 of subfield SFm.

In the charged particle beam drawing apparatus 10 of the third embodiment, if figures are attached to subfield SFm (see FIG. 27) by the subfield cut out portion 10*b*1*a* (see FIG. 17), and if the figures are moved out of subfield SFm (see FIG. 27) by the drawing data correcting process portion 10*b*1*c* (FIG. 17) and the figures are judged that the figures are attached to another subfield SFm+1, SFn, SFn+1 (see FIG. 27) by the attach judging portion 10*b*1*d* (see FIG. 17), drawing order of subfield SFm+1, SFn, SFn+1 (see FIG. 27) is latter than drawing order of subfield SFm (see FIG. 27). Namely, in the charged particle beam drawing apparatus 10 of the third embodiment, patters corresponding to figures included in subfield SFm+1, SFn, SFn+1 (see FIG. 27) are drawn, after patters corresponding to figures included in subfield SFm (see FIG. 27) are drawn. In other words, in the charged particle beam drawing apparatus 10 of the third embodiment, figures attached to subfield SFm (see FIG. 27) by the subfield cut out portion 10*b*1*a* (see FIG. 17), cannot be moved to subfield SFl−1, SFl, SFl+1, SFm−1 (see FIG. 27) by the drawing data correcting process portion 10*b*1*c* (FIG. 17), wherein drawing order of subfield SFm (see FIG. 27) is latter than drawing order of subfield SFl−1, SFl, SFl+1, SFm−1 (see FIG. 27). Consequently, in the charged particle beam drawing apparatus 10 of the third embodiment, drawing patterns on the basis of data of subfield SFl−1, SFl, SFl+1, SFm−1 (see FIG. 27) can be completed, before drawing data correcting process of subfield SF (see FIG. 27) is completed by the drawing data correcting process portion 10*b*1*c* (see FIG. 17).

Figure 29:
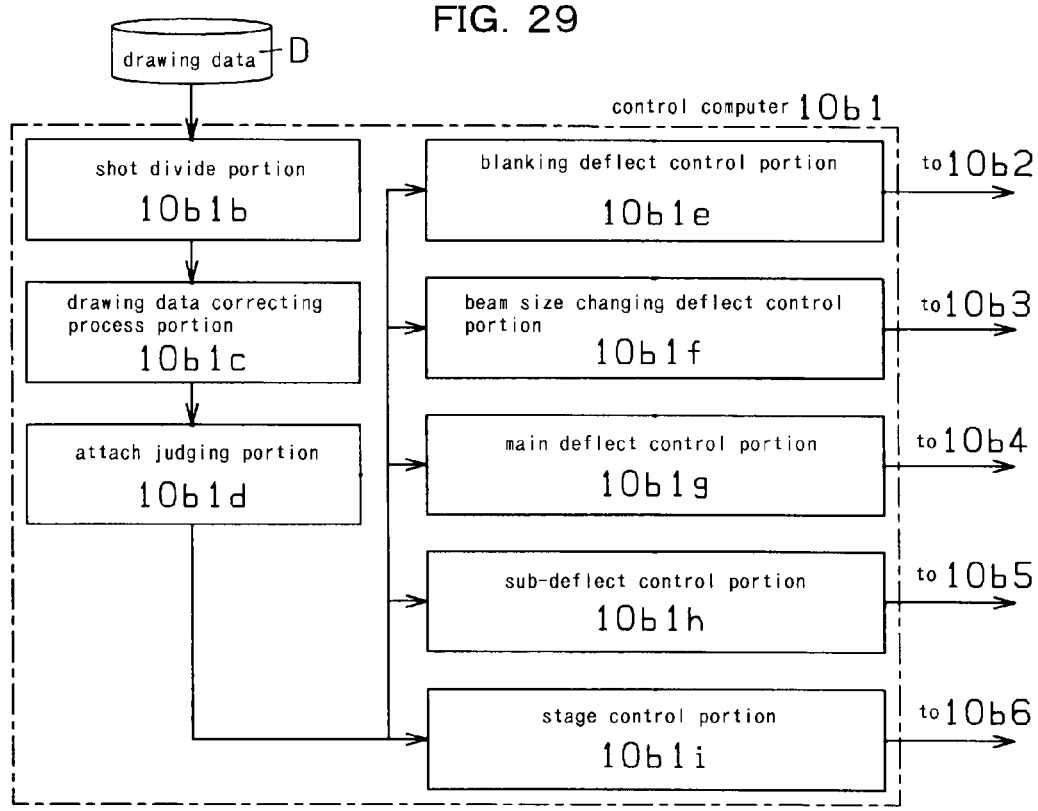
FIG. 29 shows the control computer 10b1 of the control portion 10b of the charged particle beam drawing apparatus 10 of a forth embodiment, in detail.

FIG. 29 shows the control computer 10*b*1 of the control portion 10*b* of the charged particle beam drawing apparatus 10 of a forth embodiment, in detail. In the charged particle beam drawing apparatus 10 of the first embodiment, as shown in FIG. 17, a subfield cut out process is performed by the subfield cut out portion 10*b*1*a* (see FIG. 17), then a shot dividing process is performed by the shot dividing portion 10*b*1*b* (see FIG. 17), then a drawing data correcting process is performed by the drawing data correcting process portion 10*b*1*c* (see FIG. 17), then an attach judging process is performed by the attach judging portion 10*b*1*d* (see FIG. 17). In the charged particle beam drawing apparatus 10 of the forth embodiment, as shown in FIG. 29, a shot dividing process is performed by the shot dividing portion 10*b*1*b* (see FIG. 29), then figures included in drawing data D (see FIG. 29) are moved by the drawing data correcting process portion 10*b*1*c* (see FIG. 29), then moved figures included in drawing data D (see FIG. 29) are judged that moved figures are respectively attached to subfield SFl−1, SFl, SFl+1, SFm−1, SFm, SFm+1, SFn−1, SFn, SFn+1 (see FIG. 27). In other words, in the charged particle beam drawing apparatus 10 of the forth embodiment, as shown in FIG. 29, before figures included in drawing data D (see FIG. 29) are moved by the drawing data correcting process portion 10*b*1*c* (see FIG. 29), the figures are not respectively attached to subfield SFl−1, SFl, SFl+1, SFm−1, SFm, SFm+1, SFn−1, SFn, SFn+1 (see FIG. 27). Therefore, in the charged particle beam drawing apparatus 10 of the forth embodiment, the subfield cut out portion 10*b*1*a* (see FIG. 17) provided in the charged particle beam drawing apparatus 10 of the first embodiment, is omitted.

In detail, in the charged particle beam drawing apparatus 10 of the forth embodiment, each figure FG1, FG2 (see FIG. 3) included in the drawing data D (see FIG. 29) is divided into figures (such as figures FGa1, FGa2, FGa3, FGa4 (see FIG. 12B) and figures FGb1, FGb2, FGb3, FGb4 (see FIG. 13B)) by a shot divide portion 10*b*1*b* (see FIG. 29), wherein each of the figures corresponds to a pattern (such as pattern P1*a*, P1*b*, P1*c*, P1*d*, P1*e*, P1*f*, P1*g*, P1*h*, P1*i* (see FIGS. 6A to 6I)) which can be drawn by a shot of the charged particle beam 10*a*1*b* (see FIG. 2A).

Then, in the charged particle beam drawing apparatus 10 of the forth embodiment, divided figures (such as figures FGb1, FGb2, FGb3, FGb4 (see FIG. 13B)) are moved in the drawing data D (see FIG. 29) by the drawing data correcting process of a drawing data correcting process portion 10*b*1*c* (see FIG. 29). In detail, in the example shown in FIG. 13B, each of figures FGb1, FGb2, FGb3, FGb4 is respectively moved to a position in which each of figures FGb1', FGb2', FGb3', FGb4' is respectively placed, in the drawing data D.

Then, in the charged particle beam drawing apparatus 10 of the forth embodiment, each of figures FGb1', FGb2', FGb3', FGb4' (see FIG. 13B) included in the drawing data D (see FIG. 29) is respectively attached to one of subfields SFl−1, SFl, SFl+1, SFm−1, SFm, SFm+1, SFn−1, SFn, SFn+1 (see FIG. 13B) by the attach judging portion 10b1d (see FIG. 29). In detail, in the example shown in FIG. 13B, figure FGb1' is attached to subfield SFm, figure FGb2' is attached to subfield SFl, figure FGb3' is attached to subfield SFl−1, and figure FGb4' is attached to subfield SFm−1.

Then, in the charged particle beam drawing apparatus 10 of the forth embodiment, the blanking deflector 10a1c (see FIG. 1) is controlled via the deflect control circuit 10b2 (see FIG. 1) by a blanking deflect control portion 10b1e (see FIG. 29), the beam size changing deflector 10a1d (see FIG. 1) is controlled via the deflect control circuit 10b3 (see FIG. 1) by a beam size changing deflect control portion 10b1f (see FIG. 29), the main deflector 10a1e (see FIG. 1) is controlled via the deflect control circuit 10b4 (see FIG. 1) by a main deflect control portion 10b1g (see FIG. 29), the sub-deflector 10a1f (see FIG. 1) is controlled via the deflect control circuit 10b5 (see FIG. 1) by a sub-deflect control portion 10b1h (see FIG. 29), and the movable stage 10a2a (see FIG. 1) is controlled via the stage control circuit 10b6 (see FIG. 1) by a stage control portion 10b1i (see FIG. 29). Consequently, patterns corresponding to figures included in the drawing data D (see FIG. 1) are drawn on the workpiece M (see FIG. 1) by the charged particle beam 10a1b (see FIG. 1).

In the example shown in FIGS. 13A and 13B, patterns corresponding to figures included in subfield SFl−1 (see FIG. 13B) are drawn on the workpiece M (see FIG. 13A) by the charged particle beam 10a1b (see FIG. 1). In detail, when patterns corresponding to figures included in subfield SFl−1 (see FIG. 13B) are drawn, the pattern Pb3 (see FIG. 13A) corresponding to the figure FGb3' (see FIG. 13B) included in subfield SFl−1 (see FIG. 13B) is drawn on the workpiece M (see FIG. 13A) by the charged particle beam 10a1b2 (see FIG. 7A).

Then, in the example shown in FIGS. 13A and 13B, patterns corresponding to figures included in subfield SFl (see FIG. 13B) are drawn on the workpiece M (see FIG. 13A) by the charged particle beam 10a1b (see FIG. 1). In detail, when patterns corresponding to figures included in subfield SFl (see FIG. 13B) are drawn, the pattern Pb2 (see FIG. 13A) corresponding to the figure FGb2' (see FIG. 13B) included in subfield SFl (see FIG. 13B) is drawn on the workpiece M (see FIG. 13A) by the charged particle beam 10a1b2 (see FIG. 7A).

Then, in the example shown in FIGS. 13A and 13B, patterns corresponding to figures included in subfield SFl+1 (see FIG. 13B) are drawn on the workpiece M (see FIG. 13A) by the charged particle beam 10a1b (see FIG. 1).

Then, in the example shown in FIGS. 13A and 13B, patterns corresponding to figures included in subfield SFm−1 (see FIG. 13B) are drawn on the workpiece M (see FIG. 13A) by the charged particle beam 10a1b (see FIG. 1). In detail, when patterns corresponding to figures included in subfield SFm−1 (see FIG. 13B) are drawn, the pattern Pb4 (see FIG. 13A) corresponding to the figure FGb4' (see FIG. 13B) included in subfield SFm−1 (see FIG. 13B) is drawn on the workpiece M (see FIG. 13A) by the charged particle beam 10a1b2 (see FIG. 7A).

Then, in the example shown in FIGS. 13A and 13B, patterns corresponding to figures included in subfield SFm (see FIG. 13B) are drawn on the workpiece M (see FIG. 13A) by the charged particle beam 10a1b (see FIG. 1). In detail, when patterns corresponding to figures included in subfield SFm (see FIG. 13B) are drawn, the pattern Pb1 (see FIG. 13A) corresponding to the figure FGb1' (see FIG. 13B) included in subfield SFm (see FIG. 13B) is drawn on the workpiece M (see FIG. 13A) by the charged particle beam 10a1b2 (see FIG. 7A).

Then, in the example shown in FIGS. 13A and 13B, patterns corresponding to figures included in subfield SFm+1 (see FIG. 13B) are drawn on the workpiece M (see FIG. 13A) by the charged particle beam 10a1b (see FIG. 1). Then, patterns corresponding to figures included in subfield SFn−1 (see FIG. 13B) are drawn on the workpiece M (see FIG. 13A) by the charged particle beam 10a1b (see FIG. 1). Then, patterns corresponding to figures included in subfield SFn (see FIG. 13B) are drawn on the workpiece M (see FIG. 13A) by the charged particle beam 10a1b (see FIG. 1). Then, patterns corresponding to figures included in subfield SFn+1 (see FIG. 13B) are drawn on the workpiece M (see FIG. 13A) by the charged particle beam 10a1b (see FIG. 1).

In the charged particle beam drawing apparatus 10 of the fifth embodiment, above mentioned first embodiment, second embodiment, third embodiment and forth embodiment are properly combined.

As many apparently widely different embodiments of this invention may be made without departing from the spirit and scope thereof, it is to be understood that the invention is not limited to the specific embodiments thereof except as defined in the appended claims.

What is claimed is:

1. A charged particle beam drawing method, comprising:
    drawing patterns corresponding to figures included in a drawing data inputted to a charged particle beam drawing apparatus, on a workpiece mounted on a movable stage by a charged particle beam passed through an opening of a first forming aperture member and an opening of a second forming aperture member; and
    moving the figures in the drawing data, on the basis of positions in the opening of the second forming aperture member so that a position difference of the charged particle beam is cancelled, where the charged particle beam for drawing the patterns corresponding to the figures is passed through,
    wherein a figure of the figures in the drawing data is moved by a position difference between a position in the opening of the second forming aperture member where a charged particle beam which is not deflected by a beam size changing deflector passes and a position in the opening of the second forming aperture member where a charged particle beam to form a pattern corresponding to the figure passes.

2. The charged particle beam drawing method according to claim 1 further comprising:
    virtually dividing a drawing area on the workpiece into subfields and attaching each figure in the drawing data to at least one of the subfields, before the figures are moved on the basis of positions in the opening of the second forming aperture member; and
    judging the subfields, wherein the figures included in the drawing data are attached to the subfields after the figures are moved,
    wherein the patterns corresponding to the figures moved from a first subfield to a second subfield are drawn, when the patterns corresponding to the figures attached to the second subfield are drawn.

3. The charged particle beam drawing method according to claim 2 further comprising:
    causing figures placed near a borderline between the first subfield and the second subfield, to be included in a data of the first subfield and a data of the second subfield when each figure is attached to at least one of the subfields, wherein the figures have a possibility that the figures are moved from the first subfield to the second subfield, and that the figures are moved from the second subfield to the first subfield; and causing the figures to be included in only one of the data of the first subfield and the data of the second subfield when the subfields are judged, wherein the figures included in the drawing data are attached to the subfields after the figures are moved.

4. The charged particle beam drawing method according to claim 2 further comprising:

attaching each figure in the drawing data to one of the subfields, after the figures are moved on the basis of positions in the opening of the second forming aperture member.

5. The charged particle beam drawing method according to claim 1 further comprising:

placing a first standard point on the second forming aperture member, so that all patterns drawn on the workpiece by the charged particle beam passed through the opening of the second forming aperture member, respectively have a position difference to one side of an X axis and a position difference to one side of a Y axis perpendicular to the X axis, with respect to a second standard point on the workpiece, wherein the second standard point corresponds to the first standard point on the second forming aperture member, and wherein the charged particle beam which is not deflected by a beam size changing deflector, reaches the first standard point on the second forming aperture member.

6. A charged particle beam drawing apparatus, comprising:
a charged particle beam gun;
a first forming aperture member having an opening, wherein a charged particle beam emitted from the charged particle beam gun is passed through the opening of the first forming aperture member;
a beam size changing deflector configured to deflect the charged particle beam passed through the opening of the first forming aperture member;
a second forming aperture member having an opening, wherein the charged particle beam passed through the opening of the first forming aperture member is passed through the opening of the second forming aperture member;
a movable stage for supporting a workpiece, wherein patterns corresponding to figures included in a drawing data are drawn on the workpiece by the charged particle beam passed through the opening of the second forming aperture member; and
a drawing data correcting process portion, including a computer, for moving the figures in the drawing data on the basis of positions in the opening of the second forming aperture member so that a position difference of the charged particle beam is cancelled, where the charged particle beam for drawing the patterns corresponding to the figures is passed through, wherein a figure of the figures in the drawing data is moved by a position difference between a position in the opening of the second forming aperture member where a charged particle beam which is not deflected by a beam size changing deflector passes and a position in the opening of the second forming aperture member where a charged particle beam to form a pattern corresponding to the figure passes.

7. The charged particle beam drawing apparatus according to claim 6 further comprising:

a subfield cut out portion, including the computer, for virtually dividing a drawing area on the workpiece into subfields and for attaching each figure in the drawing data to at least one of the subfields, before the figures are moved by the drawing data correcting process portion; and an attach judging portion, including the computer, for judging the subfields, wherein the figures included in the drawing data are attached to the subfields after the figures are moved by the drawing data correcting process portion, wherein the patterns corresponding to the figures moved from a first subfield to a second subfield are drawn, when the patterns corresponding to the figures attached to the second subfield are drawn.

8. The charged particle beam drawing apparatus according to claim 7, wherein the subfield cut out portion causes figures placed near a borderline between the first subfield and the second subfield, to be included in a data of the first subfield and a data of the second subfield when each figure is attached to at least one of the subfields, wherein the figures have a possibility that the figures are moved from the first subfield to the second subfield, and that the figures are moved from the second subfield to the first subfield by the drawing data correcting process portion, and wherein the attach judging portion causes the figures to be included in only one of the data of the first subfield and the data of the second subfield when the subfields are judged, wherein the figures included in the drawing data are attached to the subfields after the figures are moved by the drawing data correcting process portion.

9. The charged particle beam drawing apparatus according to claim 7 further comprising:

an attach judging portion, including the computer, for attaching each figure in the drawing data to one of the subfields, after the figures are moved on the basis of positions in the opening of the second forming aperture member by the drawing data correcting process portion.

10. The charged particle beam drawing apparatus according to claim 6 further comprising:

a first standard point on the second forming aperture member; and a second standard point on the workpiece, the second standard point corresponding to the first standard point, wherein the first standard point is placed on the second forming aperture member, so that all patterns drawn on the workpiece by the charged particle beam passed through the opening of the second forming aperture member, respectively have a position difference to one side of an X axis and a position difference to one side of a Y axis perpendicular to the X axis, with respect to the second standard point on the workpiece, and wherein the charged particle beam which is not deflected by a beam size changing deflector, reaches the first standard point on the second forming aperture member.

* * * * *